(12) United States Patent
Perreault et al.

(10) Patent No.: US 9,673,729 B2
(45) Date of Patent: Jun. 6, 2017

(54) POWER PROCESSING METHODS AND APPARATUS FOR PHOTOVOLTAIC SYSTEMS

(75) Inventors: David Perreault, Brookline, MA (US); Robert Pilawa-Podgurski, Cambridge, MA (US); Charles Sullivan, West Lebanon, NH (US); Alexander Latham, Norwich, VT (US)

(73) Assignees: Massachusetts Institute of Technology, Cambridge, MA (US); Trustees of Darmouth College, Hanover, NH (US)

( * ) Notice: Subject to any disclaimer, the term of this patent is extended or adjusted under 35 U.S.C. 154(b) by 1153 days.

(21) Appl. No.: 13/805,452

(22) PCT Filed: Jun. 23, 2011

(86) PCT No.: PCT/US2011/041563
  § 371 (c)(1),
  (2), (4) Date: May 6, 2013

(87) PCT Pub. No.: WO2011/163437
  PCT Pub. Date: Dec. 29, 2011

(65) Prior Publication Data
  US 2013/0221753 A1    Aug. 29, 2013

Related U.S. Application Data

(60) Provisional application No. 61/358,755, filed on Jun. 25, 2010.

(51) Int. Cl.
  *H02J 1/00*   (2006.01)
  *H02M 7/44*   (2006.01)
  (Continued)

(52) U.S. Cl.
  CPC .............. *H02M 7/44* (2013.01); *G05F 1/571* (2013.01); *H01L 31/02021* (2013.01);
  (Continued)

(58) Field of Classification Search
  CPC ....................................................... H02M 7/44
  See application file for complete search history.

(56) References Cited

U.S. PATENT DOCUMENTS

| 2005/0172995 A1 | 8/2005 | Rohrig et al. |
| 2006/0132102 A1 | 6/2006 | Harvey |

(Continued)

FOREIGN PATENT DOCUMENTS

JP    2006-302147 A    11/2006

OTHER PUBLICATIONS

International Search Report and Written Opinion for Application No. PCT/US2011/041563 mailed Feb. 28, 2012.
(Continued)

*Primary Examiner* — Daniel Cavallari
(74) *Attorney, Agent, or Firm* — Wolf, Greenfield & Sacks, P.C.

(57) ABSTRACT

High power output may be obtained from a photovoltaic (PV) system by controlling each photovoltaic cell of a solar array individually to operate at its maximum power point. Each cell may have associated power electronics and control circuitry that may be integrated together on a chip which may be advantageously implemented in CMOS, enabling reductions in cost and size. A perturb and observe algorithm may be used to find the maximum power point by measuring the power produced at different operating points, and modifying the operating point in the direction of increased power production. In one aspect, performance of a perturb and observe algorithm may be improved in the presence of noise.

21 Claims, 38 Drawing Sheets

(51) Int. Cl.
  *G05F 1/571* (2006.01)
  *H01L 31/02* (2006.01)
  *H02M 1/00* (2006.01)
  *H02J 3/38* (2006.01)
  *G05F 1/67* (2006.01)

(52) U.S. Cl.
  CPC ............... *H02J 3/383* (2013.01); *G05F 1/67* (2013.01); *H02J 3/385* (2013.01); *H02M 2001/0077* (2013.01); *Y02E 10/563* (2013.01); *Y10T 307/685* (2015.04); *Y10T 307/707* (2015.04)

(56) References Cited

U.S. PATENT DOCUMENTS

| | | | | |
|---|---|---|---|---|
| 2007/0133241 | A1* | 6/2007 | Mumtaz | H02M 7/4807 363/131 |
| 2007/0210777 | A1* | 9/2007 | Cervera | H02M 3/157 323/284 |
| 2008/0192519 | A1 | 8/2008 | Akihiko et al. | |
| 2009/0121549 | A1 | 5/2009 | Leonard | |
| 2009/0160259 | A1* | 6/2009 | Naiknaware | H02M 7/4807 307/82 |
| 2010/0132757 | A1 | 6/2010 | Jin-Man et al. | |
| 2010/0288327 | A1* | 11/2010 | Lisi | H01L 31/02021 136/244 |
| 2011/0160930 | A1* | 6/2011 | Batten | G05F 1/67 700/298 |
| 2012/0223583 | A1 | 9/2012 | Cooley et al. | |

OTHER PUBLICATIONS

International Preliminary Report on Patentability for Application No. PCT/US2011/041563 mailed Jan. 10, 2013.
Al-Atrash, H. et al., Statistical modeling of DSP-based hill-climbing MPPT algorithms in noisy environments, in *Twentieth Annual IEEE Applied Power Electronics Conference*, vol. 3, 2005, pp. 1773-1777.
Araujo, S. et al., Novel grid-connected non-isolated converters for photovoltaic systems with grounded generator, in *IEEE Power Electronics Specialists Conference*, 2008.
Badescu, V. Dynamic model of a complex system including pv cells, electric battery, electrical motor and water pump. *Energy*, 28(12):1165-1181, 2003.
Benavides, N.D. et al., Modeling the effect of voltage ripple on the power output of photovoltaic modules. *IEEE Transactions on Industrial Electronics*, 55(7), Jul. 2008.
Carannante, G. et al., Experimental performance of mppt algorithm for photovoltaic sources subject to inhomogeneous insolation. *IEEE Transactions on Industrial Electronics*, 56(11):4374-4380, Nov. 2009.
Cavallaro, C. et al., A voltage sensing approach for a maximum power tracking in integrated photovoltaic applications, in *2009 International Conference on Clean Electrical Power*, 2009, pp. 691-698.
Decker, B. et al. Performance of 170 grid connected pv plants in northern Germany—analysis of yields and optimization potentials, *Solar Energy*, vol. 59, No. 4-6, pp. 127-133, 1997.
Deline, C., Partially shaded operation of multi-string photovoltaic systems. *Photovoltaic Specialists Conference (PVSC), 2010 35th IEEE*, pp. 000394-000399, Jun. 2010.
Dhagat, P. et al., Comparison of Magnetic Materials for V-Groove Inductors in Optimized High-Frequency DC-DC Converters, *IEEE Transactions on Magnetics*, vol. 40, No. 4, pp. 2008-2010, 2004.
Esram, T. et al., Comparison of photovoltaic array maximum power point tracking techniques, *IEEE Transactions on Energy Conversion*, vol. 22, No. 2, pp. 439-449, 2007.
Esram, T. et al. Dynamic maximum power point tracking of photovoltaic arrays using ripple correlation control, *IEEE Transactions on Power Electronics*, vol. 21, No. 5, pp. 1282-1291, 2006.

Femia, N. et al. Optimization of perturb and observe maximum power point tracking method. *IEEE Transactions on Power Electronics*, 20(4):963-973, 2005.
Femia, N. et al., Distributed maximum power point tracking of photovoltaic arrays: Novel approach and system analysis. *IEEE Transactions on Industrial Electronics*, 55(7):2610-2621, Jul. 2008.
Field, H. et al., Cell binning method analysis to minimize mismatch losses and performance variation in Si-based modules, in *Conference Record of the Twenty-Ninth IEEE Photovoltaic Specialists Conference*, pp. 418-421, 2002.
Hayashi, Z. et al., High-efficiency DC-DC converter chip size module with integrated soft ferrite, *IEEE Transactions on Magnetics*, vol. 39, No. 05, 2003.
Hohm, D.P. et al., Comparative study of maximum power point tracking algorithms, *Prog. Photovolt: Res. Appl.*, vol. 11, pp. 47-62, 2003.
http://www.technick.net/public/code/cp_dpage.php?aiocp_dp=utilinductance_circle.
Hussein, K.H. et al., Maximum photovoltaic power tracking: an algorithm for rapidly changing atmospheric conditions. *Generation, Transmission and Distribution, IEEE Proceedings-*, 142(1):59-64, Jan. 1995.
Kajihara, A. et al., Model of photovoltaic cell circuits under partial shading. In *IEEE International Conference on Industrial Technology 2005. ICIT 2005*, pp. 866-870, Dec. 2005.
Karpov, V.G. et al., Effects of nonuniformity in thin-film photovoltaics, *Applied Physics Letters*, vol. 80, No. 22,2002.
Kaushika, N. et al., An investigation of mismatch losses in solar photovoltaic cell networks, *Energy*, vol. 32, pp. 755-759, May 2007.
Kazmi, S. et al., An improved and very efficient mppt controller for pv systems subjected to rapidly varying atmospheric conditions and partial shading. In *Power Engineering Conference, 2009. AUPEC 2009. Australasian Universities*, pp. 1-6, Sep. 2009.
Kjaer, S. et al. A review of single-phase grid-connected inverters for photovoltaic modules, *IEEE Transactions on Industry Applications*, vol. 41, No. 5, pp. 1292-1306, 2005.
Kjaer, S.B., *Design and control of an inverter for photovoltaic applications*. PhD thesis, Inst. Energy Technol., Aalborg University, Aalborg East, Denmark, 2004/2005.
Klootwijk, J.H. et al., Ultrahigh capacitance density for multiple ald-grown mim capacitor stacks in 3-d silicon. *IEEE Electron Device Letters*, 29(7):740-742, Jul. 2008.
Lee, K.-Y. et al., A simplified analog control circuit of a maximum power point tracker, in *IEEE Photovoltaic Specialists Conference*, 2008, pp. 1-3.
Li, Q. et al., A review of the single phase photovoltaic module integrated converter topologies with three different dc link configurations, *IEEE Transactions on Power Electronics*, vol. 23, No. 3, pp. 1320-1333, 2008.
Lim, Y.H. et al., Synthesis, simulation and experimental verification of a maximum power point tracker from nonlinear dynamics, in *IEEE Power Electronics Specialists Conference*, vol. 1, 2001, pp. 199-204.
Mehas, G. et al., Converter and inductor design for fast-response microprocessor power delivery, in *IEEE Power Electronics Specialists Conference*, pp. 1621-1626, Jun. 2000.
Mohan, S.S. et al. Simple accurate expressions for planar spiral inductances. *IEEE Journal of Solid-State Circuits*, 34(10):1419-1424, 1999.
Myrzik, J.M.A. et al., String and module integrated inverters for single-phase grid connected photovoltaic systems—a review. *Power Tech Conference Proceedings, 2003 IEEE Bologna*, vol. 2, p. 8 pp. vol. 2, Jun. 2003.
Neugebauer, T. et al., Filters and components with inductance cancellation, *IEEE Transactions on Industry Applications*, vol. 40, No. 2, pp. 483-490, 2004.
Orlandi, S. et al. Optimization of shielded pcb air-core toroids for high efficiency dc-dc converters. *IEEE Transactions on Power Electronics*, PP(99):1, 2010.
Performance of photovoltaic maximum power point tracking algorithms in the presence of noise, *Digest submitted to IEEE Energy Conversion Conference and Exposition*, 2010.

(56) References Cited

OTHER PUBLICATIONS

Perreault, D. et al., Distributed interleaving of paralleled power converters, *IEEE Transactions on Circuits and Systems—Part I: Fundamental Theory and Applications*, vol. 44, No. 8, pp. 728-734, 1997.
Perreault, D. et al., Frequency-based current-sharing techniques for paralleled power converters, *IEEE Transactions on Power Electronics*, vol. 13, No. 4, pp. 626-634, 1998.
Perreault, D. et al., Switching-ripple-based current sharing for paralleled power converters, *IEEE Transactions on Circuits and Systems—Part I. Fundamental Theory and Applications*, vol. 46, No. 10, pp. 1264-1274, 1999.
Pilawa-Podgurski, R. et al., Merged two-stage power converter architecture with soft charging switched-capacitor energy transfer, in *39th IEEE Power Electronics Specialists Conference*, 2008.
Prabhakaran, S. et al. Measured Electrical Performance of V-Groove Inductors for Microprocessor Power Delivery, *IEEE Transactions on Magnetics*, vol. 39, No. 5, pp. 3190-3192, 2003.
Prabhakaran, S. et al., Fabrication of thin-film v-groove inductors using composite magnetic materials, in *IEEE International Workshop on Integrated Power Packaging*, pp. 102-105, Jul. 2000.
Prabhakaran, S. et al., Impedance-analyzer measurements of high frequency power passives: techniques for high power and low impedance. In *Conference Record of the Industry Applications Conference, 2002. 37th IAS Annual Meeting.*, vol. 2, pp. 1360-1367 vol. 2, 2002.
Prabhakaran, S. et al., Microfabricated Coupled Inductors for DC-DC Converters for Microprocessor Power Delivery, in *IEEE Power Electronics Specialists Conference*, 2004.
Prabhakaran, S. et al., Microfabricated V-Groove Power Inductors for High-Current Low-Voltage Fast-Transient DC-DC Converters, in *IEEE Power Electronics Specialists Conference*, pp. 1513-1519, 2005.
Quintana, M.A. et al., Commonly observed degradation in field-aged photovoltaic modules, in *IEEE 29th Photovoltaic Specialists Conference*, pp. 1436-1439, May 2002.
Roozeboom, F. et al., Passive and heterogeneous integration towards a si-based system-in-package concept. *Thin Solid Films*, 504(1-2):391 -396, 2006. Proceedings of the International Conference on Materials for Advanced Technologies (ICMAT 2005) Symposium H: Silicon Microelectronics: Processing to Packaging—ICMAT 2005 Symposium H.
Salas, V. et al. Review of the maximum power point tracking algorithms for standalone photovoltaic systems, *Solar Energy Materials and Solar Cells*, vol. 90, No. 11, pp. 1555-1578, 2006. [Online]. Available: http://www.sciencedirect.com/science/article/B6V51-4J0WRC7-2/2/ace7c72150a4c9afbd031d258c2cf201.
Sato, F. et al. All-in-One Package Ultracompact Micropower Module Using Thin-Film Inductor, *IEEE Transactions on Magnetics*, vol. 40, No. 4, pp. 2029-2031, 2004.
Schrom, G. et al., Optimal design of monolithic integrated dc-dc converters, in *Proc. IEEE International Conference on Integrated Circuit Design and Technology ICICDT '06*, pp. 1-3, 2006.
Sokolov, M. et al. Load line emulation based maximum power point tracking. *Power Electronics Specialists Conference, 2008. PESC 2008. IEEE*, pp. 4098-4101, Jun. 2008.

Stauth, J.T. et al., Dynamic power supply design for high-efficiency wireless transmitters. Master's thesis, EECS Department, University of California, Berkeley, 2006.
Sugawara, E. et al., Microinductor for Flip-Chip Micropower Source, *IEEE Transactions on Magnetics*, vol. 39, No. 05, 2003.
Sullivan, C. et al. A high-efficiency maximum power point tracker for photovoltaic arrays in a solar powered race vehicle, in *IEEE Power Electronics Specialists Conference*, 1993, pp. 574-580.
Sullivan, C.R. et al., Decrease in photovoltaic power output from ripple: Simple general calculation and effect of partial shading. In *Applied Power Electronics Conference and Exposition (APEC), 2011 Twenty-Sixth Annual IEEE*, pp. 1954-1960, Mar. 2011.
Sullivan, C.R. et al., Design and fabrication of low-loss toroidal air-core inductors, in *IEEE Power Electronics Specialists Conference*, 2006.
Sullivan, C.R. et al., Physically-based distributed models for multi-layer ceramic capacitors. In *Electrical Performance of Electronic Packaging*, 2003, pp. 185-188, Oct. 2003.
Sullivan, C.R. et al., Thin-film inductor designs and materials for high-current low-voltage power, *Transactions of the Magnetics Society of Japan*, vol. 3, pp. 126-128, Dec. 2003.
Sun, Y. et al., Perpendicular anisotropy in granular Co—Zr—0 films, *Journal of Applied Physics*, vol. 97, No. 10, pp. 10N301-303, 2005.
Sun, Y. et al., Soft Magnetic Properties of Obliquely Deposited CoZrO Films, *IEEE Transactions on Magnetics*, vol. 43, No. 12, pp. 4060-4063, Dec. 2007.
Sunpower Corporation, *Sunpower 210 Solar Panel Datasheet*. www.sunpowercorp.com.
Trends in photovoltaic applications, survey report of selected IEA countries between 1992 and 2006., Tech. Rep. IEA-PVPS T1-16:2007, International Energy Agency Photovoltaic Power Systems, 2007. [Online] www.iea-pvps.org.
Waffenschmidt, E. et al., Design method and material technologies for passives in printed circuit board embedded circuits, *IEEE Transactions on Power Electronics*, vol. 20, pp. 576-584, May 2005.
Walker, G.R. et al., Cascaded dc-dc converter connection of photovoltaic modules. *IEEE Transactions on Power Electronics*, 19(4):1130-1139, Jul. 2004.
Wilson, K. et al., Measuring the effect of cell mismatch on module output, *4th IEEE World Conference on Photovoltaic Energy Conversion*, vol. 1, pp. 916-919, May 2006.
Wolfs, P. et al., A single cell maximum power point tracking converter without a current sensor for high performance vehicle solar arrays, in *IEEE Power Electronics Specialists Conference*, pp. 165-171, 2005.
Woyte, A. et al. Partial shadowing of photovoltaic arrays with different system configurations: literature review and field test results., *Solar Energy*, vol. 74, pp. 217-233, 2003.
Wu, W. et al., DSP-based multiple peak power tracking for expandable power system, in *IEEE Applied Power Electronics Conference*, vol. 1, 2003, pp. 525-530.
Xiao, W. et al., A modified adaptive hill climbing mppt method for photovoltaic power systems. In *Power Electronics Specialists Conference, 2004. PESC 04. 2004 IEEE 35th Annual*, vol. 3, pp. 1957-1963 vol. 3, Jun. 2004.

\* cited by examiner

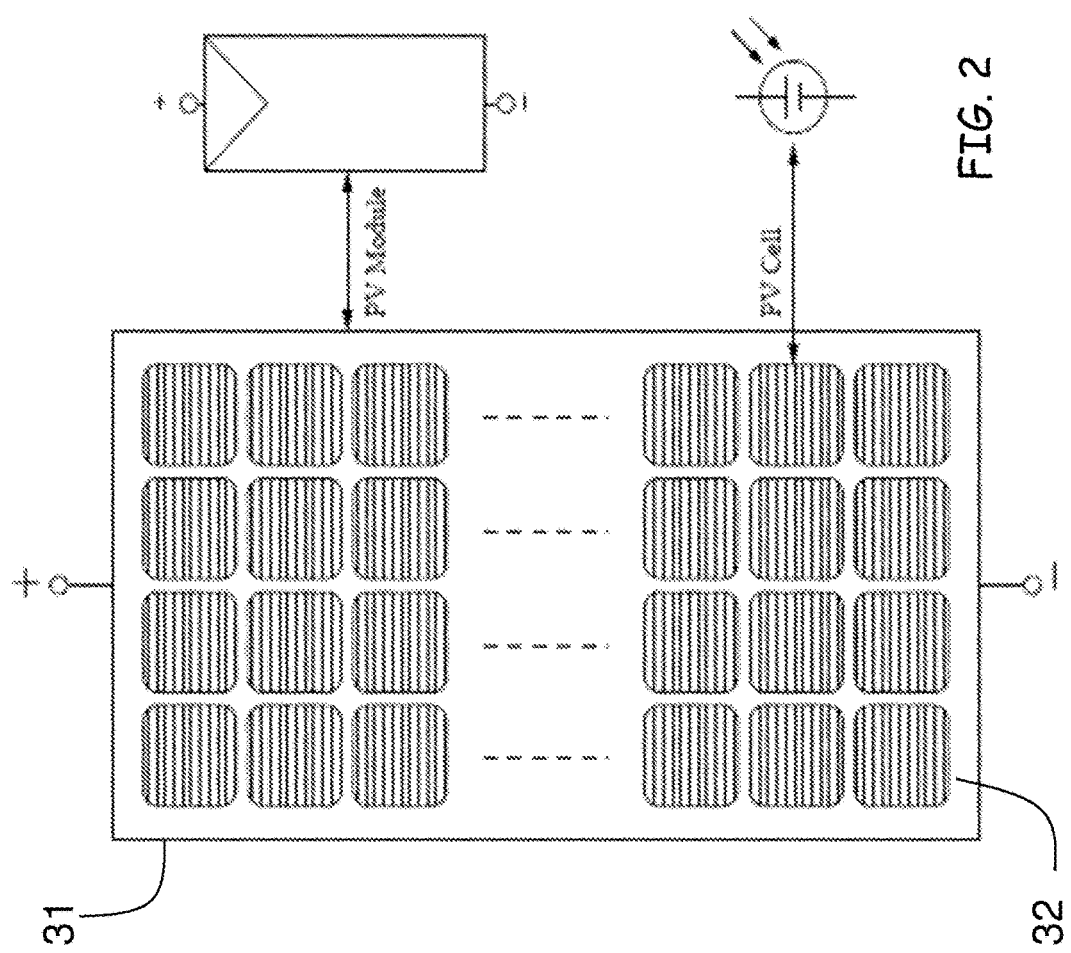

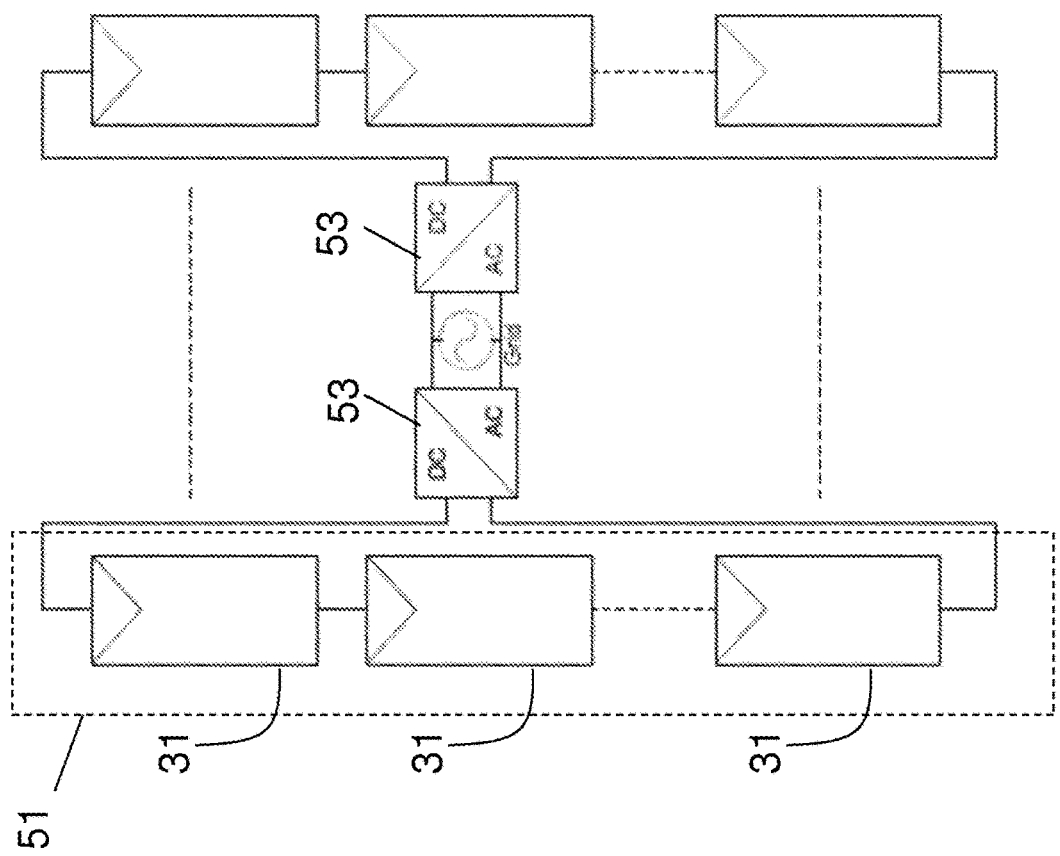

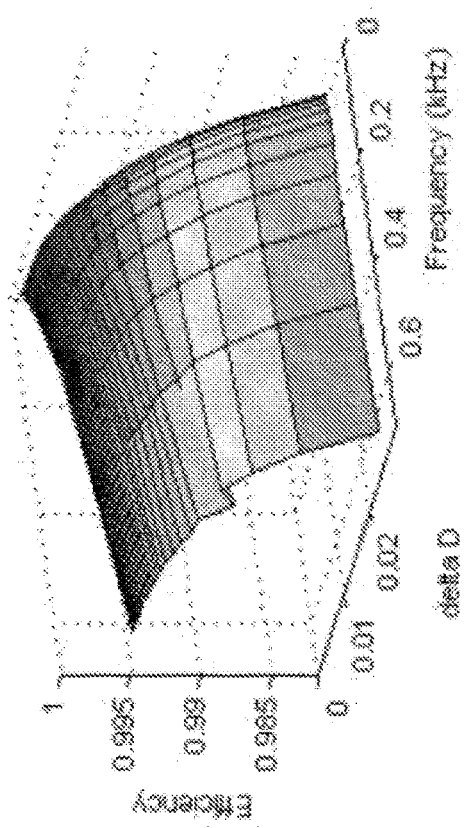
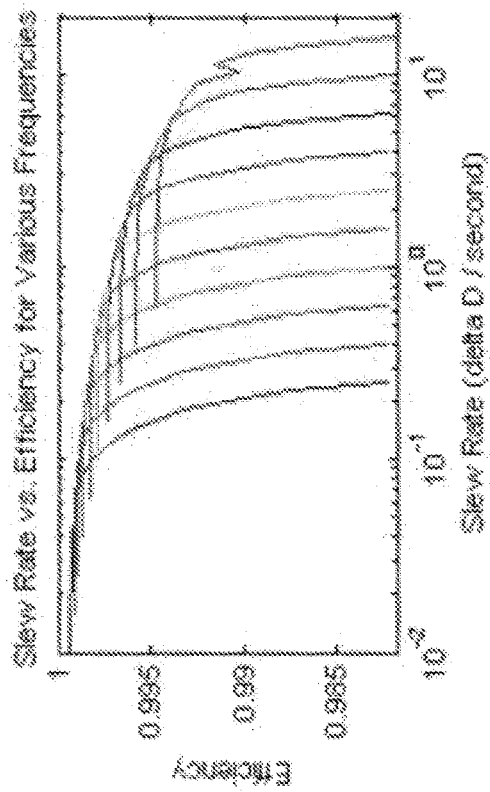
FIG. 27a
FIG. 27b

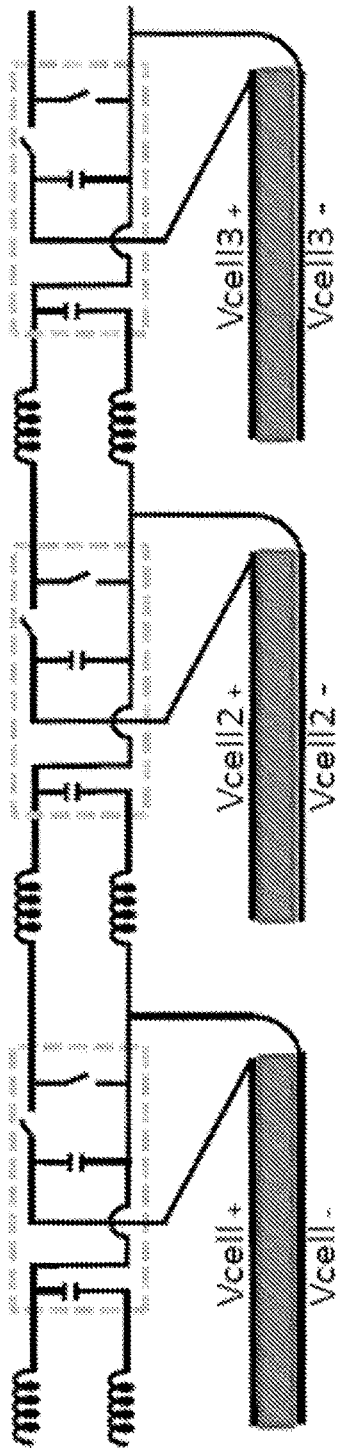
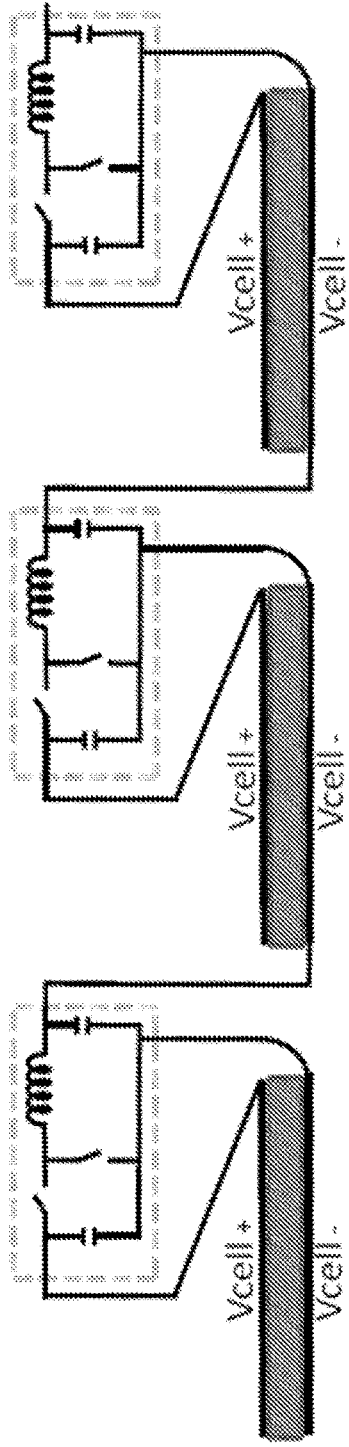
FIG. 31a
FIG. 31b

POWER PROCESSING METHODS AND APPARATUS FOR PHOTOVOLTAIC SYSTEMS

RELATED APPLICATIONS

This application is a National Stage of PCT/US2011/041563 filed Jun. 23, 2011, which claims priority under 35 U.S.C. §119(e) to U.S. Provisional Application Ser. No. 61/358,755, entitled "POWER PROCESSING METHODS AND APPARATUS FOR PHOTOVOLTAIC SYSTEMS" filed on Jun. 25, 2010, each of which is hereby incorporated by reference in its entirety.

FEDERALLY SPONSORED RESEARCH

This invention was made with government support under Grant Nos. NSF0925147 and NSF0925280 awarded by the National Science Foundation. The government has certain rights in the invention.

BACKGROUND

With rising world-wide energy demands and soaring prices of fossil fuels, interest in renewable energy sources has increased. Among these, solar photovoltaic (PV) energy has seen a rapid growth in the last few years.

FIG. 1 shows a schematic drawing of a conventional photovoltaic (PV) system 10. The system 100 includes a solar array 1, also commonly referred to as a "PV array." The PV array 1 typically includes multiple PV modules electrically connected together in series. Each PV module in turn typically includes multiple PV cells (also electrically connected together in series). The DC output voltage 2 of the solar array 1 is controlled by a maximum power point tracking (MPPT) apparatus 3 to obtain optimum power extraction from the solar array 1. The maximum power point (MPP) of the array 1 is the operating point of output current and voltage at which the array produces the highest amount of power, and this point changes with temperature and irradiation; accordingly, the MPPT apparatus 3 dynamically adjusts the operating point of the solar array 1 to track these changes. The DC output voltage 4 of the MPPT typically is then fed to an inverter 5, which provides an AC voltage to the power grid 6. In some conventional implementations, the function of the MPPT apparatus 3 is integrated into the inverter 5. However, in other implementations an MPPT apparatus 3 may be implemented separately from the inverter 5.

FIG. 2 shows an exemplary conventional PV module 31, which may include from thirty-six to seventy-two series-connected PV cells 32. The right side of FIG. 2 shows the respective circuit symbols for a PV module 31 and a PV cell 32. Because the cells 32 are all connected in series, the module output current is limited by the weakest cells. The output current of each cell 32 varies strongly with irradiation; FIGS. 3a and 3b respectively illustrate that the output power and current of a PC cell both are significantly higher when a PV cell receives full sunlight (e.g., 1 kW/m$^2$) than when it receives 25% of full sunlight. The current also changes with manufacturing lot (sometimes also within a lot), temperature and age. The resulting problem, called cell-current mismatch, is a common phenomenon which reduces power yield in PV modules.

The most severe effects of cell-current mismatch often are seen when PV modules experience different irradiation levels (typically due to partial shading). The shaded cells are reverse biased by the other series-connected cells, and can be driven into reverse conduction, acting as power loads, wasting power and incurring damage through localized dissipation at hot spots. To prevent damage to the shaded cells by reverse current, bypass diodes 40 are commonly employed, as shown in FIG. 4. One diode per eighteen to twenty-four cells typically is used in conventional systems. When shading of one or more cells causes the bypass diode to conduct, an entire section of eighteen to twenty-four cells is bypassed, and this section contributes no power to the output. The implications of shading effects on PV system and module design are significant; indeed, field results from early residential photovoltaic installations incorporating long strings of PV cells showed a significantly lower total power yield than expected. A large portion of the power yield reduction is attributed to the problem of partial shading of the solar panel from obstructions such as clouds, power lines, utility poles, trees, and dirt.

The problem of partial shading has led to the evolution of various conventional PV system architectures as illustrated in FIGS. 5a, 5b, and 5c. With reference to FIG. 5a, most early PV system architectures included one central inverter 52 (similar in functionality to the inverter 5 shown in FIG. 1) for an entire PV array (including multiple PV modules). As discussed above, in some implementations the central inverter 52 includes an integrated MPPT apparatus to obtain as high as possible power extraction from the array. In the architecture of FIG. 5a, a number of PV modules 31 are connected in a series string 51 within the array to achieve a high output voltage. Multiple strings then are connected in parallel to increase the power output of the array. The advantage of this technique is the ability to use a single high-voltage, high-power central inverter 52 that can be made very efficient. The disadvantage is that since the respective strings of PV modules in the array are constrained to operate at the same output voltage, some strings do not operate at their maximum power point (MPP) (e.g., in the case of uneven irradiation of the modules or mismatched cells/modules). This can lead to large reductions in power yields from this type of system architecture.

FIG. 5b illustrates another conventional PV system architecture designed to mitigate problems with MPP mismatches amongst different strings of modules. In particular, the system architecture of FIG. 5b employs a string inverter concept, in which each series-string 51 of modules 31 in the array is connected to its own inverter 53. This enables each string 51 to be operated at a voltage that coincides with its MPP, and thus improves power yield. One disadvantage of this approach is the need for several inverters 53 of lower power than the single central inverter 52 shown in the system of FIG. 5a. The requirement of multiple lower power inverters typically leads to a less efficient and more expensive PV system overall. Although each string 51 of PV modules is operating at its MPP, total output power is still constrained by modules 31 with reduced output capability. In the case where a module 31 is sufficiently shaded, its bypass diodes conduct, and it absorbs power. In addition, shading of individual modules in the string 51 can lead to a situation where the MPPT apparatus (e.g., which may be integrated in each inverter 53) settles on a local optimum power point that is less than the global MPP.

To further improve power extraction from conventional PV systems, there has been movement towards other system architectures that provide MPP tracking at the individual module level. For example, with reference to FIG. 5c, another PV system architecture employs one grid-interfaced inverter 54 per module 31, which enables each module 31 to operate at its own MPP. The disadvantage of this approach is the increased number of inverters, each of which operates at low power (e.g., 100-200 W) and large voltage transformation, leading to higher total system cost and lower conversion efficiency.

As discussed above, power electronics for conventional PV systems has evolved from attempting to optimize power obtained from an entire array, to optimizing power obtained from a string of series-connected PV modules, to optimizing power obtained from individual PV modules (e.g., via maximum power point tracking, or "MPPT," to achieve maximum power point operation).

However, even when per-module MPPT is employed in power electronics for conventional PV systems, not all of the available power may be captured from each module. FIG. 6 provides an illustrative example of the shortcomings of per-module MPPT. FIG. 6 shows a typical module 31 with seventy-two cells in series and three bypass diodes. In this example, a single cell 61 is shaded. Shading could happen for various reasons, such as due to dirt accumulation, fallen leaves, or an overhead power line. The shaded cell 61 causes the bypass diode 62 to conduct, and all twenty-four cells associated with the conducting bypass diode contribute no power to the output. Accordingly, the total output power that can be extracted is reduced by 33%. Thus, the amount of power that can be extracted from MPP operation of single PV module is often much lower than expected.

Power conversion systems providing cell-level power-point tracking have been proposed to address this issue (see, for example, R. Rohrig and J. Steger, "Circuit arrangements for photovoltaic system," U.S. Patent Application Publication 2005/0172995, August 2005, and P. Wolfs and L. Tang, "A single cell maximum power point tracking converter without a current sensor for high performance vehicle solar arrays," in *IEEE Power Electronics Specialists Conference*, pp. 165-171, 2005.) However, the methods proposed to date are inherently costly and complex, due to the use of discrete components and a relatively low level of system integration. As a consequence, such systems would be practical only in highly specialized applications.

As production capacity of PV cells has significantly increased in recent years, prices for PV cells have decreased. As a result, the cost of PV system power electronics (e.g., MPPT apparatus and inverters) required to extract the maximum power from the PV system and to interface the PV system to the grid is becoming a larger part of the overall system cost. Much attention has therefore been given to the development of power electronics that enable a cost reduction of the overall system. In addition, much research is focused on increasing the efficiency of the power processing stage, as well as on improving the power yield of the overall system.

SUMMARY

The inventors have recognized and appreciated that many of these limitations can overcome by providing a more highly integrated cell-level control apparatus. In exemplary implementations of the inventive concepts discussed herein, each cell of a solar array may be controlled by power electronics and control circuitry integrated together on a chip, which may be advantageously fabricated using CMOS techniques, enabling reductions in cost and size. In some embodiments, increasing the switching frequency of the power electronics enables shrinking the size of passive components (e.g., capacitors and inductors) so that they can be formed on a chip.

Significant improvements to the power generation capabilities of PV systems may be realized by operating each cell of a PV module at its individual maximum power point. Accordingly, various inventive embodiments discussed in detail herein are directed to power processing methods and apparatus for PV systems, in which each cell of a solar array in configured for MPP operation. In one aspect, circuitry integrated with a PV cell may be configured to implement a "perturb and observe" algorithm to find the MPP of the cell by measuring the power produced at different operating points, and modifying the operating point in the direction of increased power production. In another aspect, such circuitry may be configured to provide improved performance for a perturb and observe algorithm in the presence of noise.

In sum, some embodiments of the present invention are directed to a circuit for controlling a photovoltaic cell. The circuit includes a power converter formed on a semiconductor substrate. The circuit also includes a controller to control the power converter. The controller is also formed on the semiconductor substrate.

Some embodiments relate to a circuit for controlling a photovoltaic cell. The circuit includes a power converter configured to operate at a switching frequency of at least 1 MHz. The circuit further includes a controller to control the power converter.

Some embodiments relate to a system for controlling a plurality of photovoltaic cells. The system includes a first power converter coupled to a first photovoltaic cell. The first power converter is formed on a first semiconductor substrate. The system also includes a first controller to control the first power converter. The first controller is also formed on the first semiconductor substrate. The system also includes a second power converter coupled to a second photovoltaic cell. The second power converter is formed on a second semiconductor substrate. The system further includes a second controller to control the second power converter. The second controller is formed on the second semiconductor substrate.

Some embodiments relate to a system for controlling a plurality of photovoltaic cells. The system includes a first power converter coupled to a first photovoltaic cell and a first controller to control the first power converter. The system also includes a second power converter in series with the first power converter and coupled to a second photovoltaic cell. The system also includes a second controller to control the second power converter. The system further includes a third controller that controls a current through the first and second power converters.

Some embodiments relate to a method of controlling a photovoltaic element to operate at approximately its maximum power point. A noise parameter is determined for a measurement at the photovoltaic element. An operating point of the photovoltaic element is controlled based on the noise parameter.

Some embodiments relate to a method of controlling a photovoltaic element to operate at approximately its maximum power point. The photovoltaic element is operated at a first operating point. A first signal produced by the photovoltaic element at the first operating point is measured. The photovoltaic element is operated at a second operating point. A second signal produced by the photovoltaic element at the second operating point is measured. A third operating point for the photovoltaic element is determined based on the first signal, the second signal, and an alternating value. The photovoltaic element is operated at the third operating point.

Some embodiments relate to a photovoltaic system that includes a plurality of series-connected controlled cells. Each controlled cell includes a photovoltaic cell, and a maximum power point controller coupled to the photovoltaic cell. The maximum power point controller includes a DC-DC converter circuit to control at least a first current generated by the photovoltaic cell based at least in part on a duty cycle of the DC-DC converter circuit. The maximum power point controller also includes a first controller to control the duty cycle of the DC-DC converter circuit. The system further includes an inverter coupled to the plurality of series-connected controlled cells. The inverter includes a second controller to control a second current flowing through the plurality of series-connected controlled cells.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the invention may be shown exaggerated or enlarged to facilitate an understanding of the invention. In the drawings, like reference characters generally refer to like features, functionally similar and/or structurally similar elements throughout the various figures. The drawings are not necessarily to scale, emphasis instead being placed upon illustrating the principles of the teachings. The drawings are not intended to limit the scope of the present teachings in any way.

FIG. 2 shows an example of a conventional PV module and corresponding circuit symbols for modules and cells.

FIGS. 5a, 5b, and 5c respectively show schematic diagrams of conventional PV system architectures employing a central inverter, a string inverter, and a module inverter.

FIGS. 27a and 27b show plots of efficiency as a function of various MPPT algorithm parameters.

FIGS. 31a and 31b show examples of ways that PV cells may be connected together.

The features and advantages of the present invention will become more apparent from the detailed description set forth below when taken in conjunction with the drawings.

DETAILED DESCRIPTION

1. Introduction

Described herein are various inventive methods and apparatus for operating a photovoltaic (PV) system at a high power output. In some embodiments, a highly integrated control apparatus at each photovoltaic cell can facilitate obtaining a high power output by controlling each photovoltaic cell individually to operate at or substantially close to its maximum power point (MPP). The maximum power point is the operating point of current and voltage at which the photovoltaic cell produces the highest amount of power.

In some embodiments, a PV cell may be controlled to operate at or near its maximum power point using a maximum power point controller that runs a maximum power point tracking (MPPT) algorithm. In one exemplary implementation, a "perturb and observe" algorithm may be used to find the MPP by measuring the power produced at different operating points, and then modifying the operating point in the direction of the operating point with increased power production. However, in some circumstances, a perturb and observe algorithm may not perform as effectively as desired when noise is present in current or voltage measurements. Accordingly, techniques are described herein that provide improved performance for a perturb and observe algorithm in the presence of noise.

2. Controlled-Cell System Architecture

Figure 1:
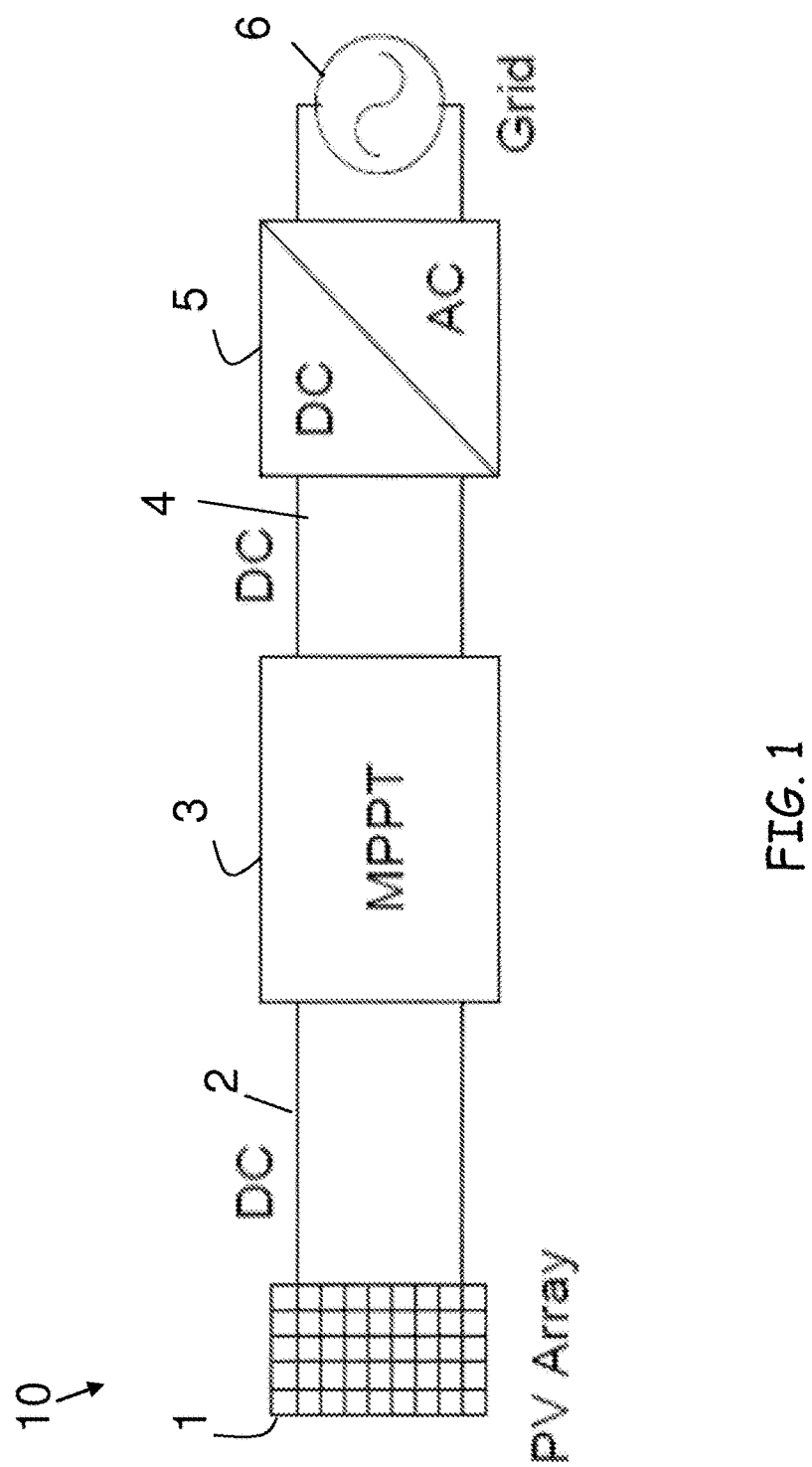
FIG. 1 shows a schematic drawing of a conventional photovoltaic (PV) system.
Figure 3A:
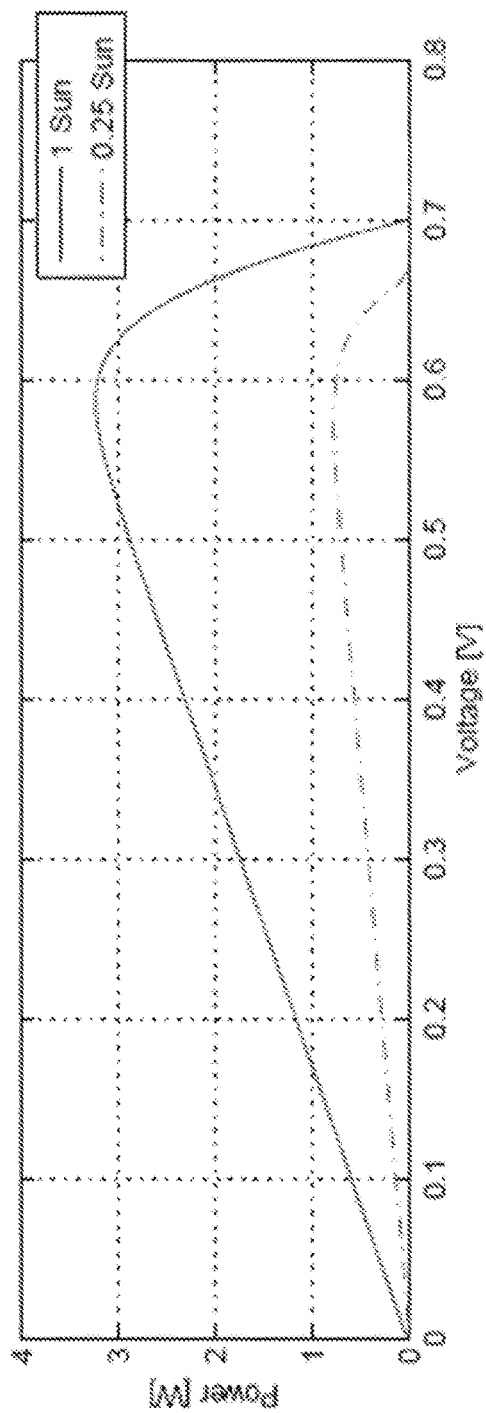
FIGS. 3a and 3b are plots showing electrical characteristics (i.e., output power and output current) of a single solar cell under varying irradiation levels.
Figure 3B:
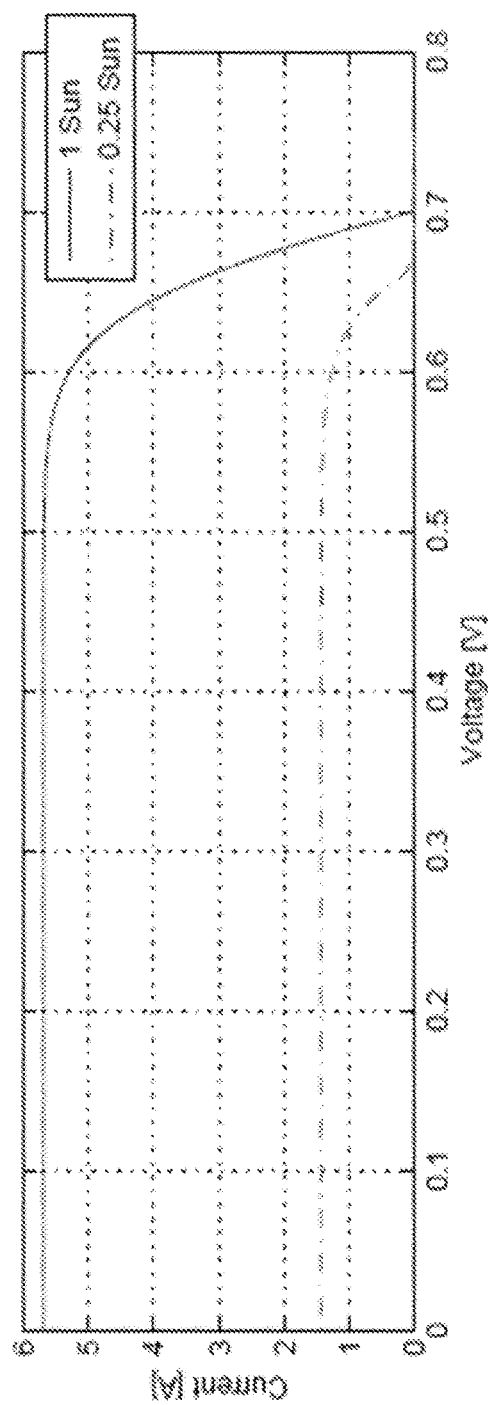
Figure 4:
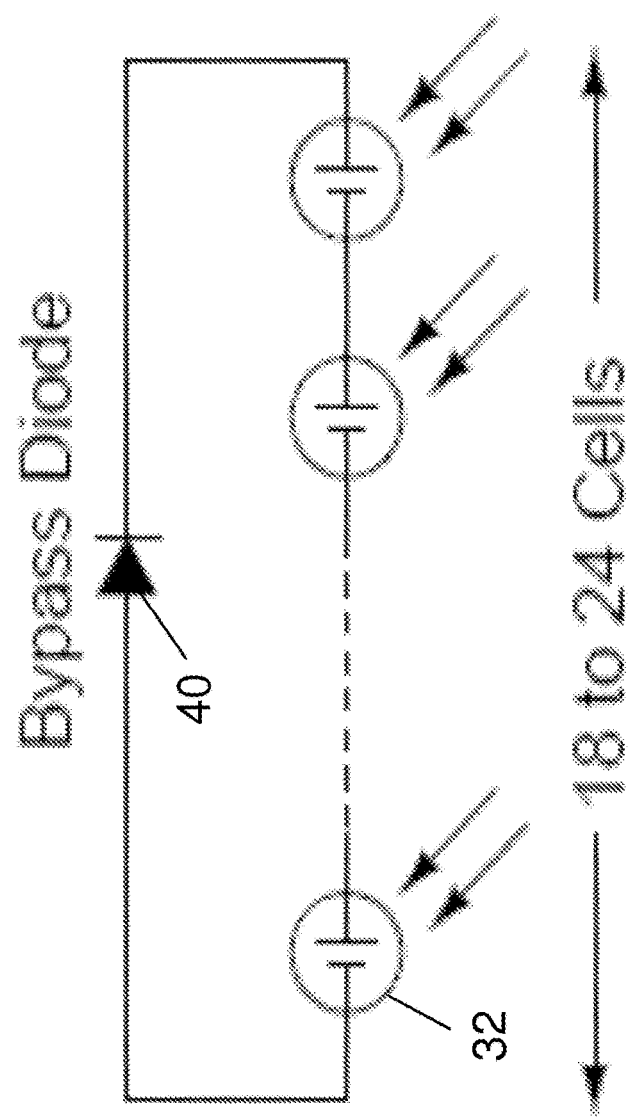
FIG. 4 shows a schematic diagram illustrating the use of bypass diodes to prevent damage to shaded cells in conventional PV systems.
Figure 5A:
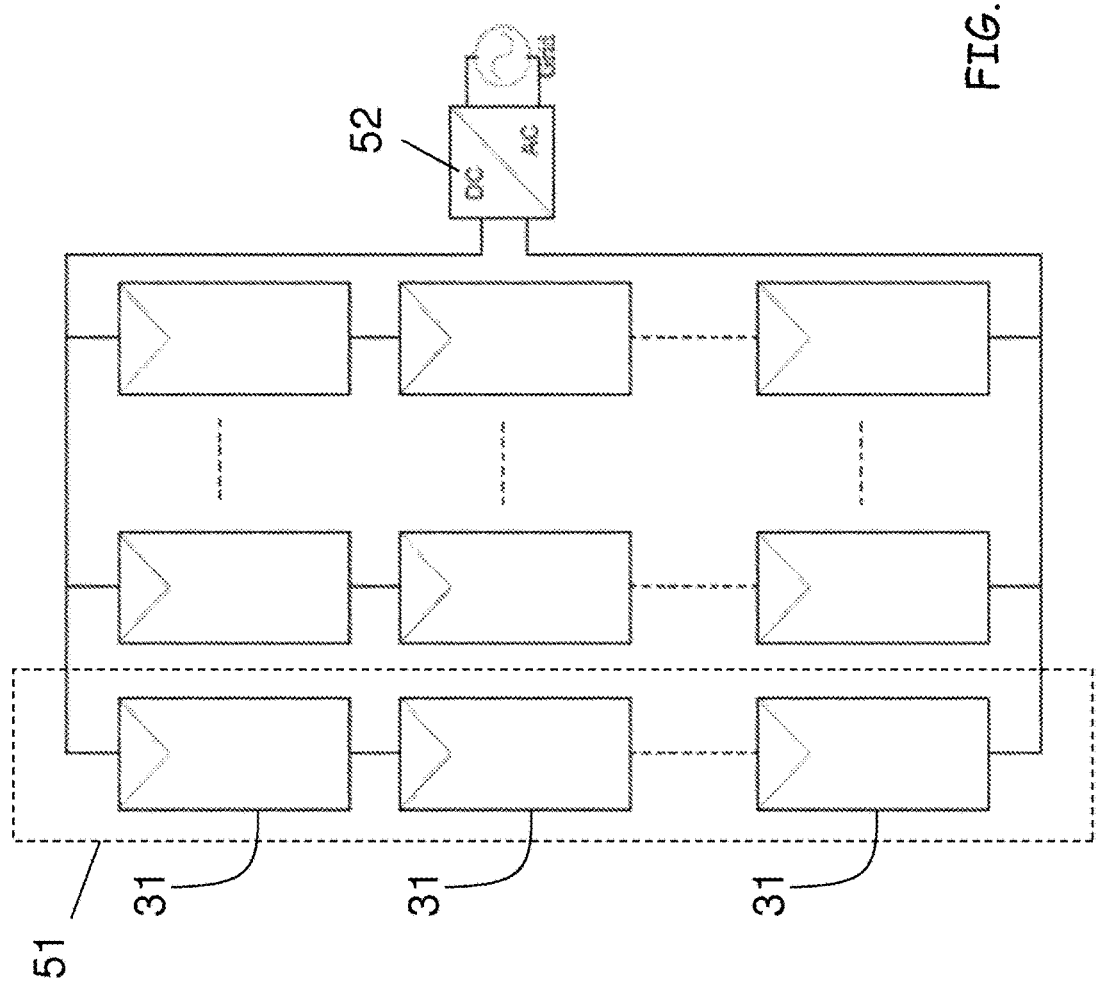
Figure 5C:
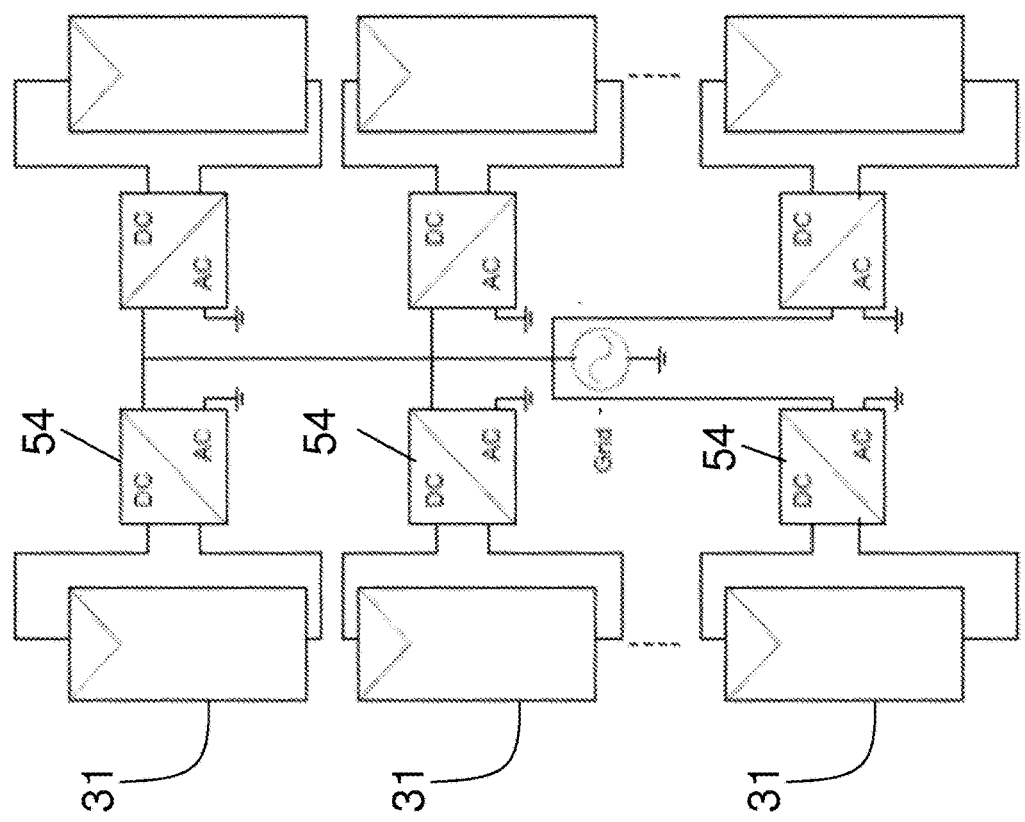
Figure 6:
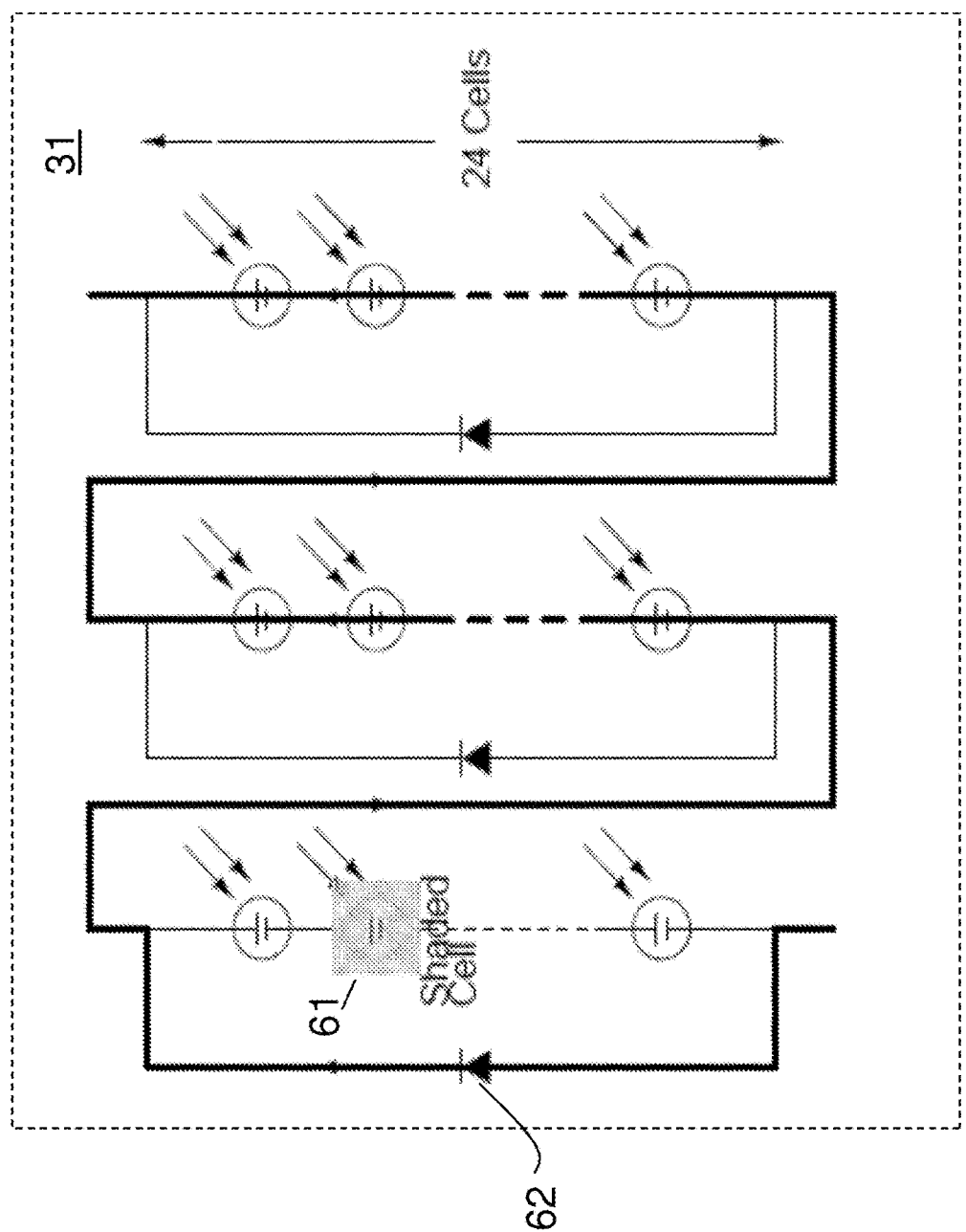
FIG. 6 illustrates shading of one cell in a conventional PV module, which results in bypassing an entire section of cells in the module.
Figures 7A, 7B:
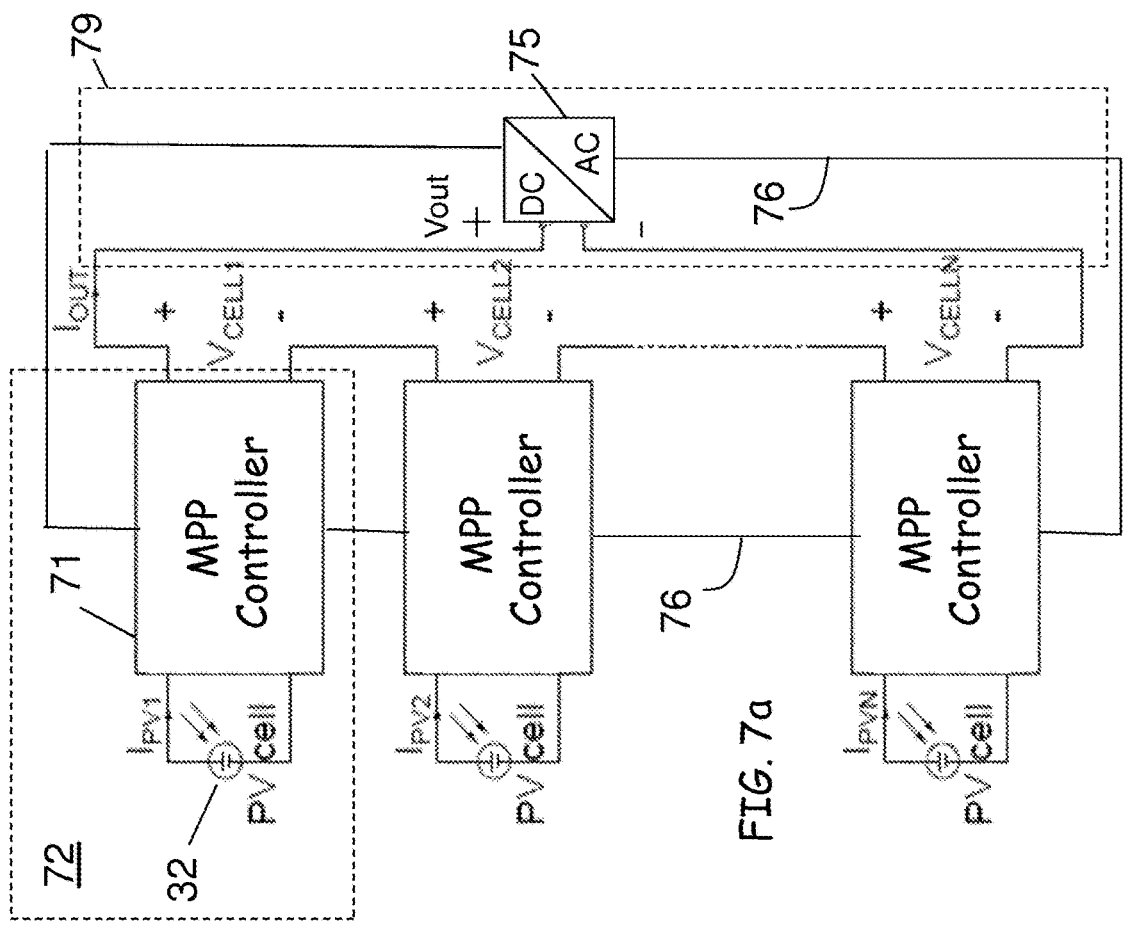
FIG. 7a shows a portion of a PV system, according to one embodiment of the present invention, in which cells are controlled individually to achieve maximum power point operation.
FIG. 7b shows an exemplary per-cell power converter implementation according to one embodiment of the present invention.

FIG. 7a shows an example of a system architecture that may be used to more fully capture the power available from a PV system, according to some embodiments of the present invention. In this architecture, an integrated circuit switched-mode MPP controller 71 is connected to a PV cell 32 (in some implementations, each cell of an array), forming a "controlled cell" 72. As discussed in greater detail below, the MPP controller 71 may include a low-voltage switching power converter and a controller running an MPP tracking algorithm which modulates the cell current ($I_{PV}$) so that the cell can operate at its MPP independent of an output current ($I_{OUT}$) of the controlled cell 72. The controlled cells 72 may be stacked in series, as shown in FIG. 7a, to achieve a high output voltage, which enables the use of a high-power, highly efficient centralized inverter 75 in grid-tied applications, such as is shown in the architecture of FIG. 5a. In some applications, producing a high voltage (relative to a cell voltage) is also advantageous, as it reduces the additional voltage conversion necessary. As indicated by the dashed box 79 in FIG. 7a, the cells may be connected to the inverter at the module level, or any other level, such as the string level or the system level. Any suitable inverter implementation may be used, such as the string-level inverter architecture of FIG. 5b or the module-level inverter architecture of FIG. 5C. Each inverter may have an associated controller for controlling the current through the corresponding cells, module strings, or PV system.

FIG. 7b illustrates one example of a circuit topology 73 (based on a synchronous buck power stage) that can be used to implement the power converter of a single-cell MPP controller, in some embodiments. In this topology, the individual cell currents ($I_{PV}$) can be modulated to any value below that of the series "string current" ($I_{OUT}$) (enabling individual power point tracking of the cells 32 and complete bypass of any failed or fully shaded cells.

Figure 7C:
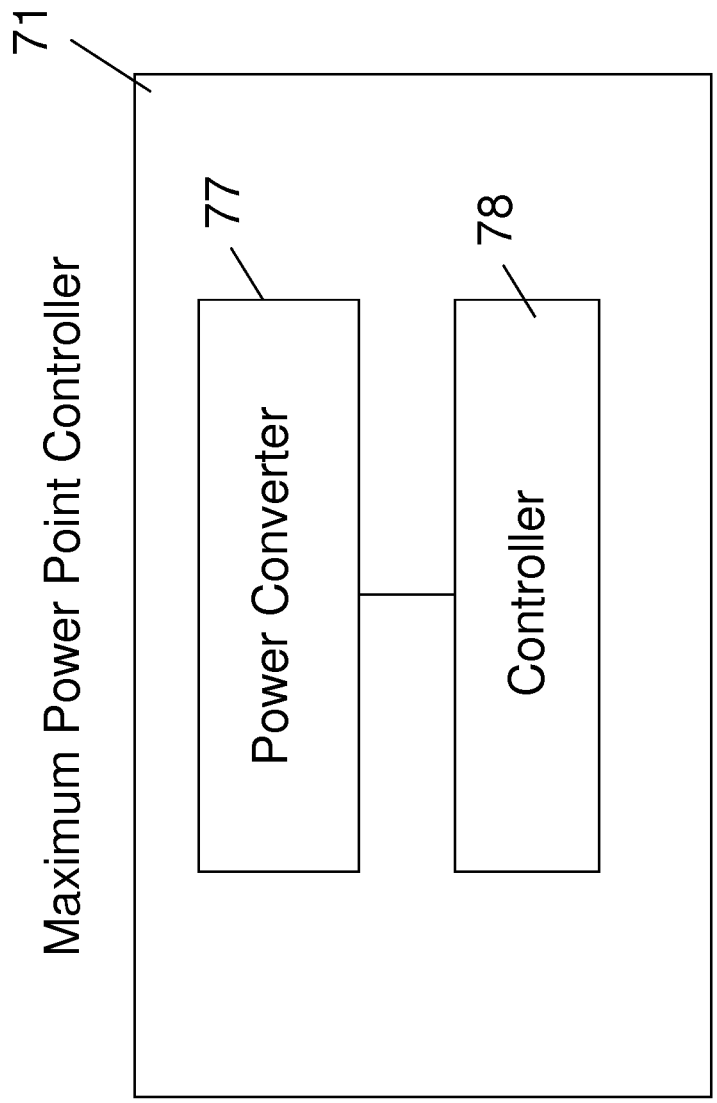
FIG. 7c shows an example of a maximum power point (MPP) cell controller according to one embodiment of the present invention.

FIG. 7c shows a block diagram of a MPP controller 71, which includes a power converter 77 and a controller 78. The power converter may be a DC-DC converter, such as a buck converter, as discussed above. Controller 78 executes a MPP tracking algorithm. Controller 78 can be integrated on the same chip as the power converter 77 using CMOS or any other device technology. Power converter 77 and controller 78 may be formed on the same semiconductor substrate.

It should be noted that conventional discrete-component implementations of the architecture of FIG. 7b would not be practical in most commercial applications for cost, packaging, and reliability reasons. This is a difficulty with previously-proposed single-cell tracking schemes. However, in some embodiments, the MPP controllers 71 may be fabricated in a low-voltage CMOS process, with power switches and control logic for an MPP controller 71 all being integrated on the same semiconductor substrate (e.g., a monolithic die). The working voltage of a silicon solar cell (<0.6 V) matches very well with the process voltages of submicron CMOS technologies (e.g., 90 nm to 180 nm), enabling the use of a standard, low-cost CMOS process for the power conversion and control. Moreover, because the achievable operating frequencies of power converters in CMOS scale up rapidly with lower operating voltage, miniaturization and integration of the passive energy storage components is also viable. In particular, designing the MPP controllers in low voltage CMOS enables switching frequencies from one megahertz to hundreds of megahertz at high efficiency. Depending on design constraints, various frequencies may be used, such as a switching frequency greater than 20 kHz, greater than 100 kHz, greater than 1 MHz, greater than 5 MHz, greater than 10 MHz, or greater than 100 MHz. Switching at the higher frequencies may enable reductions in component size, while switching at the lower frequencies may enable reduced switching losses.

At very high frequencies, the passive components (e.g., inductors and capacitors) needed for the power conversion circuit need only very small inductance and capacitance values. Inductors can be either integrated on- or over-die or, alternatively, can be realized using interconnect inductance between cells. One attractive technology is microfabricated inductors using thin-film nanocomposite magnetic materials. At sufficiently high frequency, air-core inductors can also be attractive. Inductors can also be co-packaged with an IC, or integrated into packaging or interconnect. In some topologies, it may also be advantageous to use coupled inductors. Likewise, capacitances required for a power converter (e.g., such as those shown in FIG. 7b) can be realized as a combination of on-die capacitance and intrinsic cell capacitance. One possibility for the topology in FIG. 7b is to implement the input capacitor with on-die capacitors and intrinsic cell capacitance and to implement the output capacitor with a discrete capacitor. To maximize the effectiveness of the output filter, the output capacitor should have low series inductance, or, for a three- or four-terminal capacitor, low mutual inductance between input and output terminals. Various ways to achieve this are possible, such as by the use of a wide-format surface-mount capacitor such as a "reverse geometry" multilayer ceramic capacitor.

The high degree of integration, in addition to reducing cost and size, also mitigates the reliability and packaging challenges of discrete implementations. The integration and scaling afforded by low-voltage CMOS thus enables a small, low-cost, reliable, and efficient implementation of the MPP controller, which in turn enables use of the system architecture shown in FIG. 7a.

In some embodiments, the components of maximum power point controller 71 (including power converter 77 and controller 78) and the photovoltaic cell 32 may be packaged together. In some implementations, the photovoltaic cell can be formed on a first substrate and the maximum power point controller may be formed on a second substrate. The maximum power point controller 71 can be packaged at the back side of the photovoltaic cell and electrically connected thereto. The combined PV-cell/controller package may then be assembled into an array using standard techniques. In other implementations, the PV cells may be assembled into an array, with the controllers at the back of the PV cells, and then one may encapsulate and connect the cells and converters. Several implementation examples are discussed below.

2.1. System Control

The type of system architecture illustrated in FIG. 7a provides the ability to achieve the power benefits of single-cell power-point tracking along with the system benefits of using a single, centralized high-power grid-interface inverter. One aspect to be addressed is control of the system to achieve the desired increased and, in some instances, maximum power extraction. A centralized inverter system typically implements MPPT control at the "string level." However, the techniques described herein can implement MPPT control in a distributed fashion at the cell level, providing a variety of system-level control opportunities.

For example, with respect to the specific implementation example illustrated in FIG. 7b, each of the individual cells can be operated at any current level ($I_{PV}$) below the current ($I_{OUT}$) in the series controlled-cell string connection. By adjusting the duty ratio of the top switch 74 to "1," the full string current can be routed through the cell, while by adjusting the duty ratio of the top switch 74 to "0," the cell can be bypassed, i.e., the cell current ($I_{PV}$) can be reduced to zero while maintaining a high string current. More generally, by adjusting duty ratio, the MPP controller 71 of a controlled cell can autonomously achieve MPP operation so long as the cell current at its MPP is equal to or less than that in the string. Thus, to achieve overall MPP operation, each cell controller adjusts its duty ratio for MPP operation (e.g., in a "fast" loop) based on the string current, while the system level controller (e.g., implemented by the grid-interface inverter 75) adjusts the string current (in a "slow" loop) such that there is just sufficient string current available for the cell with the highest MPP current. In this manner, the control problem can be separated into a local MPP control for each cell, along with a single global loop that only requires limited information (i.e., the highest operating duty ratio among all the cells, which should be driven by the outer loop to a value slightly below "1"). The individual cell converters' switching frequencies could be synchronized or asynchronous. If they are synchronized, shifting the phase between each converter can be advantageous to partially cancel output voltage ripple.

According to various aspects of the inventive embodiments described herein, exemplary implementations of such a multi-loop control scheme are not only effective and stable, but also require relatively little hardware at the individual cell level and minimum communications among cells. The local MPPT algorithm can be implemented with many of the basic techniques proposed to date. In fact, since multiple local maxima are not a concern with cell-based tracking, the MPPT algorithm can be simplified as compared to multi-cell tracking. The MPP controller can be entirely realized on-die at extremely low power in CMOS, for example using the approaches discussed in Section 2.2. Each cell controller 71 need only communicate one piece of data, e.g. its cell current or duty ratio, to the global level control 75. This can be implemented either using a very simple single-interconnect or zero-interconnect communications link, or by encoding the information to communicate it directly via the series string interconnect. One suitable implementation uses the switching frequency of the cell power converter to convey the duty cycle information. For example, if the duty cycle goes above a threshold, the switching frequency is changed. If the switching frequency is dropped, the output ripple magnitude is increased. The string controller then needs only detect any signal at the lower frequency in order to ascertain that at least one cell has exceeded the duty cycle limit. To help make this signal easier to detect, the input filter of the string power converter 75 can include a parallel resonant LC circuit to increase the impedance at the lower frequency that is used for signaling.

Although more information is not needed for basic operation of the system, other information is useful in some situations. For example, data on individual cell voltages and temperatures as well as currents could be collected. This data can be encoded in the frequency modulation of the cell switching frequencies in many different ways. Any other suitable technique can be used for sending this information, such as using a communication bus 76.

Given full data on cell operating points, the string controller 75 can calculate the best current at which to operate, typically at or slightly below the MPP current of the highest-power cell. With only one bit of information in total—whether or not at least one cell is above a high duty cycle threshold—the string controller can maintain operation near this point as follows: the string current can be slowly decreased until the at least one cell is above the high-duty-cycle threshold. When this point is reached, the string current is adjusted up a small increment (e.g., 5%). Following this step up, the current can again be slowly decreased, and the cycle repeats. Information can be exchanged between the cells and the inverter using a communication bus 76 (FIG. 7a), which may be a single wire in some embodiments.

It is also possible to operate the system with no communication at all between the cells or the inverter. The master controller 75 may adjust the string current based on an algorithm that may be similar to any one of the many standard maximum power point tracking algorithms. For example, it could use the perturb and observe method: the string current would be adjusted and the change in total power collected from the string measured. Over much of the range, the changes in power output would be very small, and the operating point may drift widely. However, this may be acceptable, because the power collected may be close to the maximum. If the system drifted too far from the maximum power point, a clearly decreasing power signal would be measurable, and proper operation could be restored.

Figure 7D:
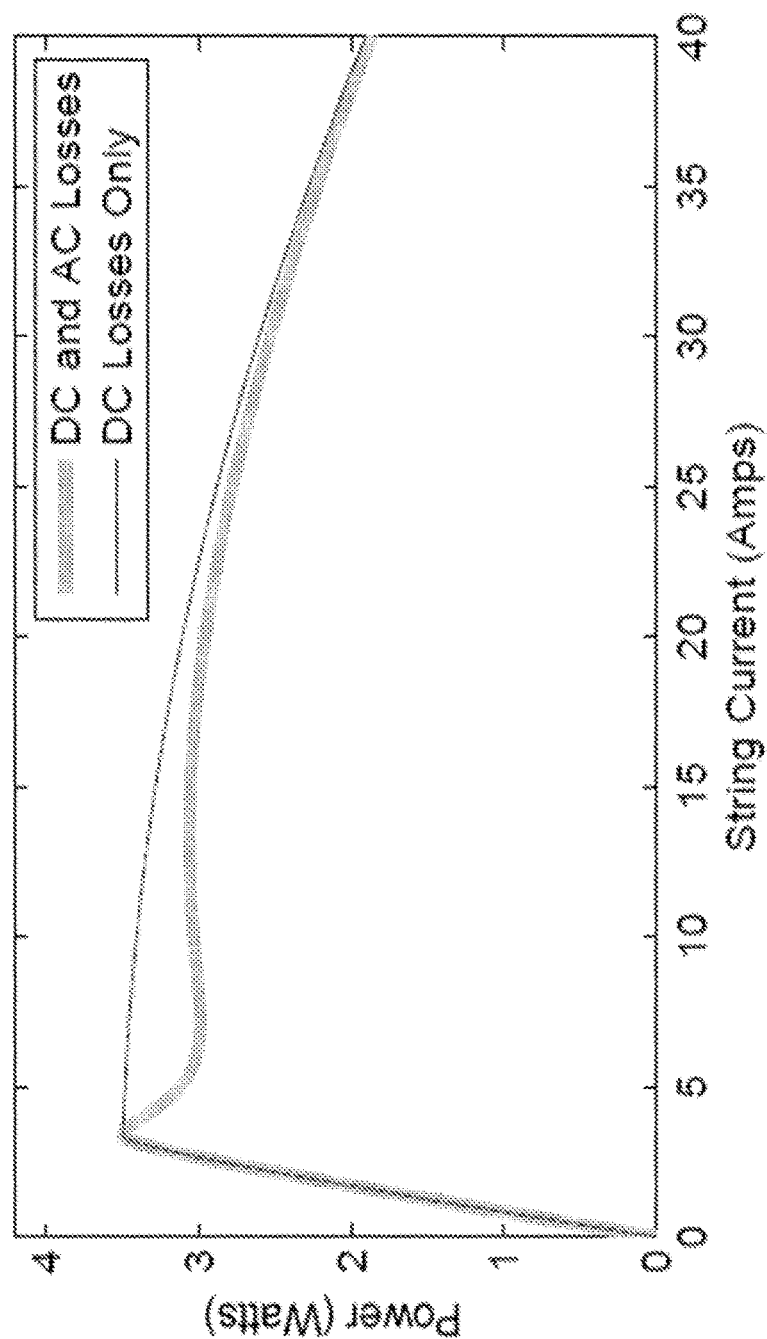
FIG. 7d shows that the effect of AC losses can create a local maximum which may favor the use more a more sophisticated MPPT algorithm.

If the AC losses in the converters are large enough, this could lead to multiple maxima and minima in the string current vs. output power of the string of controlled cells, which could confuse the MPPT algorithm. This is illustrated in FIG. 7d, which shows the output power vs. string current of a simple two cell string. Without the AC losses, the power vs. string current curve has a single maximum, which could be tracked by a simple perturb and observe algorithm. However, if the AC losses are large enough, a local maximum forms. This is understood by noting that as one increases the string current, the duty cycle of the converters decreases in order to operate the cells at their MPP. The AC ripple in the components of the converter will be a maximum at a duty cycle of 0.5, so as one increases the string current, the AC losses will peak at D=0:5 and then diminish. This is what leads to the local maxima in FIG. 7d. There are a few options for dealing with these local maxima. For one, one can design the converters to have low AC losses, which would prevent the creation of local maxima. However, this option might require more expensive components for the converters. Another option is to implement a MPPT algorithm that is capable of handling local maxima, of which there are many choices available in the art. However, having to deal with local maxima will most likely lead to poorer performance due to needing to search around on the power curve more.

Figure 7E:
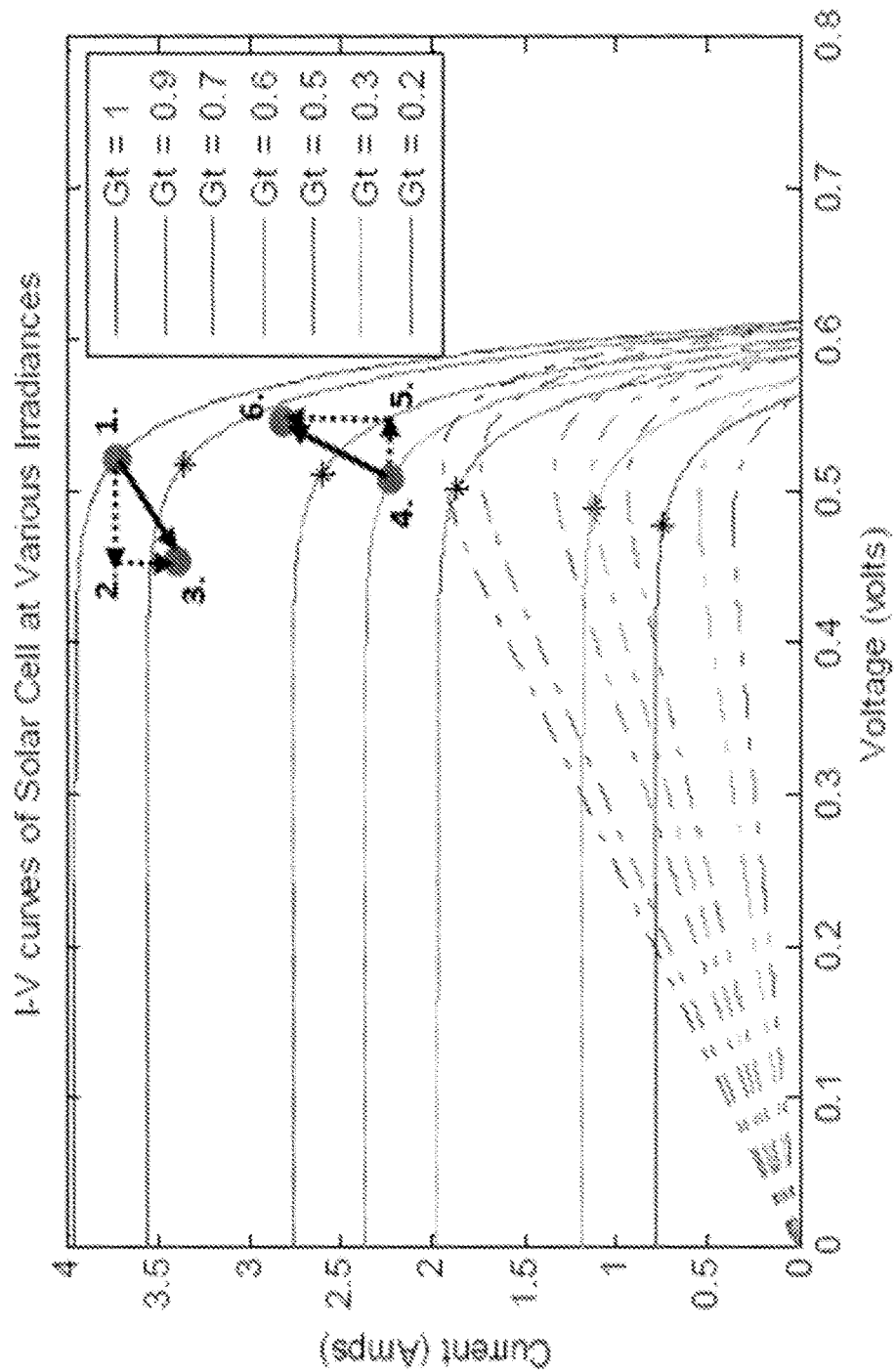
FIG. 7e shows the effect of a non-ideal current source on MPP tracking.

Although in some embodiments the string controller 75 acts as a stiff current source, tightly regulating the string current, simulations show that the this is not necessary—that the system works well even with a moderately low output impedance. In some cases, the recovery time to regain maximum power point operation after a step change in irradiance is faster with a moderate, finite impedance than it was with a stiff current source. This can be understood by looking at FIG. 7e. If one is at point 1 on a cell in the string and the amount of sunlight on that cell decreases, this will cause the voltage of the cell to drop. This is due to the fact that the cell converter will still be demanding that $I_{cell}=I_s/ID$, and the only way for the cell to output more current is to decrease its output voltage. However, this will cause the output voltage of the cell converter to drop, decreasing Vs. If one is at steady state and $V_s$ decreases, then $dI_s/dt$ will be negative. This decrease in $I_s$ will cause the current being demanded from the cell to decrease, leading to the path from point 2 to point 3. Similarly, if one is at point 4 on a cell in the string and the amount of sunlight on that cell increases, this will move one towards point 5. However, this will increase Vs, leading to an increase in $I_s$, which moves one toward point 6. In both cases, the non-ideal current source leads to one moving closer to the new MPP of the cell after a change in sunlight faster than an ideal source would do.

Although the concept of the string current control was described above for buck cell converters, the same general concept for string current control applies with other topologies, such as those discussed in Section 2.3. For example, in the case of a converter with the capability of boosting the output voltage magnitude relative to the input voltage magnitude, the ultimate constraint on maximum output voltage, which requires an increase of string current, is typically either a voltage rating on one or more of the components, or a timing constraint on operation with extreme duty cycles. Regardless of the origin of the limit, converters approaching the limit could send a signal to the string controller to request an increase in string current, just as buck converters approaching maximum duty cycle require an increase in string current to maintain operation at the MPP. However, depending on the topology and the particular component implementations, the efficiency of the converter might degrade at extreme duty cycles. In this case, the control strategy could increase the string current sooner, in order to keep the converters operating nearer their maximum efficiency point.

2.2. Cell Controller

Figure 8:
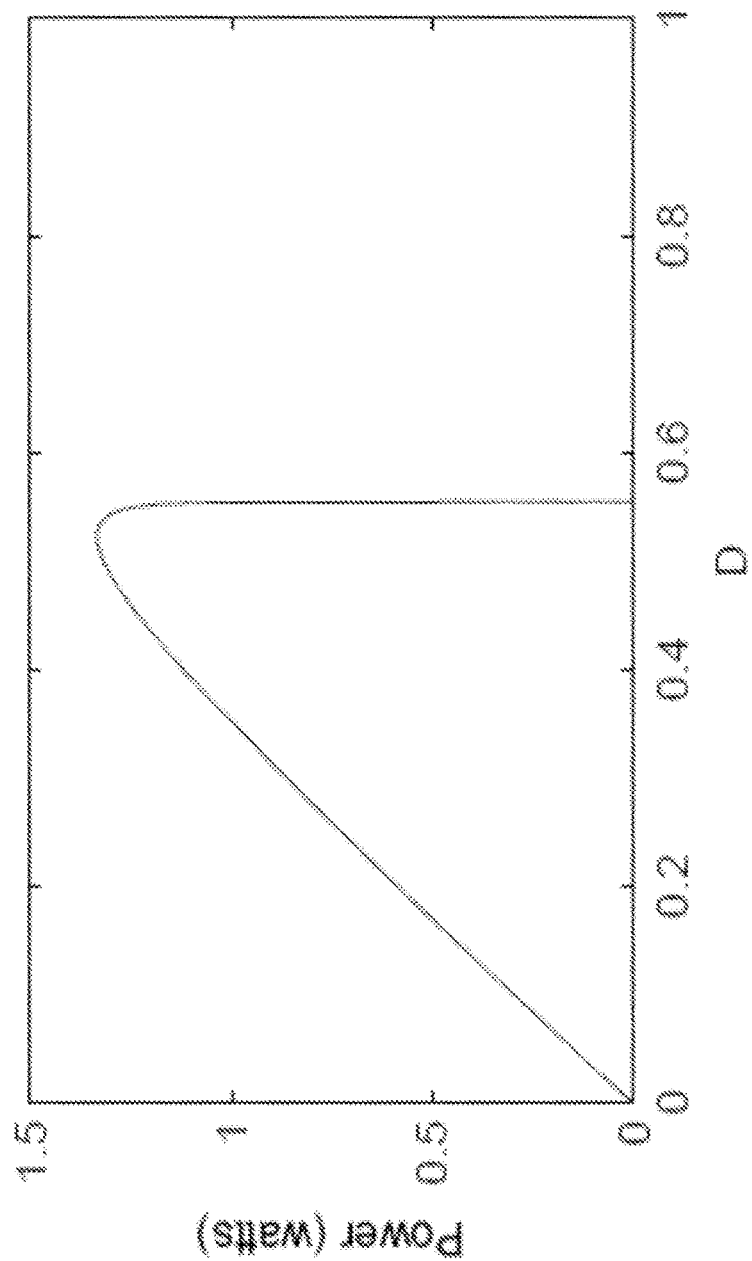
FIG. 8 shows a diagram of power versus duty cycle for a constant string current.

With the system architecture described herein, maximum power point tracking for each cell is possible. As discussed above, there is an optimal operating point at which a cell outputs the most power for the given irradiance and temperature. Through the use of a DC-DC converter, one can change the operating point of the cell by changing the duty cycle of the converter using controller 78. A typical curve for power vs. duty cycle, D, is shown in FIG. 8.

Almost all Maximum Power Point Tracking (MPPT) algorithms are essentially hill climbing or gradient ascent methods; however, different algorithms, as well as different implementations of them, can affect the efficiency of the system, here measured as output power compared to the maximum output power of the cell. There are many different possible MPPT algorithms that can be used. In some embodiments, the parameters of the MPPT algorithm may be optimized to maximize overall performance in the presence of noise. This technique is applicable to the cell-tracking architecture disclosed herein, but is also applicable to a conventional MPPT system with a single tracker connected to multiple cells or multiple panels. The maximum power point tracking algorithms disclosed herein may be used for any photovoltaic element including a single photovoltaic cell, a photovoltaic module having multiple cells, or a photovoltaic system having multiple modules.

2.2.1. Power Measurement in Maximum Power Point Tracking

As described in the previous sections, the cells are in series and connected to a main controller, which may keep the string current approximately constant. This means that the output power of each cell is proportional to the output voltage of each cell (the voltage on the opposite side of the converter to the cell). Thus, one only has to maximize the output voltage in order to maximize the power output. This also means that one can just use the output voltage as the output power signal in the control loop, instead of having to measure both a voltage and a current and multiply them. This simplifies the circuitry, as well as provides for better tracking, as current measurements can be significantly noisier than voltage measurements.

Also, as the output current of the converter is constant, changing D, the duty cycle of the converter, changes the current being drawn from the cell proportionally. So, for MPPT, one may change D, see how the power has changed, and then makes a decision about how to change D next. One part of measuring how the power is influenced by changing D is to take into account the "blanking time." When one changes D, the voltage at the output of the converter will ring before settling on a new value, due to the reactive components of the dc-dc converter, such as the output capacitor and inductor in a buck converter. So, the algorithm may wait until the ringing damps out significantly before starting to average the values at the output of the converter. The settling time will be similar after every change in D, so one can set a blanking time that is long enough and use that every time, for example.

2.2.2. Simple Perturb and Observe

As discussed above, controller 78 may implement a MPPT algorithm to control power converter 77 such that an individual photovoltaic cell operates at or near its maximum power point.

The most basic MPPT algorithm is called perturb and observe. The algorithm is $$D[k+1] = D[k] + \Delta D sgn\left(\frac{P[k] - P[k-1]}{D[k] - D[k-1]}\right), \quad (1)$$

where D is the duty cycle, P is power output, and ΔD is the amount to change D each time. Essentially, one changes D, sees if the power increases or decreases, changes D in the same direction if the power went up, or changes D in the opposite direction if the power went down. The algorithm is commonly used because of its simplicity and because it can, if implemented correctly, provide very good efficiency. Of course, the choice of ΔD and ΔT, the time period between decisions, involves a lot of trade-offs, including, most importantly, slew rate and steady state efficiency. These trade-offs cannot be properly weighed without considering the effect of noise in the power measurement will have on them, and this is what is analyzed in Section 5 (Performance of Photovoltaic Maximum Power Point Tracking Algorithms in the Presence of Noise). Essentially, through the use of probability and Markov chains, one can determine the optimum ΔD and ΔT which will yield the greatest steady state efficiency for a given desired slew rate.

2.2.3. Simple Perturb and Observe with Forced Oscillation

Another MPPT algorithm that may be used, according to some embodiments, is a modified perturb and observe algorithm, where a constant perturbation of alternating sign is added on top of the changes in D. This algorithm is $$D[k+1] = D[k] + \Delta D_p (-1)^k + \Delta D sgn\left(\frac{P[k] - P[k-1]}{D[k] - D[k-1]}\right), \quad (2)$$

where $\Delta D_p$ is a constant perturbation added to the changes in D. This algorithm has the ability to mitigate a lot of the effects of noise in the power measurement by taking larger steps. The analysis for determining the efficiency of this algorithm is essentially the same as for the simple perturb and observe, and the performance and trends of this algorithm can be seen in FIG. 9, where ΔD and $\Delta D_p$ have been swept while slew rate and noise have been kept constant. For very small perturbations, small $\Delta D_p$, one essentially has the simple perturb and observe algorithm, where the optimal ΔD is around 0.01 for the given noise level and slew rate. Larger values lead to more loss from bouncing around the maximum power point (MPP), and smaller values lead to more loss from wandering around due to noise. It is clear from FIG. 9 that the optimal value of ΔD for this algorithm is the smallest one can go with; the limit on this is the frequency one can run their control algorithm at, as decreasing ΔD means increasing the frequency in order to keep the slew rate constant. One limit that can be included that causes the surface in FIG. 8 to eventually decrease as one decreases ΔD is to add the blanking time of the system into the calculation, though the likelihood of that coming into play before other frequency limiting factors in ones system is fairly low.

Figure 10:
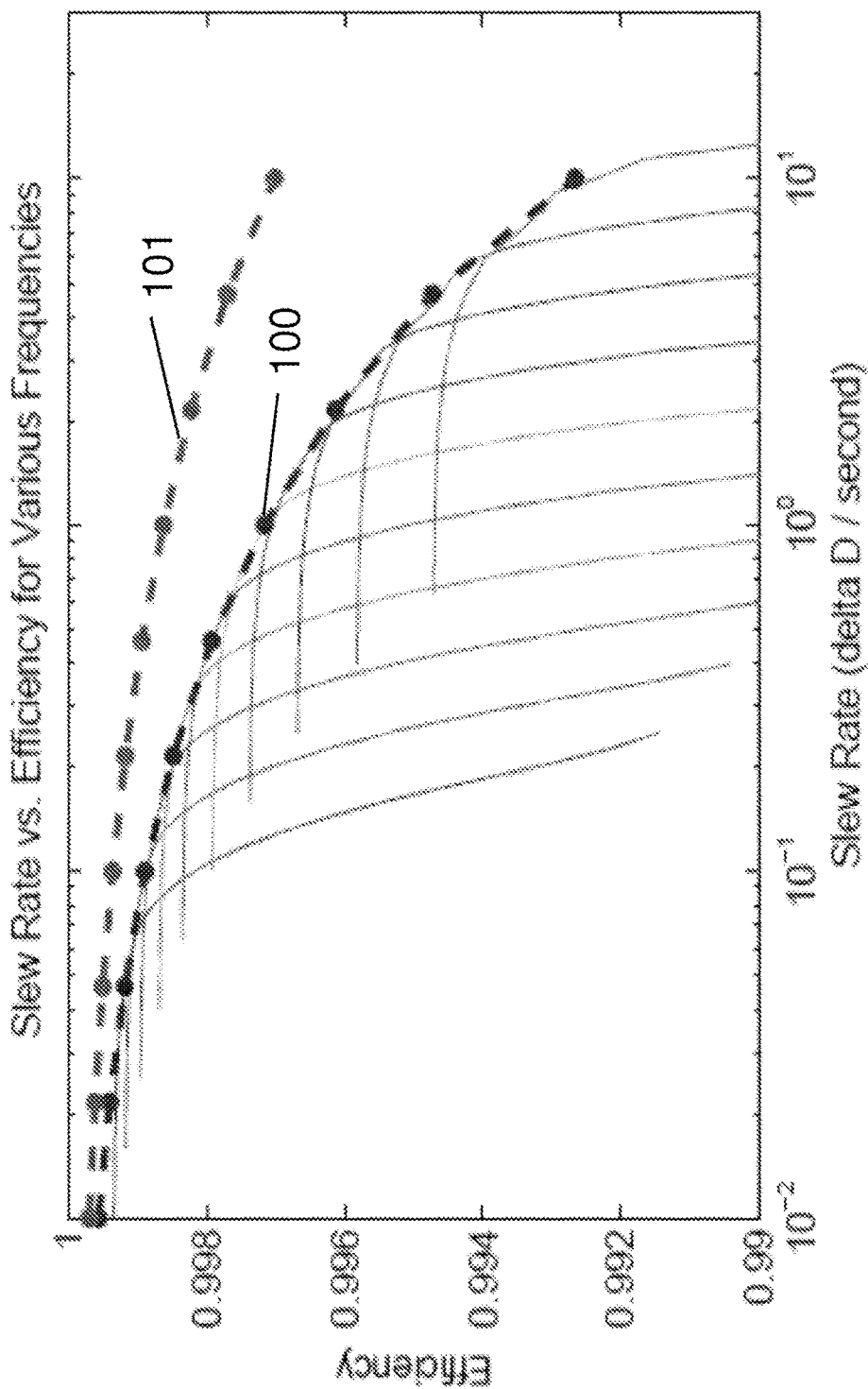
FIG. 10 shows a plot of efficiency vs. slew rate for a given noise level for the conventional perturb and observe method, and for the perturb and observe method with added forced oscillations.

Two things can be taken from this analysis. For one, when using this algorithm, one may use the smallest value of ΔD possible and then optimize $\Delta D_p$ for the given amount of noise, using the given analysis technique. Secondly, this algorithm is capable of achieving higher steady state efficiency than the simple perturb and observe method for a given slew rate and noise, and this can be seen in FIG. 10. Curve 100 shows the maximum possible efficiency that can be obtained using the perturb and observe method. Curve 101 shows the maximum possible efficiency using the perturb and observe method with an added forced oscillation and a minimum ΔD of 0.001.

2.2.4. MPPT Analog Implementation

Figure 11:
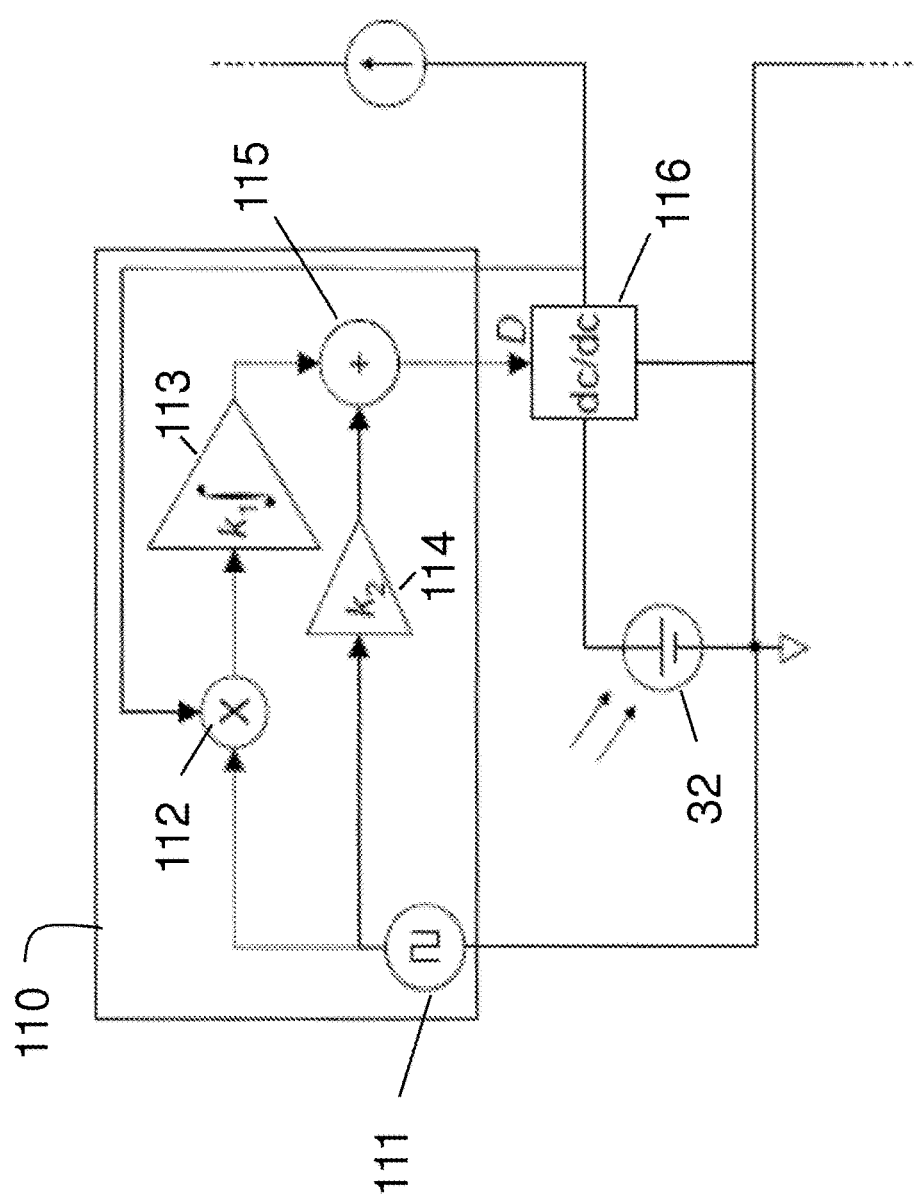
FIG. 11 shows a block diagram of an analog controller that implements a MPPT algorithm, according to one embodiment of the present invention.

Another possible implementation of a controller 78 is the analog circuit 110 shown in FIG. 11. Circuit 110 may include an alternating signal source 111, a multiplier 112, an integrator 113, a gain stage 114 and an adder 115, as shown in FIG. 11. Circuit 110 can control the duty cycle D of the DC/DC converter 116 (e.g., of power converter 77) so that cell 32 operates at approximately its maximum power point.

Using the analog circuit 110, one may add a constant perturbation to the duty cycle of the converter, which results in perturbations in the output voltage. The perturbations will be in phase if the slope of the Power vs. D curve is positive and 180 degrees out of phase if the slope is negative. Multiplying the two signals and integrating to get the nominal D value will move D towards the maximum power point. For example, if D is to the left of the MPP, the perturbation in D and the output power will be in phase, meaning multiplying them will results in a positive value. Then, integrating this moves D towards the MPP.

A disadvantage of this system, which is common to just about every MPPT algorithm, is that the added perturbation results in lost efficiency, as in steady-state one oscillates around the MPP. Because of this, one might think to make the perturbation as small as possible. However, there will inherently be noise in the power measurement, and so as one makes the perturbation size smaller, the signal to noise ratio goes up, which will result in oscillations around the MPP due to noise. So, similar to the methods above, one can balance these two effects in order to come up with the optimum perturbation size. The analysis for this, including how to optimize the perturbation size, is provided in the attached Section 4 (Optimization of a Continuous-Time Maximum Power Point Tracking Algorithm in the Presence of Noise).

2.2.5. Discrete-Time MPPT with Forced Oscillation and Linear Control

An analagous system to that described in Section 2.2.4 can be implemented digitally. The update equation for the duty cycle, D, will be $$D[n]=D[n-1]+P_d(-1)^n-G(mD[n-1]+e[n]), \quad (3)$$

where $P_d$ is the perturbation amplitude, G is the gain, m is the slope of the power vs. D curve, which is the same as the m in the digest for the analogue system, though here, it is the absolute value of the slope. This means that, $$mD[n-1] = \frac{dP}{dD},$$

and e[n] is the noise in the slope measurement.

Figure 12:
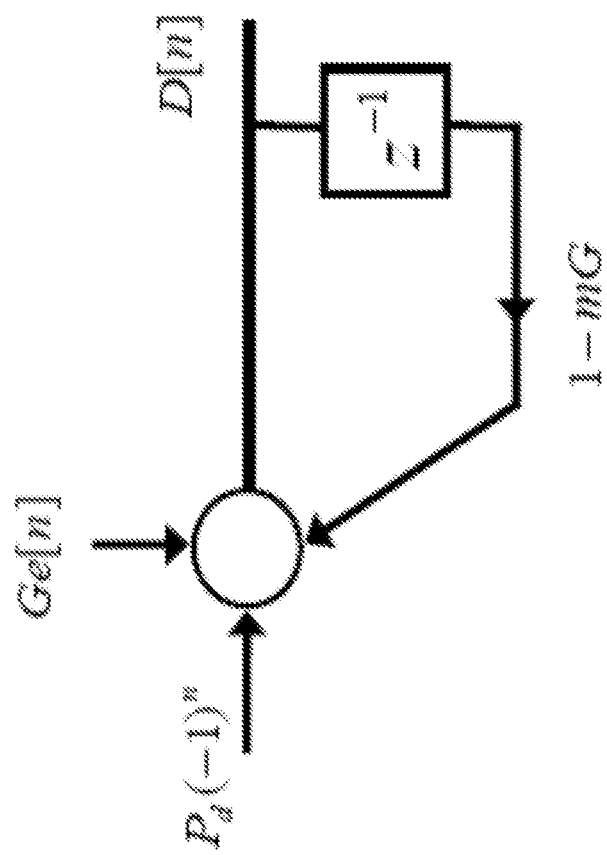
FIG. 12 shows a discrete time system model for a discrete algorithm implementing a MPPT algorithm, according to one embodiment of the present invention.

Again, as one makes the perturbation size, $P_d$, smaller, the deviations in the duty cycle from the MPP due to the forced oscillations will decrease, but the deviations due to the noise in the power measurement will increase. The analysis for determining the optimum size of the perturbation is very similar to the one for the analogue case. From the system model shown in FIG. 12, we see that one can analyze the effect of the noise and forced oscillation on D separately, sum the two to get the total oscillation in D, and set the derivative of this with respect to $P_d$ to zero in order to find the optimum perturbation size. The only difference is that discrete time noise analysis techniques is used. The calculations are given below.

First, analyze noise effect by taking the perturbation out of (3), resulting in $$D[n]=(1-Gm)D[n-1]+Ge[n]. \quad (4)$$

Shift by k and multiply by D[n] to get $$D[n]D[n+k]=(1-Gm)D[n]D[n+k-1]+GD[n]e[n+k]. \quad (5)$$

Then, taking the expected value of both sides, assuming all variables to be real and zero mean, results in $$\gamma_{DD}[k] = (1-Gm)\gamma_{DD}[k-1] + G \cdot E\{D[n]e[n+k]\}. \quad (6)$$

which becomes $$\gamma_{DD}[k] = (1-Gm)\gamma_{DD}[k-1] + G^2 \sigma_e^2 \delta[k], \quad (7)$$

where $\sigma_e^2$ is the variance of the white noise process. Solving for $\gamma_{DD}[k]$ yields, $$\gamma_{DD}[k] = \frac{G^2 \sigma_e^2}{1-(-1+Gm)^2}(1-Gm)^{|k|} \quad (8)$$

Then, the variance in D will be where k is zero, so $$\sigma_D^2 = \frac{G^2 \sigma_e^2}{1-(-1+Gm)^2}. \quad (9)$$

The variance of the noise, $\sigma_e^2$, will be related to the noise in the power measurement, $P_N$, as well as the size of the perturbation, $P_d$. The estimated slope will be $$\frac{\hat{\partial}P}{dD} = \frac{P[n]-P[n-1]+\sqrt{2}\,P_N}{D[n]-D[n-1]} \cong \frac{dP}{dD} + \frac{\sqrt{2}\,P_N}{P_d}, \quad (10)$$

where the second equality holds as long as the gain is small in comparison to the perturbation size, meaning that each step in D is dominated by the perturbation. Also, the $\sqrt{2}$ comes from noise being in both measurements of the power. Based on this, $$\sigma_e^2 = \frac{2P_N^2}{P_d^2 \Delta t}, \quad (11)$$

where $\Delta t$ is the period of the sampler, and the division comes from integrating the signal over that period for each sample. So, plugging (11) into (9) yields $$\sigma_D^2 = D_{rms}^2 = \frac{G^2 2 P_N^2}{(P_d^2 \Delta t)(1-(-1+Gm)^2)}, \quad (12)$$

which simplifies to $$D_{rms}^2 = \frac{2GP_N^2}{P_d^2 \Delta t m(2-Gm)}. \quad (13)$$

Then, the power loss due to the noise is $D_{rms}^2 I_{load}^2 R_{cell}$.

Next, the power loss due to the perturbation is found. This is done by recognizing that the closed-loop transfer function from perturbation to D in FIG. 11 is $$\frac{1}{1+(1-mG)z^{-1}}, \quad (14)$$

meaning that the steady-state variation in D due to the forced perturbation will be $$D_{rms}^2 = \left(\frac{(-1)^n P_d}{1+(1-mG)}\right)^2 = \frac{P_d^2}{(2-mG)^2}. \quad (15)$$

So, total power loss is $$P_{loss} = \left[\frac{2GP_N^2}{P_d^2 \Delta t m(2-Gm)} + \frac{P_d^2}{(2-mG)^2}\right] I_{load}^2 R_{cell}, \quad (16)$$

which can be expressed as $$P_{loss} = \left[\frac{C_1}{P_d^2} + \frac{P_d^2}{C_2}\right] I_{load}^2 R_{cell}. \quad (17)$$

Taking the derivative of (17) with respect to $P_d$ and setting it to zero yields an optimal value of $$P_d = (C_1 C_2)^{(\frac{1}{4})},$$

which results in the power loss being $$P_{loss} = \left(2\sqrt{\frac{C_1}{C_2}}\right) I_{load}^2 R_{cell}. \quad (18)$$

2.3. Circuit Topologies

As discussed above, the implementation of the architecture shown in FIG. 7b uses cell converters based on a synchronous buck power stage topology. This topology is both simple and effective in this application, and provides low voltage stress and high efficiency. Other topologies are also possible and have advantages in some implementations.

A first consideration for the cell converter topology is that it should be able to modulate the cell current between zero and a value sufficient for MPP operation. It is also desirable that the topology be well adapted for current-source loading (for string connection) and that complete dc bypass be achievable without requiring continuous modulation (e.g., for the case of a broken or fully-shaded cell). While the synchronous buck topology shown in FIG. 7b meets this requirement, a synchronous boost topology would have the disadvantage that it can only provide cell currents greater than the string current. However, depending on the implementation, a buck topology, boost topology, or other power converter topology can be suitable for implementing power converter 77.

A second consideration relates to filtering. Solar cells mounted in an array typically exhibit capacitance to ground (e.g., owing to PV cell structure and mounting). It is therefore desirable to configure the cell converter to suppress common-mode switching currents to ground. Topologies with output inductors are useful in this regard, as the interconnect inductance can help accomplish this. Moreover, coupling between the top and bottom inductances of each cell in FIG. 2 could be used to further suppress common-mode currents through parasitic capacitances.

A third consideration is that the topology selected should be suitable for maintaining acceptable stresses on the low-voltage CMOS switches across the whole required operating range. In the synchronous buck topology used in FIG. 7b, this can be achieved as long as the CMOS switch voltage ratings exceed the open circuit cell voltage. CMOS switch voltage ratings in typical processes (e.g., 1.2 V at 90 nm and 1.8 V at 180 nm) are more than adequate for single-junction solar cells in this topology. In topologies imposing higher switch voltage stress, "stacking" two switches (e.g., with a "cascode"' switch connection) can be used to double the achievable blocking voltage.

Because individual solar cells operate at very low voltage (typ. <0.7 V), one may typically stack a large number of cells in series in order to realize the high voltages desired for efficient interface to the grid and for buffering of energy. While the synchronous buck topology is extremely simple and very effective in this application, it does not contribute any voltage gain which would reduce the number of "controlled cells" that need to be series connected. It is therefore of interest to consider alternative cell converter topologies that can provide voltage gain and/or other desirable attributes. Numerous topologies for the architecture of FIG. 7a are possible.

Figure 13:
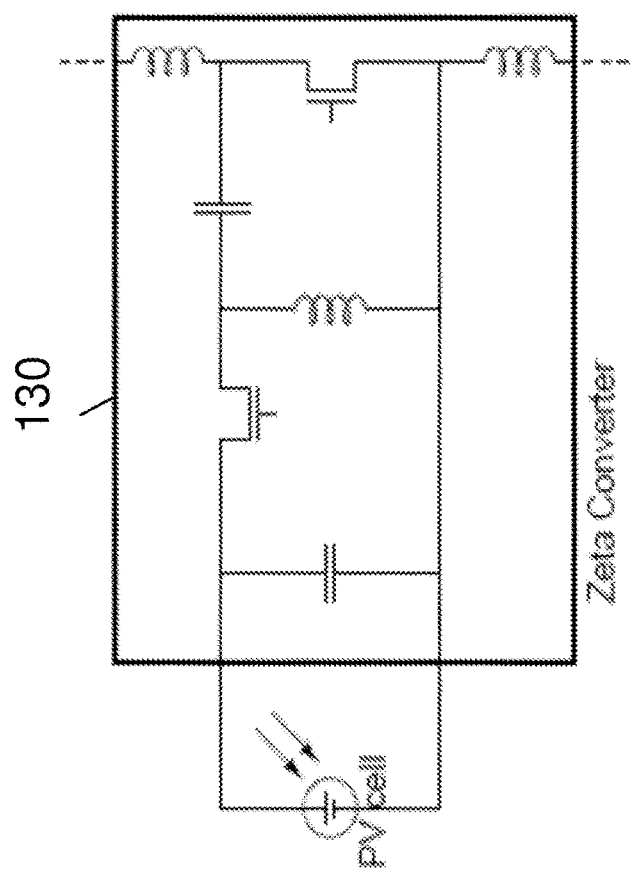
FIG. 13 shows a zeta converter that may be used to implement the power converter portion of the MPP controller of FIG. 7c, according to one embodiment of the present invention.

Four examples of topologies that provide voltage gain and can also accommodate cell currents ranging down to zero while maintaining constant string current are the zeta converter 130 (shown in FIG. 13), the Cuk converter, the SEPIC converter, and the buck-boost converter. These topologies may require higher ratings and/or greater numbers of passive components, and have higher switch stresses than the synchronous buck topology. At the same time, the voltage gain (from cell to output) means that, with appropriate CMOS switch realization, the number of cells that need to be stacked in series might be reduced by a factor of three or more as compared to a conventional PV array. The zeta, Cuk, and SEPIC converters also provide inherent dc blocking, which could be of use for isolating failed cells, for example.

3. System Advantages

The inventive architecture is compatible with the use of efficient, centralized grid-tie inverter systems, and may can reverse the trend towards inefficient and expensive module-level grid-tie inverters. Moreover, the system provides many benefits in terms of increased power yield, reduced cost, and improved reliability and flexibility. Here we discuss some of these benefits.

3.1. Increased Power Yield

Because the system can extract the maximum possible power from each cell, the total power yield is greater than that of conventional systems, whose output power is limited by the weakest cell. In installations where partial shading is common (e.g. building-integrated PV systems and residential installations) the resulting increase in power yields will be the most dramatic. However, power yield also increases for PV installations where shading is not a big concern, since the total output power with the system is not limited by cell-mismatch, differential aging, and temperature variation, all of which reduce the power yield of systems used today. Another aspect that increases the power yield is the ability to use a central, high-voltage, high-power converter which can be made more efficient than many smaller converters. The reduced power processing losses thus contributes to an additional increase in power yield.

3.2. Reduced Cost

In exemplary implementations, the system decreases the cost of both manufacturing and installation of PV systems.

With respect to manufacturing costs, in order to obtain maximum power output per module, today's PV manufacturers take great care to place matching cells (with identical electrical characteristics) in each module. Each cell is measured and sorted into matching performance bins, and various algorithms are used to determine which cells are combined into a module. With the system of cell-based MPPT, cells with different electrical characteristics can be placed on the same module without the adverse effects on efficiency seen today. This eliminates the costly and time-consuming cell measurement and sorting techniques used by PV manufacturers today, and leads to more streamlined batch manufacturing. Although more MPPTs are used in the new system compared to module or string-based tracking, the fact that the cell-based MPPTs may all be implemented in an inexpensive CMOS process can lead to reduced system cost. By leveraging the cost advantages associated with batch manufacturing of chip-level converters the total cost is reduced considerably.

In addition, the system can substantially reduce the manufacturing cost of thin-film photovoltaic modules (e.g. amorphous silicon, cadmium telluride and copper indium gallium diselenide). These PV technologies are being pursued because of their material costs potentially much lower than those of crystalline silicon. Thin-film modules are typically manufactured by depositing a thin layer of material onto a large area substrate. The panel is then scribed by a laser, which electrically separates the different parts of the panel into smaller cells. To produce a useful output voltage the cells are connected in series. Thus, for thin-film modules, there is no way to sort the cells by performance and accomplish current matching similar to that of crystalline modules. Therefore, in thin-film manufacturing, much care has to be taken to produce a very uniform deposition of material, which leads to increased cost and complexity. The system described here enables each cell to contribute its maximum achievable power, regardless of its performance relative to neighboring cells. Therefore, a thin-film panel using the architecture described herein can be manufactured with less stringent uniformity requirements, which leads to reduced manufacturing cost.

With respect to installation costs, because of the severe reduction in output power due to partial shading of PV modules, much care is typically taken at the time of installation to locate and orient the modules in a system to minimize the negative effects of shading. In addition to long-term solar irradiation measurements, software can sometimes be used to achieve the optimum placement of PV modules. Since partial shading does not have the same detrimental effect on output power in the present system, less time and effort need to be spent on achieving the optimum configuration of modules. The increased flexibility offered by the cell-based MPPT can greatly simplify the planning and installation process of building-integrated PV systems. Today, it is possible to choose the most favorable sites for PV installations. However, the ability to utilize other sites, such as those that have partial shading, is another advantage of the present system.

3.3. Improved Reliability/Lifetime

The poor lifetime of electrolytic capacitors used in the power processing equipment (MPPT and inverter) is one of the limiting reliability factors of PV systems. This is of particular concern for installations that employ per-module tracking (e.g., FIG. 5c), as these converters are typically attached to the individual modules, where they are exposed to the harsh outdoor environment (in particular solar heating) which can drastically reduce their lifetime. To maintain adequate reliability and lifetime, expensive enclosures rated for outdoor use need to be used for each converter. In contrast, the single-cell MPPT enables the use of a central inverter stage which can be located in an easily accessible indoor environment.

The cell-based MPPT converters themselves may switch at frequencies high enough (e.g., hundreds of kHz (e.g., 500 kHz) to hundreds of megahertz (e.g., 100 MHz or higher) that no electrolytic capacitors are needed (and at very high frequencies, all capacitors can be on the MPPT IC die) thereby improving the MPPT reliability. Another benefit of integrating the entire functionality of an MPPT on chip is that the semiconductor die can be protected and enclosed by the chip packaging used in a typical integrated process. Furthermore, these converters can be installed at the time of manufacturing of the panel, and they can therefore be protected by the same encapsulating material that shields the PV cells from environmental damage.

In some embodiments, the system is designed such that in the case where one of the converters fails, the total system output is only reduced by the power of one cell. This compares favorably to conventional approaches, where an MPPT failure results in the loss of an entire module (module converter) or of a string of modules (string converter).

Finally, the usable lifetime of a PV installation can be increased with the new system. Over time, the solar cell electrical characteristics change due to, among other things, degradation of encapsulation material from ultraviolet light. It has been shown that cells age at different rates, leading to an increased cell mismatch over the lifetime of the PV system. In a conventional PV installation the cell that degrades the fastest limits the total system output power, leading to a system rate of degradation that is faster than that of the average cell. With the inventive system the lifetime of the PV system can be drastically increased, since degradation of individual cells has a relatively small impact on overall power output.

4. Optimization of a Continuous-Time Maximum Power Point Tracking Algorithm in the Presence of Noise This section introduces an analysis of the effect of noise on a continuous-time maximum power point tracking (MPPT) algorithm for photovoltaic systems, leading to an optimization of the system parameters. The results of this are then compared to discrete-time algorithms. This analysis provides a better understanding of how noise affects the performance of MPPT algorithms and how well those affects can be mitigated, and enables improvements in efficiency.

4.1. Introduction

Maximum power point tracking (MPPT) has become a standard technique for high-performance photovoltaic systems. An intelligent controller adjusts the voltage, current, or impedance seen by a solar array until the operating point that provides maximum power for the connected array in the present temperature and insolation conditions is found. There is a large body of literature describing MPPT control techniques. Although the established techniques are routinely implemented in industry, publication on the topic continues to accelerate, with dozens of publications per year in the last decade, in part because of the importance of getting the best possible output from an expensive solar array.

Key metrics for an MPPT algorithm include tracking speed and accuracy, as is discussed extensively in the literature. However, the fundamental constraint on tracking accuracy is often the effect of noise in the measurement on the behavior of the tracking algorithm. Noise can also affect tracking speed in some cases. Standard tracking algorithms involve directly or indirectly introducing a periodic perturbation in the operating point in order to measure the slope of some characteristic. This perturbation reduces the power obtained from the solar panel because the panel is no longer operated consistently at the maximum power point, even if the algorithm has successfully found that point. This provides an incentive to reduce the size of the perturbation. However, as the size of the perturbation is reduced, the signal-to-noise ratio in the measurement of the slope is degraded. Thus, noise fundamentally limits the performance. This is particularly important in methods that require a current measurement, as some current measurement methods (e.g., Hall-effect transducers) are inherently noisy, and the use of a sense resistor entails a tradeoff between signal-to-noise ratio in the measurement and power loss in the resistor.

The importance of noise is acknowledged in a subset of the literature on MPPT and is sometimes used to motivate particular algorithms or hardware configurations but with very few exceptions, the impact of the noise is not analyzed quantitatively. In this section, we develop a quantitative analysis of the impact of noise on a continuous-time maximum power point tracking system as well as its discrete counterpart and determine optimum system parameters based on this analysis.

4.2. MPPT System

The continuous-time MPPT system considered here would be classified as a forced oscillation method or as a version of ripple correlation control. The system, shown in FIG. 14, includes a solar panel connected to a load through a buck DC/DC converter, allowing one to change the operating point of the panel by changing D, the duty cycle of the converter. The output load of this system is a constant current load, and so D controls the current being drawn from the cell. A similar analysis could be done for constant voltage or resistive loads. As a result of this, one gets power vs. D curves similar to the one shown in FIG. 8. The MPPT algorithm is implemented by adding a perturbation, d sin (ωt), to the duty cycle and multiplying the measured power by the perturbation in order to measure dP/dD, the slope of the power vs. D curve. This is then scaled and integrated to produce the dc value of D, moving D toward the maximum power point (MPP).

4.3. Noise Analysis

Figure 14:
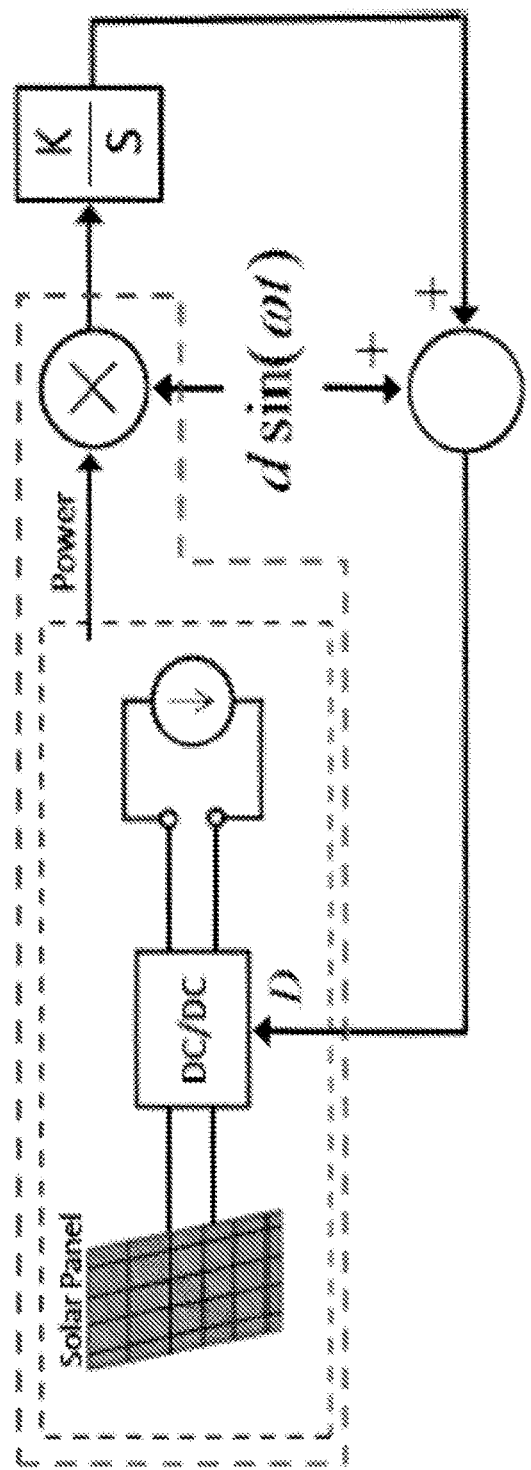
FIG. 14 shows a maximum power point tracking system, according to one embodiment of the present invention.
Figure 15:
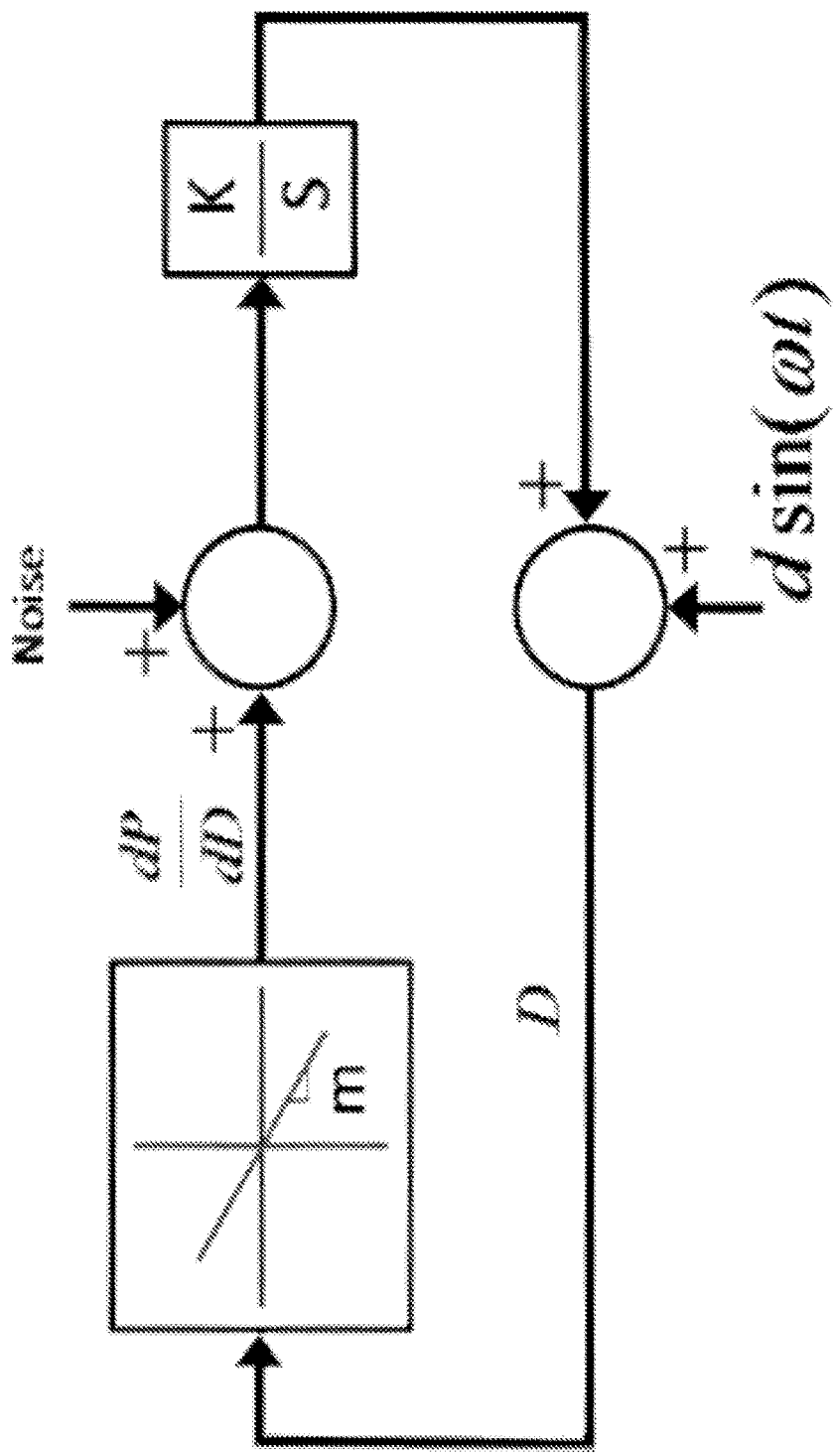
FIG. 15 shows a model for the system shown in FIG. 14.

The MPPT implementation, FIG. 14, can be modeled by the system shown in FIG. 15. This is arrived at by deriving a model for what is within the dashed box in FIG. 14. It is assumed that this is a simple, static, ideal measurement, where D goes in and dP/dD comes out, which is valid as long as ω is slow compared to the dynamics of the power converter circuit. As the power vs. D curve can be approximated as a quadratic near the MPP, dP/dD vs. D can be approximated by a linear function with a negative slope, m, shown in FIG. 15. However, dP/dD will have noise in it, due to the noise in the power measurement, which is assumed to be Gaussian white noise, and so noise is added to dP/dD in FIG. 15. This linear model provides a simple means of analyzing the effect of noise on the system, as one can derive the closed loop transfer function from noise input to estimated slope, $$H(s) = \frac{m \cdot k}{s - m \cdot k}. \quad (1)$$

We evaluate steady-state tracking performance by calculating power loss, which, here, means the difference in output power compared to if one were to operate perfectly at the MPP. Power loss will be the result of deviations from the MPP due to both noise induced tracking errors, as well as the forced perturbation in D. The perturbation amplitude, d, will affect both types of deviations. A larger perturbation amplitude will directly degrade performance by moving the operation away from the MPP, but will improve the signal to noise ratio, minimizing noise induced deviations. A small perturbation will decrease the direct effect but will increase the noise-induced loss. Thus, d should be chosen to minimize the sum of the losses resulting from both types of deviations.

The power loss resulting directly from the perturbation will be $$P_P = \frac{d^2}{2} I_{load}^2 R_{panel},$$

where $I_{load}$ is the load current and $R_{panel}$ is the small-signal resistance of the panel at the MPP and is equal to $V_{mpp}/I_{mpp}$. This comes from the rms value of the sinewave perturbation being $d/\sqrt{2}$, which results in a $$\frac{d}{\sqrt{2}} I_{load}$$

rms perturbation in the panel current. However, due to the feedback, the actual rms sinewave perturbation will be $$\frac{d}{\sqrt{2}} \frac{\omega}{\sqrt{\omega^2 + (mk)^2}},$$

which simplifies to $d/\sqrt{2}$ for $\omega \gg |mk|$, which will be assumed for the remainder of the section but is a simple substitution for cases where this assumption does not hold.

The power loss due to the noise results from how the slope of the power vs. D curve, dP/dD, is found. The slope is determined by multiplying D by measured power, $$P_{measured} = P_0 + \frac{dP}{dD} d\sin(\omega t) + P_n,$$

which is a sum of the nominal power, perturbation in the power, and noise in the power measurement. Multiplying the two yields an expression for the estimated slope of the power vs. D curve, $$\frac{dP}{dD} = \frac{P_0}{d/2} \sin(\omega t) + \frac{\frac{dP}{dD} d\sin^2(\omega t) + P_n \sin(\omega t)}{(d/2)}. \quad (2)$$

Here, the first term drops out due to the average of $\sin(\omega t)$ equaling zero, and the second term goes to $$\frac{dP}{dD},$$

as the average of $\sin^2(\omega t)$ is $$\frac{1}{2}. \text{ So, } \frac{dP}{dD} = \frac{dP}{dD} + 2P_n \sin(\omega t)/d,$$

meaning the noise in the slope measurement is $2P_n \sin(\omega t)/d$. Here, if $\omega$ is not much greater than $|mk|$, then d in this term must be replaced with $$\frac{d \cdot \omega}{\sqrt{\omega^2 + (mk)^2}}.$$

As $2P_n/d$ is white noise with variance $4P_n^2/d^2$ and sine has a variance of $\frac{1}{2}$, the variance of the noise in the slope measurement is the two variances multiplied together (as both have a mean of 0), which is $2(P_n/d)^2$. From the variance of the noise, we can calculate the rms amplitude of the noise-induced perturbation in duty cycle. First, as the transfer function from the noise to $$D \text{ is } \frac{k}{s - mk},$$

the noise equivalent bandwidth is, $B_N = |m|k/4$, and the power gain is, $g = 1/m^2$. Then, the variance in D due to the noise will be the variance of the noise times $2gB_N$, which results in $$D_{rms}^2 = \frac{P_n^2 k}{|m| d^2}. \quad (3)$$

From $D_{rms}$, we can calculate the power lost due to the noise as $P_N = D_{rms}^2 I_{load}^2 R_{panel}$, or $P_N = (C^2/d^2) I_{load}^2 R_{panel}$, where, $C^2 = P_n^2 k/(|m|)$.

Thus, the total power loss is $$P_{loss} = P_N + P_P = \left(\frac{d^2}{2} + \frac{C^2}{d^2}\right) I_{load}^2 R_{panel} \quad (4)$$

Figure 16:
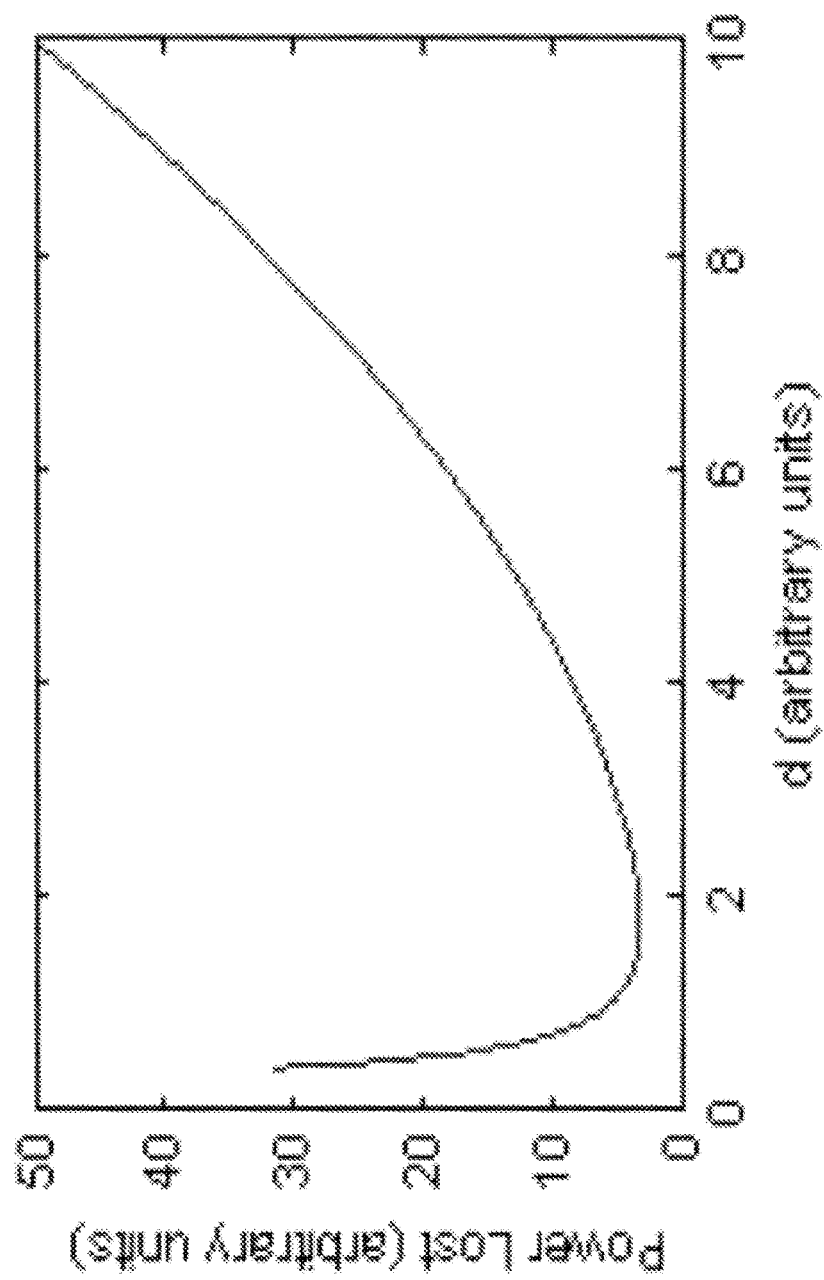
FIG. 16, shows a graph of power lost vs. the size of the perturbation used in a perturb and observe maximum power point tracking algorithm.

The shape of the power loss vs. d curve can be seen in FIG. 16. Taking the derivative of $P_{loss}$ with respect to d and solving for where the derivative is zero yields an optimal value of $d^2 = \sqrt{2}C$, where the power lost is minimized. Plugging this result back into (4) results in $$P_{loss} = \sqrt{2} C I_{load}^2 R_{panel} = P_n \sqrt{\frac{2k}{|m|}} I_{load}^2 R_{panel}. \quad (5)$$

Based on this analysis, one can optimize the perturbation magnitude, d, for a given C. However, C is a function of both the noise in the power measurement, as well as m and k, which determine the time constant of the system. One design approach is to first choose a gain, k, that yields the desired response time of the system. Then, based on the noise in the system, one is able to set d such that the power loss is minimized. If the power loss is still too great, one must then consider the trade-offs between response time and efficiency. The power loss, assuming one optimizes d, will be proportional to the square root of the response time, which can be seen in (5), where the loss is proportional to the square root of k. So, a decrease in the response rate of the system provides a smaller efficiency improvement.

Figure 17:
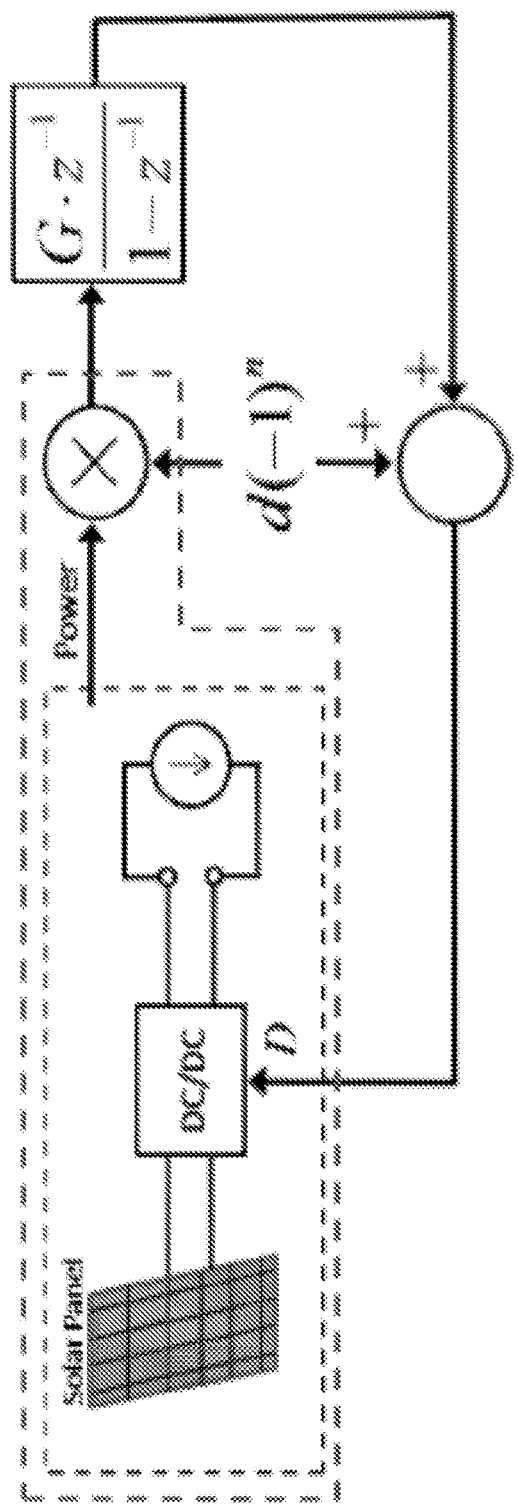
FIG. 17 shows a discrete-time system diagram for a discrete-time MPPT system.
Figure 18:
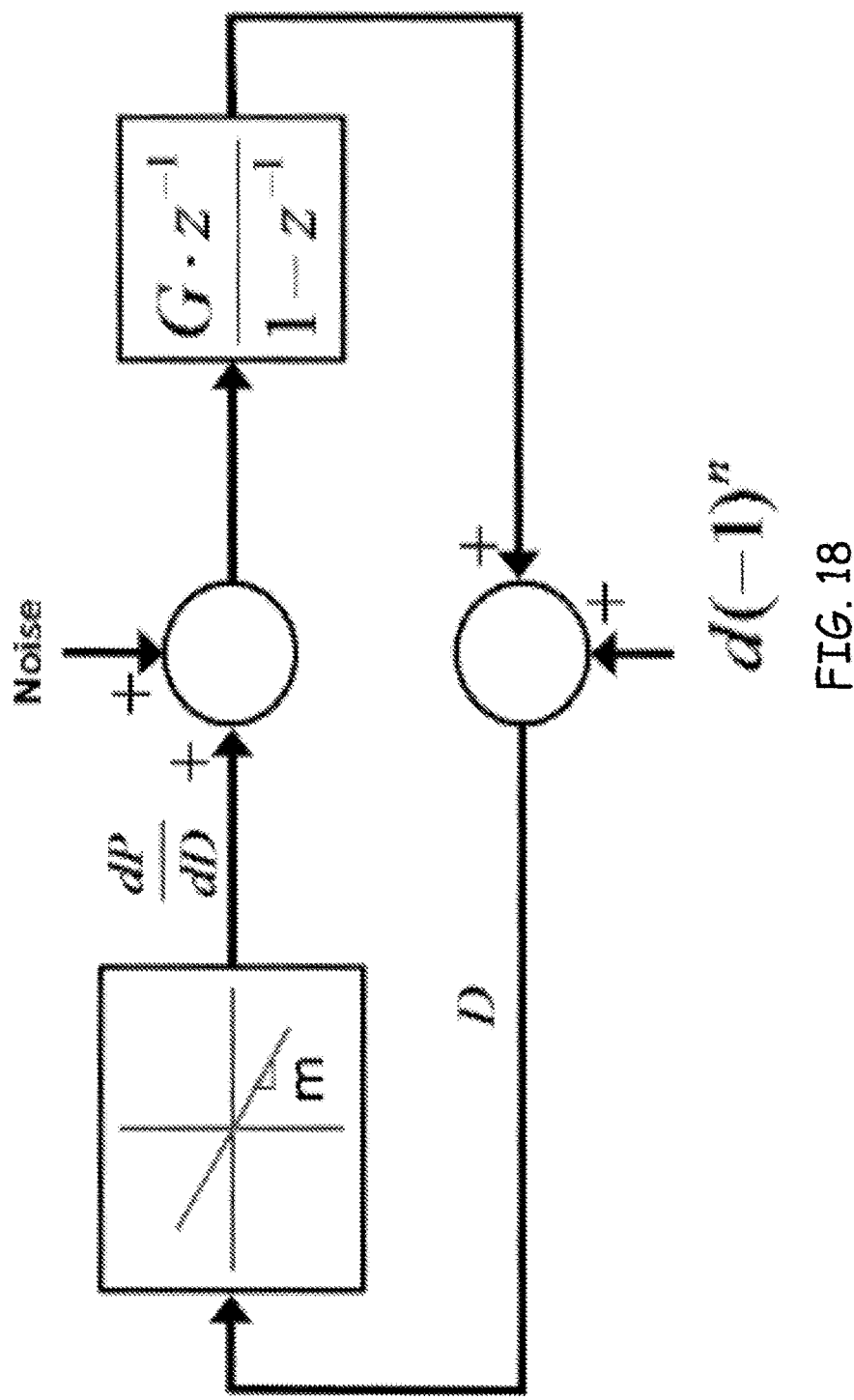
FIG. 18 shows a model of the system shown in FIG. 17.

4.4. Comparison to Discrete-Time Perturb and Observe Algorithms 4.4.1. Discrete-Time Version of Continuous-Time System The analog system described above can be implemented digitally as well. This system may be implemented as shown in FIG. 17, and it can be linearized in the same way as the analog system, resulting in the system model shown in FIG. 18. The main changes include the perturbation now being a square wave, as that is easier to implement digitally, and the integrator becoming a digital integrator $$\frac{1}{1-z^{-1}}.$$

There's also a delay, $z^{-1}$, as it takes one sample time from putting D into the system and getting the power for that D out.

Again, the power loss due to the perturbation and the noise can be considered separately and then summed. First, finding the power loss due to the perturbation is done by finding the rms of the variation in D due to the perturbation. The transfer function from the perturbation to D is $$\frac{1-z^{-1}}{1-(1+mG)z^{-1}},$$

and at z=−1, the frequency of the perturbation, the magnitude squared of this is, $$\left|\frac{D}{\text{Pertubation}}\right|^2 = \frac{4}{(2+mG)^2}.$$

So, the variation in D due to the perturbation is, $$D_{rms} = \frac{2d}{2+mG},$$

and the power loss due to the perturbation is $$P_{Pd} = D_{rms}^2 I_{load}^2 R_{panel} = \frac{4d^2}{(2+mG)^2} I_{load}^2 R_{panel}. \qquad (6)$$

Next, one can find the power loss due to the noise in the slope measurement. The transfer function from the noise to D is $$H(z) = \frac{Gz^{-1}}{1-(1+mG)z^{-1}}.$$

Then, the variance in D due to the noise is $\sigma_D^2 = \sigma_{noise}^2 (\Sigma A_k)$, where $A_k = H(z)H^*(1/z^*)(1-d_k z^{-1})|_{z=d_k}$. As $H(z)$ only has one pole, there is only one $A_k$, and it equals $$\frac{G}{-m(2+Gm)}.$$

So, the variance in D due to the noise is $$\sigma_D^2 = \sigma_{noise}^2 \frac{G}{-m(2+Gm)},$$

and now one must determine the value for $\sigma_{noise}^2$. This is done in the same way it was for the continuous-time case. The estimated slope measurement will be $$\frac{dP}{dD} = \frac{P_0}{d}(-1)^n + \frac{\frac{dP}{dD}d(-1)^{2n} + V_n(-1)^n}{d}, \qquad (7)$$

where $V_n$ is the noise in the power measurement and is $V_n = P_n/\sqrt{\Delta T}$, where $\Delta T$ is the sampling period for the A/D converter. The first term in (7) goes to zero, as the average value of $(-1)^n$ is zero. Then, the second term simplifies, as $(-1)^{2n}=1$. This results in an estimated slope measurement $$\frac{dP}{dD} = \frac{dP}{dD} + \frac{V_n(-1)^n}{d}, \qquad (8)$$

meaning that the noise in the slope measurement is $$\frac{V_n(-1)^n}{d},$$

which has a variance of $$\sigma_{noise}^2 = \frac{P_n^2}{d^2 \Delta T};$$

however, as the perturbation in D is modified by the feedback loop, d in this term should be replaced with $2d/(2+mG)$, resulting in $$\sigma_{noise}^2 = \frac{P_n^2(2+mG)^2}{4d^2 \Delta T}$$

So, the variance in D due to the noise is $$D_{rms}^2 = \frac{P_n^2 G(2+mG)}{-4d^2 \Delta T m}, \qquad (9)$$

meaning the power loss due to the noise is $$P_{Nd} = D_{rms}^2 I_{load}^2 R_{panel} = \frac{P_n^2 G(2 + mG)}{-4d^2 \Delta Tm} I_{load}^2 R_{panel}. \quad (10)$$

So, the total power loss due both the noise and perturbation is $$P_{lossd} = P_{Nd} + P_{Pd} = \left(\frac{d^2}{C_1^2} + \frac{C_2^2}{d^2}\right) I_{load}^2 R_{panel}, \quad (11)$$

where $$C_1 = \frac{2 + mG}{2} \text{ and } C_2 = \frac{P_n}{2}\sqrt{\frac{G(2 + mG)}{-m\Delta T}}.$$

Taking the derivative of (11) with respect to d and setting it equal to zero yields an optimal value of $d=\sqrt{C_1 C_2}$, which results in the total power loss being $$P_{lossd} = \frac{2C_2}{C_1} I_{load}^2 R_{panel}. \quad (12)$$

In order to compare the discrete-time system to the continuous-time one, one has to adjust the gains and integration time such that the reaction time of the two systems is comparable. In order to do this, we set $$k = \frac{G}{\Delta T}.$$

Figure 19A:
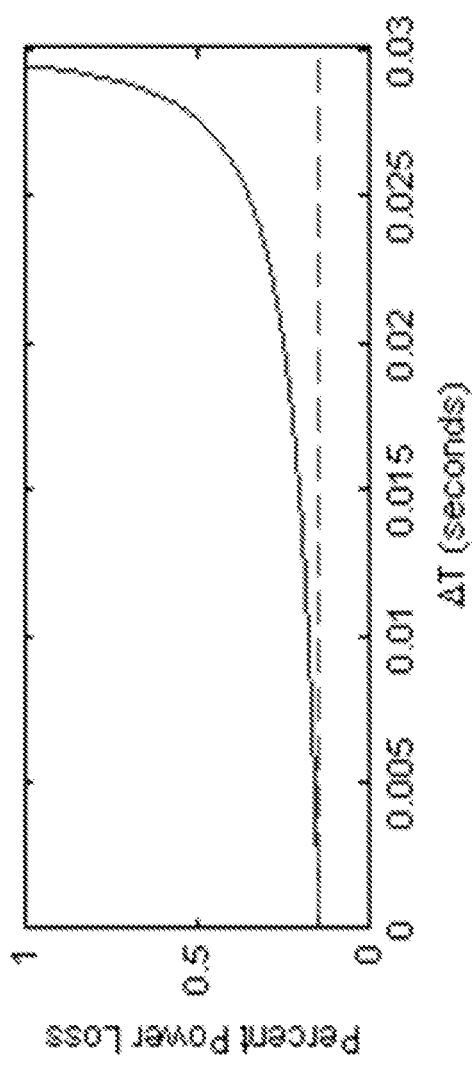
FIGS. 19a and 19b show graphs of power loss and efficiency for different period lengths used in a perturb and observe algorithm.
Figure 19B:
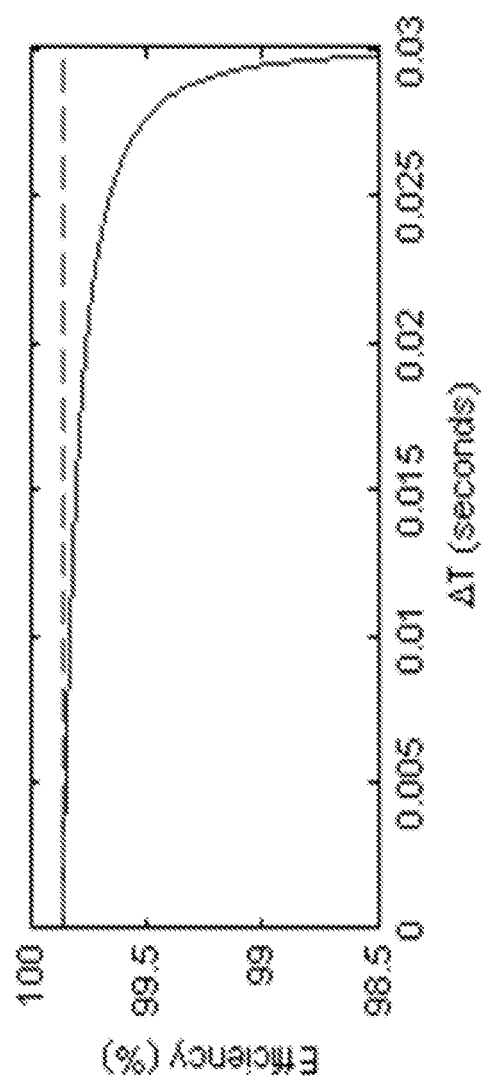

After doing this, the lowest power loss and greatest efficiency possible for the two systems over the range of stable G values was calculated and is shown in FIGS. 19a and 19b. The dashed line shows the performance of the continuous-time system and the solid line shows the performance of the discrete-time system.

As one would expect, the discrete-time system approximates the continuous-time system as $\Delta T$ approaches zero. Ultimately, both the discrete and continuous time systems perform similarly in the presence of noise.

4.4.2. Simple Perturb & Observe and Perturb & Observe with Forced Oscillation

Another commonly used MPPT algorithm is the simple perturb and observe. Here, one changes D by a set amount, $\Delta D$, each time period, $\Delta T$. If the output power goes up from one time step to the next, one continues to change D in the same direction; if the power goes down, one changes D in the opposite direction. This leads to a steady state oscillation around the MPP. Due to the non-linearity of this system, one cannot simply apply a similar analysis as above for determining the effect of noise. Instead, one can use probabalistic methods.

Also analyzed is an algorithm which adds a square wave perturbation, or forced oscillation, to the normal perturb and observe algorithm. This algorithm is able to use a small $\Delta D$, meaning one is able to operate very close to the MPP, while also reducing the effect of noise by having the extra added perturbation to overcome it. As discussed above, FIG. 9 shows the efficiency of these algorithms for given step sizes, $\Delta D$, and perturbation sizes, $\Delta D_p$, for a fixed slew rate and noise. The simple perturb and observe algorithm is represented by the line where $\Delta D_p = 0$, and it is easy to see that there is an optimum $\Delta D$ for this algorithm where the losses from moving around due to the noise and due to the step size sum to a minimum. Then, the optimum parameters for the perturb and observe with forced oscillation algorithm are to have a very small $\Delta D$ paired with a $\Delta D_p$ which balances the power loss due to noise and perturbation.

Figure 20:
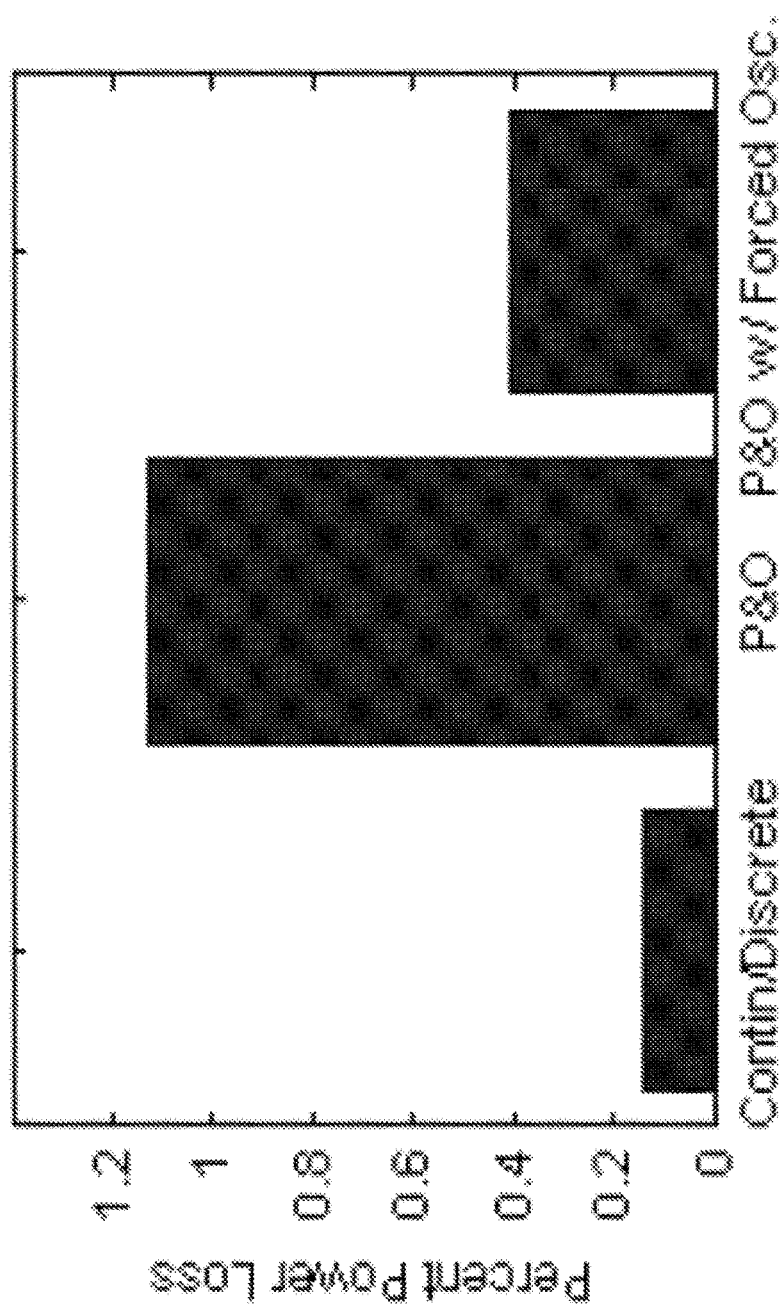
FIG. 20 show a bar graph of the percent power lost for different power optimization algorithms.

In order to compare these algorithms to the continuous-time system, one may both normalize the noise being added to each, as well as come up with a reasonable way of making the systems have similar reaction times. Normalizing the noise is simple; the noise constant, k corresponds the noise constant, $P_n$, here. As for the systems having similar reaction times, this is more problematic, as one system has a time constant; whereas, the other has a slew rate defined as $s_r = \Delta D/\Delta T_{p\&o}$. A simplistic way of solving this is to say that $s_r = \Delta D/\Delta T_{p\&o} = cG/\Delta T$, where c is a constant. Then, one can experimentally find values of c for which the two systems take the same amount of time to go from one D value to another. c will be different for different steps in D, but averaging the experimentally found values of c over a few different steps in D provides a reasonable approximation for making the systems have similar reaction rates. The value of c found was 0.28. Using this, along with a noise constant of $1.25 \times 10^{-4}$ and slew rate of 1, the maximum efficiency of the continuous-time, as well as discrete time, system was 99.9718%. The maximum efficiency of the perturb and observe algorithm was found to be 99.716%, and the maximum efficiency of the perturb and observe with forced oscillation was found to be 99.863%. As these are all pretty close, more noise was added to the systems in order to widen the gap between them. Increasing the noise constant to $6.25 \times 10^{-4}$ resulted in efficiencies of 99.859%, 99.592%, and 98.875%, respectively. These results are summarized in FIG. 20.

4.5. Simulation Results

A simulation of the discrete-time system presented here was done in order to see how well the analysis of the continuous and discrete time systems approximates the true system. The simulation was done in MATLAB, and the algorithm was run on a single solar cell, which was modeled as a current source in parallel with a diode. The system setup modeled is that of FIG. 17. As the load is a constant current source, the load side, or output, voltage is used as the power signal, as it is proportional to the power coming from the cell. For each D value, the output voltage is calculated, using the model for the solar cell and given string current; this assumes that the frequency of the converter is much greater than the frequency of the perturbation and MPPT loop, which is often the case and was assumed in the analysis. Then, Gaussian white noise with variance $\sigma_{noise}^2 = P_n^2/\Delta T$ is added to the voltage signal before passing it to the MPPT algorithm, which determines the new D value to run the converter with. Then, once the system reaches steady state and is there for a considerable amount of time, the efficiency is calculated as the average power at steady state over the power at the MPP.

In order to predict the optimum perturbation size and power loss, the curvature of the output voltage to D was estimated to be m=−18.65. Then, for a frequency of 35.7 kHz and gain of $G=10^{-4}$, the optimum perturbation size was found to be d=0.006215, and the estimated power loss of 0.028%. Also of importance, the estimated variance in D was 7.739×10⁻⁵.

The simulation, using this frequency, gain, and perturbation size, resulted in a power loss of 0.274%, which is considerably more than predicted. However, the variance in D was 7.879×10⁻⁵, which matches very closely to the prediction. Also, trying a few different perturbation values in the simulation led to the discovery that the actual optimum perturbation was around d=0.0072, and the efficiency gets worse as one increases or decreases d from here. So, as the analysis led to a good prediction of both the optimum perturbation size and variance in D, the source of error is, likely, in the assumption that the operating point stays close enough to the MPP for one to use the slope of the I-V curve of the solar panel, equal to $R_{panel}$, to estimate the loss. As one moves away from the MPP, the loss will be worse than if one uses the resistance approximation. Another possible source of error is that the power vs. D curve is not symmetric, which means that the algorithm will settle to the left of the MPP. However, this would lead one to believe that the estimated optimal perturbation would be larger than the actual perturbation, which was not the case here. Overall, the simulation shows that the analysis provides a good estimate of the optimum parameters for the system but that the power loss will likely be greater than expected.

4.6. Conclusion

While it is well known that noise hurts the overall performance of MPPT systems, its impact is rarely quantified. The analysis in this section quantifies the effect of noise in degrading the efficiency of the MPPT technique presented, as well as determining how to optimize the system parameters, given the noise. This analysis was then backed up by simulations in MATLAB.

The results of this analysis were compared to similar, discrete-time MPPT algorithms in order to gain an understanding of the trade-offs between the implementations. Ultimately, if one optimizes the system, all the algorithms presented can achieve high efficiency, but, as was shown, some can perform better than others. This analysis and comparison are useful for making informed decisions about algorithm and parameter choices and can aid development of improved algorithms. The end result is more efficient designs and better performance.

5. Performance of Photovoltaic Maximum Power Point Tracking Algorithms in the Presence of Noise This section introduces a probabilistic analysis of the effects of noise on various maximum power point tracking (MPPT) algorithms for photovoltaic systems, including how noise affects both tracking speed and overall efficiency. The results of this analysis are verified by simulations. This analysis provides a better understanding of how noise affects performance and can be used to optimize an MPPT system.

5.1. Introduction

As discussed above, maximum power point tracking (MPPT) has become a standard technique for high-performance photovoltaic systems. In this section, we develop quantitative analysis of the impact of noise on maximum power point tracking systems, and apply this analysis to several tracking algorithms. The analysis is verified through dynamic simulations which include noise.

5.2. Noise Effect on Slew Rate of Perturb and Observe

Consider an MPPT system with a simple perturb and observe (P&O) tracking algorithm, where one changes a variable X, which could be a voltage, current or duty cycle, that influences the operating point of the array, by a fixed ΔX each period, ΔT, and measures the power output of the array to determine how to change X next. The slew rate, how fast the algorithm will move toward the MPP, will be influenced by the amount of noise in the measurement of power. The maximum slew rate for the algorithm is $$\frac{\Delta X}{\Delta T}.$$

However, with the addition of noise to the system, wrong decisions may sometimes be made about whether to increase or decrease X, leading to a slower average slew rate.

For this analysis, the noise considered is Gaussian white noise that shows up on the power measurement of the array. We assume the signal representing the output power is integrated during the period between decisions, and so the standard deviation of the noise being added to each measurement of power is $\sigma_n = k/\sqrt{\Delta T}$, where k is a constant with units volts/sqrt(Hz). When the system makes a decision about whether to increase or decrease X, it looks at the change in power from the previous step to the current step (ΔP). At each point on the power vs. X curve, the signal that will be seen is mΔX, where m is the slope of the curve. In order for the algorithm to make the wrong decision about whether to increase or decrease X, the noise must have a magnitude greater than mΔX and a sign opposite to that of the slope. Also, as the signal used, mΔX, comes from two measurements, the standard deviation of the noise added to the signal is $\sqrt{2}\sigma_n$. The noise will have a Gaussian distribution, and the probability of an error is, based on the Q-function, $$P_e = \frac{1}{2} - \frac{1}{2}\mathrm{erf}\left(\frac{\mathrm{abs}(m)\Delta X}{2\sigma_n}\right) \quad (1)$$

With this error rate, the average slew rate will be $$S_r = (1 - 2P_e)\frac{\Delta X}{\Delta T} \quad (2)$$

Figure 21:
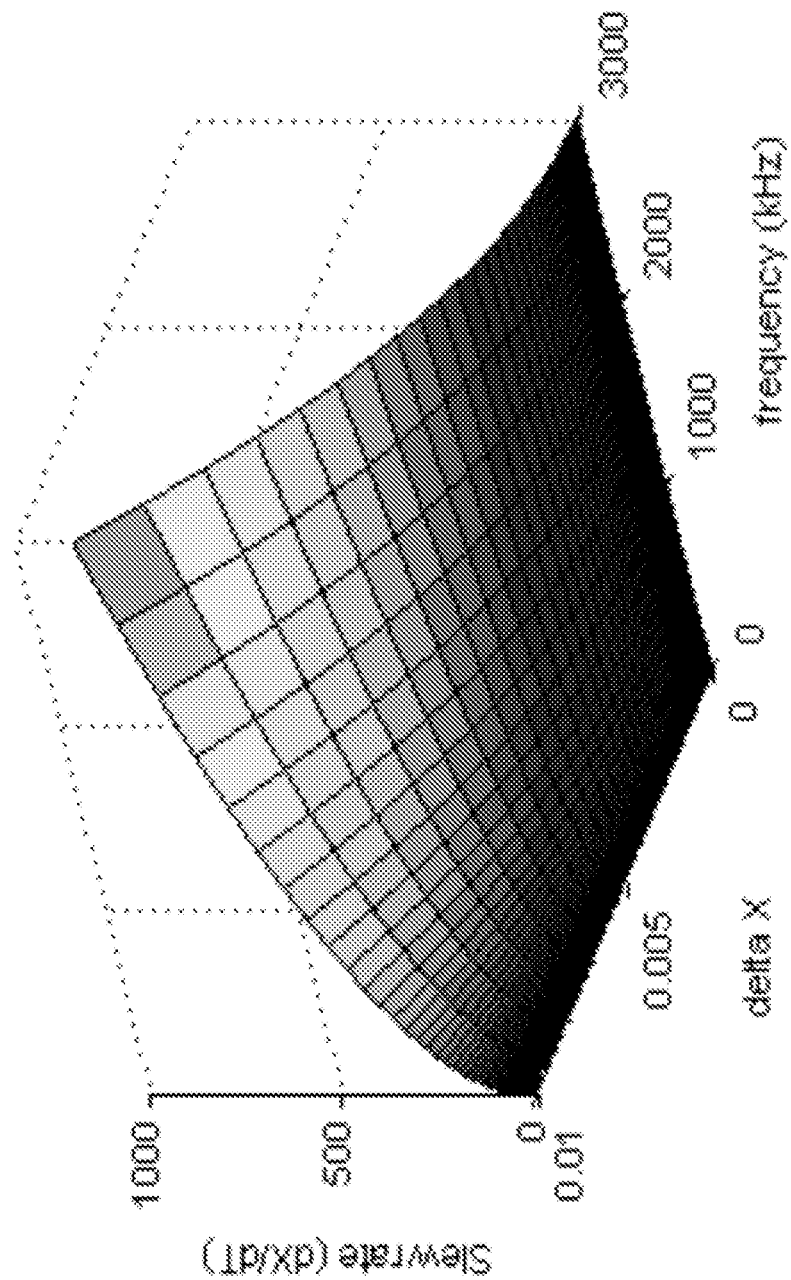
FIG. 21 shows a graph of slew rate for different parameters of a perturb and observe algorithm.

As can be seen from FIG. 21, as the frequency of tracking decisions increases, decreasing ΔT, the slew rate increases; however, the increase is not linear, as it would be without noise. It decreases in slope with increasing frequency, representing a diminishing return in slew rate from increasing the frequency of tracking. While one might think that there could be an optimal frequency for a given noise constant, k, there is not; the slew rate will always increase with increasing frequency, at least without taking any other constraints of the system into consideration. This is because the increased error rate due to increasing the frequency does not overcome the increase due to the $$\frac{\Delta X}{\Delta T}$$

term in the slew-rate equation. Also evident from FIG. 21 is that the slew rate increases with positive curvature with increasing ΔX. This is due to the fact that increasing ΔX both increases the $$\frac{\Delta D}{\Delta T}$$

term in the equation for slew rate, as well as decreases the error rate; however, the resulting slew rate will still be less than if there were no noise.

5.3. Slew Rate Simulations

Figure 22:
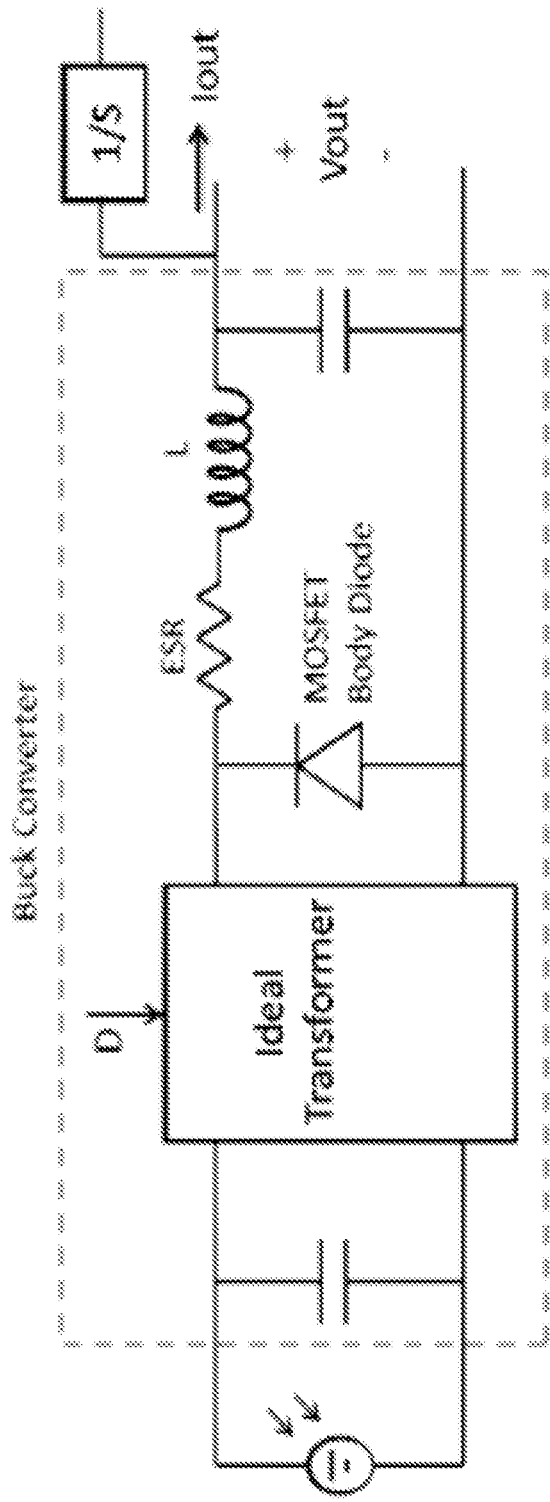
FIG. 22 shows a system model used for simulating the effect of noise on the slew rate.

To simulate the effect of noise on the slew rate, a P&O controlled PV system was modeled with ordinary differential equations and solved numerically in Matlab; the system model is shown in FIG. 22. While the switching effects of the dc-to-dc converter are not modeled, as they are considered to be at a much higher frequency than the algorithm, the passive components of the dc-to-dc converter were included, as they affect the response of the system to a change in D. Also, the reason for the inclusion of the body diode of the mosfet in the model is that it clamps the output voltage in the case that the solar panel tries to sink current.

In the model, the output current, $I_{out}$, is kept constant, representing a constant-current load. The duty cycle, D, of the converter thus controls the current of the PV array and is X in the analysis above. With a constant-current load, Vout is proportional to the power from the array, and so it is used as the power signal, which is why it is being integrated in the model to give an average power over each cycle. Applying the analysis to other types of loads is easily done and will just change the shape of the power vs. D curve.

Figure 23:
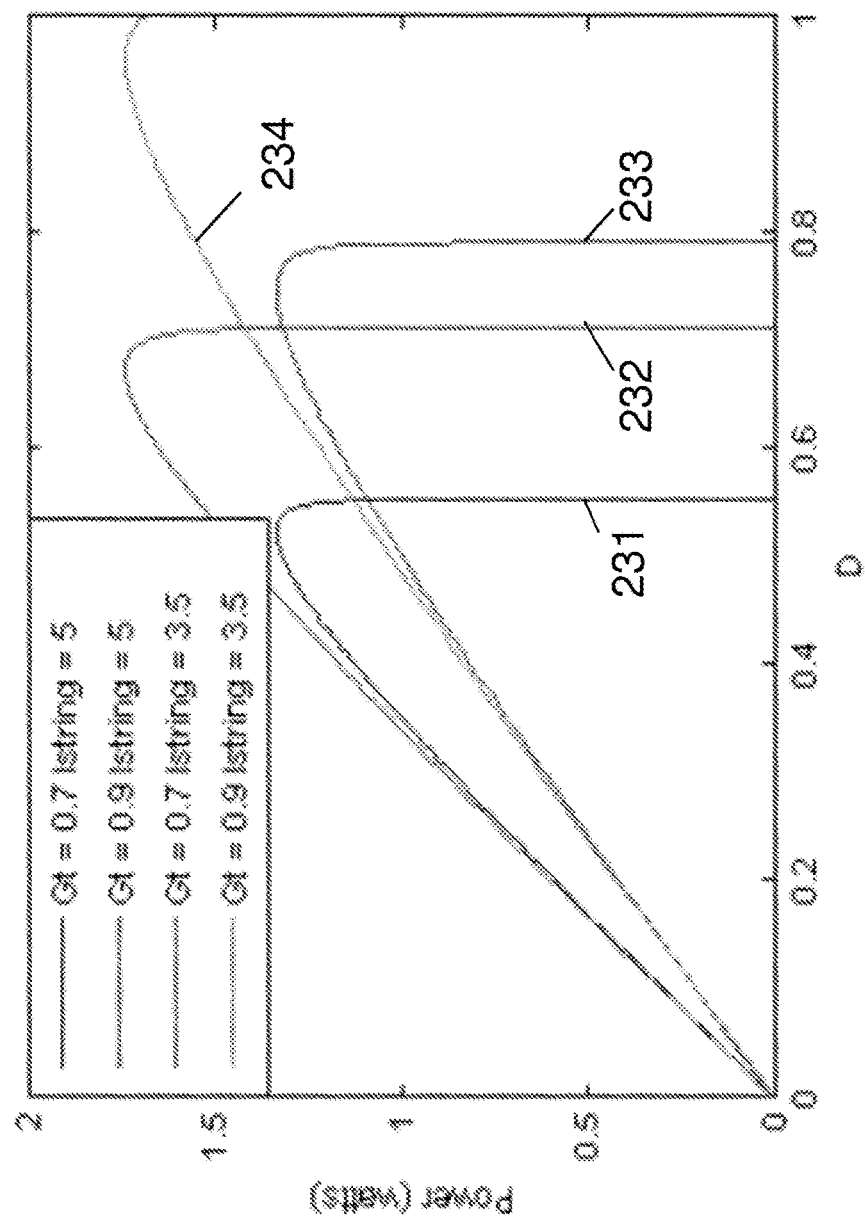
FIG. 23 shows plots of power vs. D for fixed temperature and irradiance.
Figure 24:
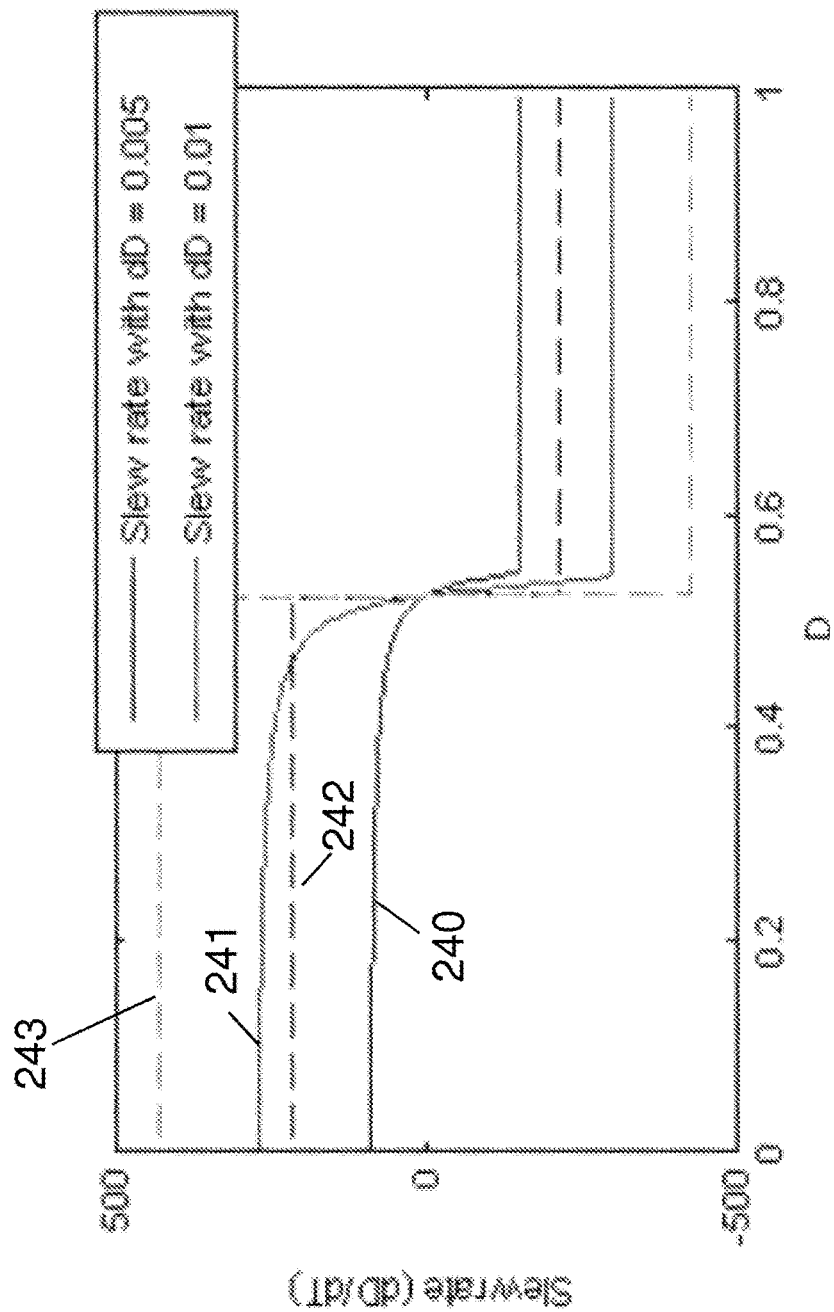
FIG. 24 shows a plot of the slew rate for different algorithm parameters, with and without noise.

For fixed temperature, the model has power vs. D curves shown in FIG. 23. The parameter Gt is the irradiance scaled from 0 to 1. Curve 231 shows the power produced as a function of duty cycle for Gt=0.7, Istring=5. Curve 232 shows the power produced as a function of duty cycle for Gt=0.9, Istring=5. Curve 233 shows the power produced as a function of duty cycle for Gt=0.7, Istring=3.5. Curve 234 shows the power produced as a function of duty cycle for Gt=0.9, Istring=3.5. At a fixed irradiance and string current one can take the slope at each point along the power vs. D curve and, using the calculation above, get the slew rate at each D value (FIG. 24). In FIG. 24, curve 240 represents the slew rate with $\Delta D$=0.005 and curve 241 represents the slew rate with $\Delta D$=0.01. The dashed line 242 indicates the slew rate with $\Delta D$=0.005 without noise. The dashed line 243 indicates the slew rate with $\Delta D$=0.01 without noise. The slew rate is zero at the MPP, and because the slope of the power curve to the right of the MPP is greater than that to the left, the slew rate is greater to the right of the MPP.

With this curve, it can be estimated as to how long it will take for the P&O controller to get from one D value to another by doing the integral:

$$\int_{D_{start}}^{D_{end}} \frac{dD}{SlewRate(D)} \qquad (3)$$

Figure 25:
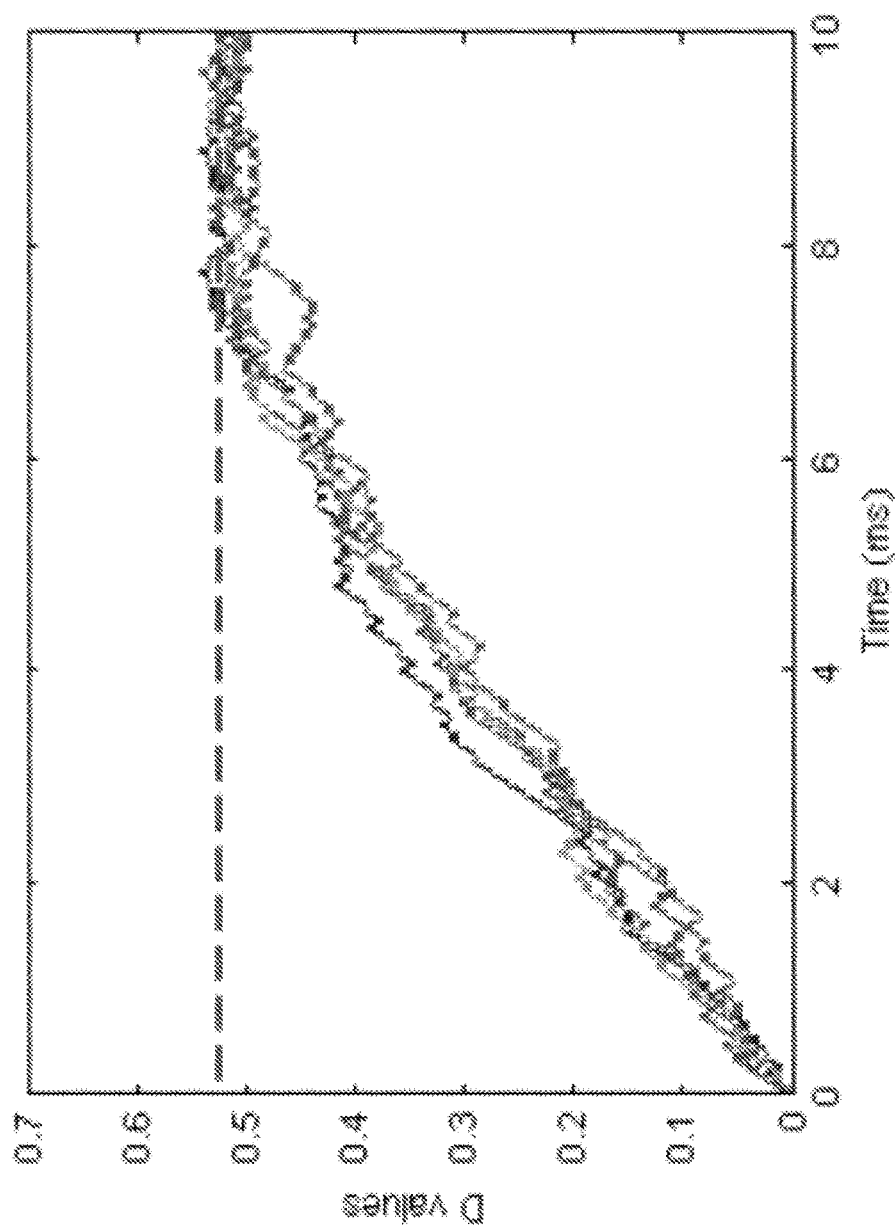
FIG. 25 shows a plot of the duty cycles over time for multiple different runs of an optimization algorithm in which the duty cycle approaches the maximum power point.

After adding noise to the values of the voltage used for making decisions in the model, the estimate from the analysis for how long it will take to move from one D value to another is very close to that seen in the model. For example, FIG. 25 shows the D values of multiple runs of the simulation. The dashed line indicates the optimum D value. The analysis predicts that for the amount of noise added to this system, it should take 7.02 ms to go from D=0 to D=0.53, which is almost exactly what is seen in the model.

5.4. Noise Effect on Steady State Efficiency of Perturb and Observe

While it is important to know how the slew rate is affected by noise, what is of greater importance is how noise affects the efficiency of the tracking at steady state. Around the MPP, the slope of the power vs. D curve is close to zero, and so, with just a little noise, the signal there is almost completely lost, resulting in a near-random walk, which will lead to some loss in efficiency. In fact, the entire P&O algorithm can be defined as a semi-random walk, where at each D value, there is a probability of taking a step to the right or to the left. Using a similar analysis as above, the probability of going to the left is $$P_{left} = \frac{1}{2} - \frac{1}{2}\text{erf}\left(\frac{m\Delta X}{2\sigma_n}\right), \qquad (4)$$

and the probability of going to the right is $P_{right}=1-P_{left}$, except for D=0, where the probability of going right is one; and D=1, where the probability of going left is one.

Using the transition probabilities given in (4) the P&O method can be put in the form of a Markov chain with an ergodic transition matrix $$P = \begin{bmatrix} 0 & 1 & 0 & 0 & \cdots & \cdots & & 0 \\ P_{L1} & 0 & P_{R1} & 0 & & & & \vdots \\ 0 & P_{L2} & 0 & P_{R2} & \ddots & & & \vdots \\ 0 & 0 & P_{L3} & 0 & \ddots & \ddots & & \vdots \\ \vdots & & \ddots & \ddots & \ddots & \ddots & \ddots & \vdots \\ \vdots & & & \ddots & \ddots & 0 & P_{R(n-1)} & 0 \\ \vdots & & & & \ddots & P_{Ln} & 0 & P_{Rn} \\ 0 & \cdots & \cdots & \cdots & \cdots & 0 & 1 & 0 \end{bmatrix},$$

where the probabilities of going left or right at each D value fill the diagonals around the central zero diagonal, with each row summing to 1.

Using this transition matrix along with a starting row vector $u_k$, representing the percent chance of being at each of the D values at time step k, one can determine the probability, $u_{k+1}$, of being at each of the possible D values at the next time step by $u_{k+1}=u_kP$. Then, the probability distribution at time step k+n is $u_{k+n}=u_kP^n$. To get the steady state solution, one can use a large value of n, but because one doesn't know how large a value is sufficient, it is better to solve the equation $u_\infty=u_\infty P$ for $u_\infty$, which will be the steady-state distribution and is the left eigenvector of P corresponding to the eigenvalue of 1. So, for each set of parameter values (such as noise, $\Delta D$, and frequency), one can determine the probability distribution function (pdf) at steady state and then calculate the efficiency, $$\eta = \frac{\sum_D pdf(D) \cdot Power(D)}{Power(D_{opt})}. \qquad (5)$$

Figure 26A:
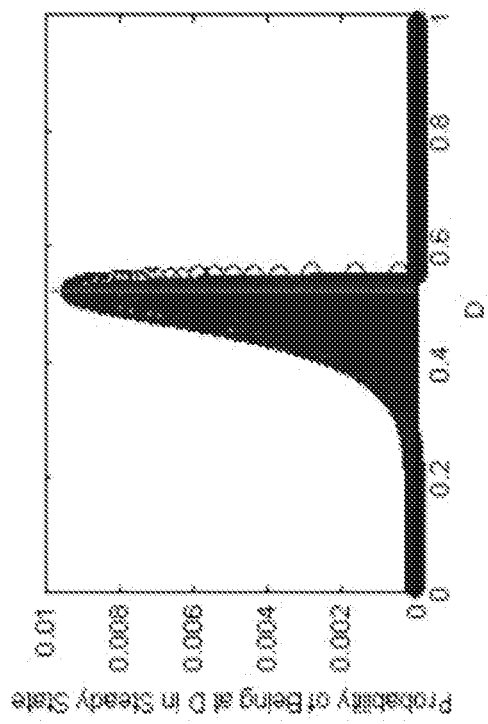
FIGS. 26a and 26b show examples of probability distribution functions for the duty cycle D.
Figure 26B:
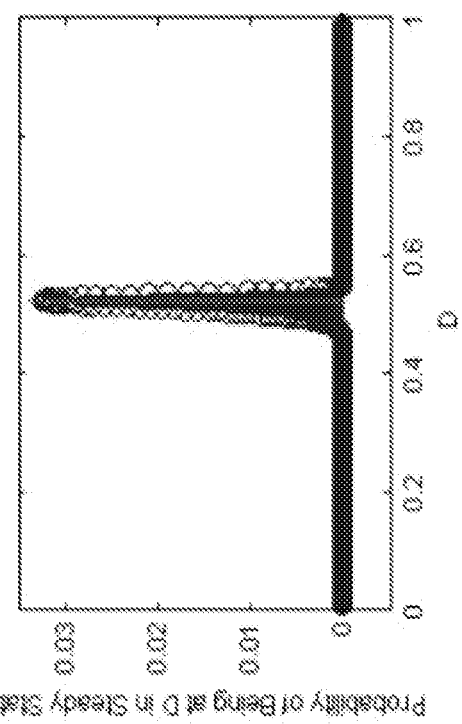

Example pdfs are shown in FIGS. 26a and 26b, which show the probability densities at steady state with noise. FIG. 26a shows a pdf with k=1.25×10⁻³. FIG. 26b shows a pdf with k=1.25×10⁻⁴, which has less noise.

The effects of frequency and $\Delta D$ on efficiency can be seen in FIG. 27a. The efficiency goes up as frequency decreases, as lowering the frequency effectively decreases the noise. Decreasing ΔD also increases the efficiency, and this is due to the oscillations around the MPP increasing as ΔD increases. However, the efficiency improvements due to decreasing ΔD are asymptotic, approaching a maximum possible efficiency for the given frequency. Making ΔD smaller and smaller will yield smaller and smaller improvements in the efficiency while greatly decreasing the reaction rate of the controller. This leads to the usefulness of FIG. 27b. Given a desired nominal slew rate, one can choose the optimal frequency and step size for greatest efficiency at steady state. Each curve shown in FIG. 27b is for a different frequency.

5.5. Perturb and Observe with Added Forced Oscillation

One enhancement that can be made to the Perturb and Observe algorithm is to add a constant oscillation on top of the normal change in D, as this will improve the signal to noise ratio, and, as will be shown here, is able to achieve higher steady state efficiencies for the same slew rate.

Figure 9:
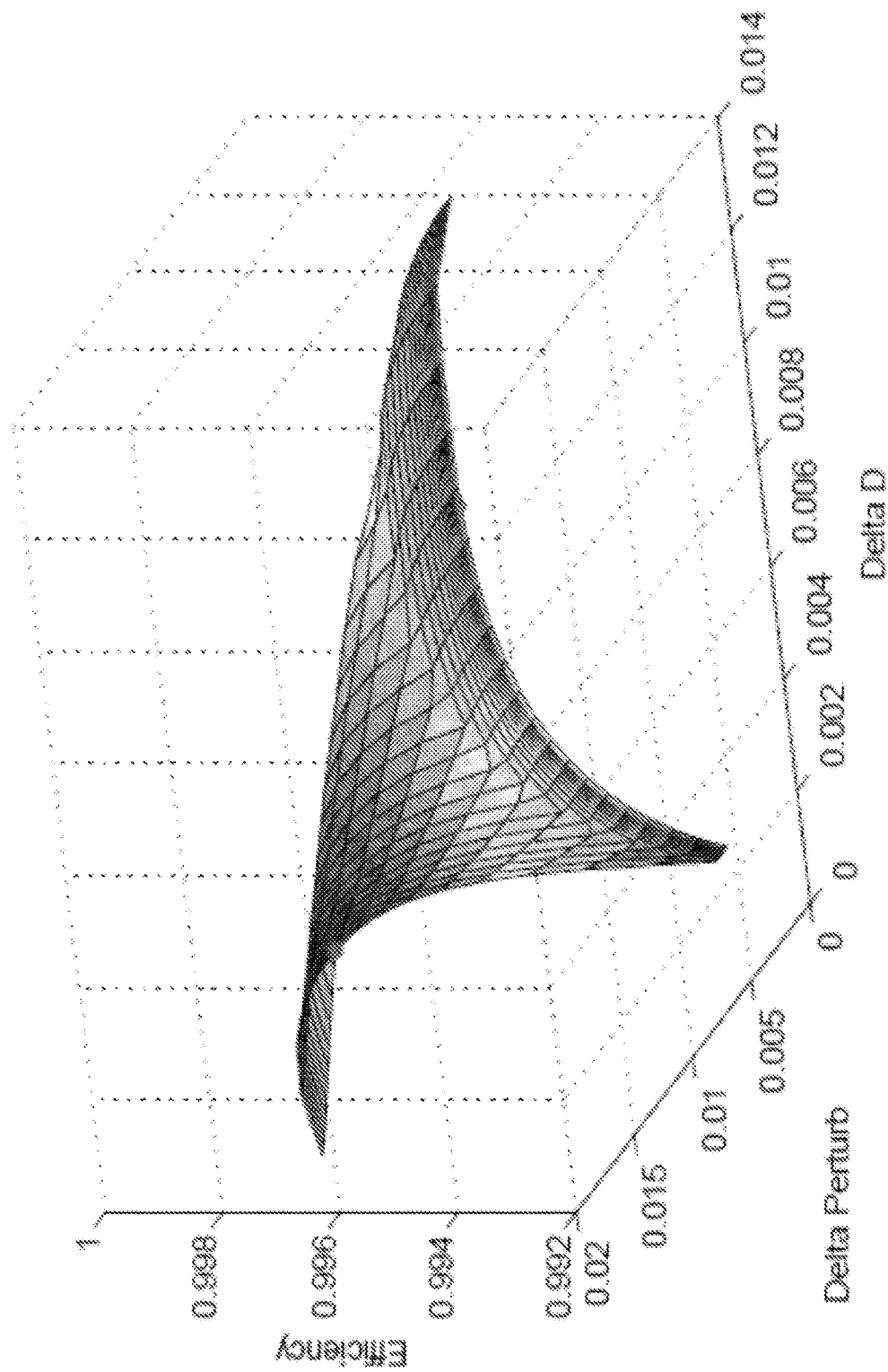
FIG. 9 shows a plot of efficiency for various control algorithm parameters in an algorithm implementing perturb and observe with an added forced oscillation, according to one embodiment of the present invention.

The update equation for normal perturb and observe is $$X[k+1] = X[k] + \Delta X sgn\left(\frac{P[k] - P[k-1]}{X[k] - X[k-1]}\right), \quad (6)$$

where P is the output power of the system. Adding the forced oscillation results in the update equation becoming $$X[k+1] = X[k] + \Delta X_p(-1)^k + \Delta X sgn\left(\frac{P[k] - P[k-1]}{X[k] - X[k-1]}\right), \quad (7)$$

where $\Delta X_p$ is the size of the added oscillation or perturbation. This method simply adds a square wave perturbation on top of the normal perturb and observe algorithm. With this added perturbation, the probability of going left becomes $$P_{left} = \frac{1}{2} - \frac{1}{2}\text{erf}\left(\frac{m\Delta X_p}{2\sigma_n}\right), \quad (8)$$

with $P_{right} = 1 - P_{left}$. This is a good approximation as long as $\Delta X_p$ is much larger than $\Delta X$, so that the perturbation in X is dominated by $\Delta X_p$. When $\Delta X_p$ and $\Delta X$ are close, a better approximation is to average the transition probabilities for the step sizes $\Delta X_p +/- \Delta X$, as those are the actual step sizes that will be taken. FIG. 9 was produced using these probabilities in the same way FIG. 26 was produced through the use of Markov transition matricies. It shows how the steady state efficiency depends on both ΔX and $\Delta X_p$ for a fixed slew rate.

Again, for the system considered here, X is D, the duty cycle of the converter. For small values of $\Delta D_p$, the algorithm essentially returns to being the simple Perturb and Observe, where there is an optimal ΔD value at which the trade-off between losses due to large oscillations around the MPP from using a large ΔD and losses due to wandering around the MPP from using a small ΔD are balanced to give the best steady state efficiency possible for the given slew rate and noise. It is clear from FIG. 9 that the optimal value of ΔD for the Perturb and Observe with forced oscillation algorithm is the smallest one can go with; the limit on this is the highest frequency one can run their control algorithm at, as decreasing ΔD means increasing the frequency in order to keep the slew rate constant. The reason for this can be seen from the equation for the probability of making a wrong decision, (1), which when $\sigma_n = k/\sqrt{\Delta T}$ is substituted in becomes $$P_e = \frac{1}{2} - \frac{1}{2}\text{erf}\left(\frac{\text{abs}(m)\Delta X\sqrt{\Delta T}}{2k}\right). \quad (9)$$

As the argument of the error function in (9) increases, the probability of making a wrong decision goes to zero. So, as one increases ΔX=ΔD, the chance of making a wrong decision goes down, leading to more accurate tracking. However, as can be seen from FIG. 27a, this increase in accuracy is outweighed by the decrease in efficiency due to larger oscillations around the MPP. So, with the argument of the error function in (9) decreasing like O(ΔX) as ΔX is decreased, the efficiency asymptotically approaches the maximum efficiency. For a fixed slew rate, $S_r = \Delta X/\Delta T$, using the simple perturb and observe method, (9) becomes $$P_e = \frac{1}{2} - \frac{1}{2}\text{erf}\left(\frac{\text{abs}(m)\Delta X^{3/2}}{2k\sqrt{S_r}}\right). \quad (10)$$

In (10), the argument of the error function decreases like $O(\Delta X^{3/2})$ as ΔX is decreased, and so the increase in efficiency due to smaller oscillations around the MPP does not continue to outweigh the decrease in tracking accuracy from decreasing ΔX. This leads to there being an optimum value of ΔX=ΔD for a fixed slew rate, which can be seen in FIG. 9 for Delta Perturb equaling zero.

For the perturb and observe with forced oscillation, equation (9) becomes $$P_e = \frac{1}{2} - \frac{1}{2}\text{erf}\left(\frac{\text{abs}(m)\Delta X_p \Delta X^{1/2}}{2k\sqrt{S_r}}\right). \quad (11)$$

In (11), the argument of the error function decreases like $O(\Delta X^{1/2})$ as ΔX is decreased. So, the increase in efficiency due to smaller oscillations around the MPP as one decreases ΔX will outweigh the decrease in efficiency from less accurate tracking.

Figure 28:
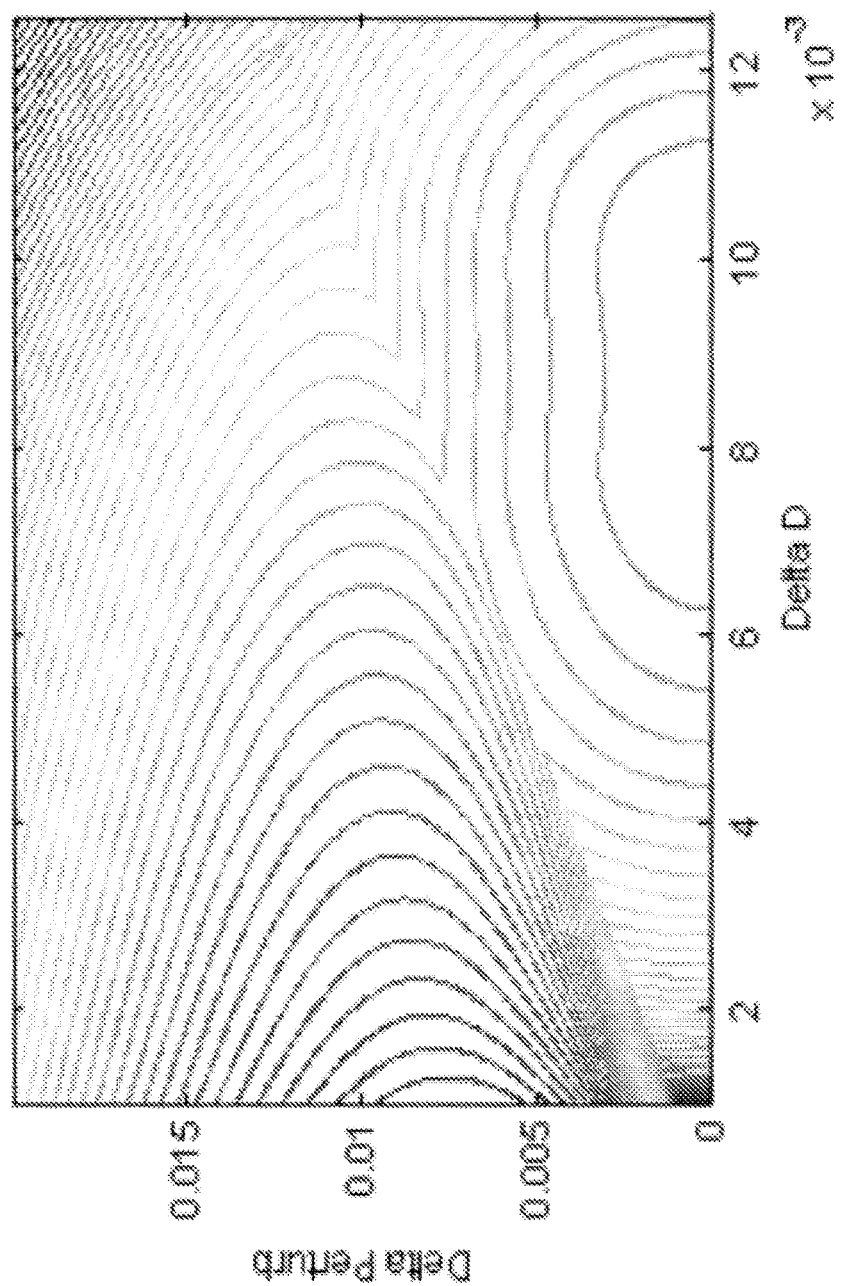
FIG. 28 shows a contour plot of FIG. 9.

So, after choosing the smallest ΔD that ones system can handle, given the desired slew rate, $S_r$, and maximum frequency, $f_{max} = S_r/\Delta D$, one can choose the optimal value of $\Delta D_p$ which balances the losses due to large oscillations and wandering. This is done using the numerical analysis presented above. For each value of $\Delta D_p$ of interest, one uses equation (8) to create the transition matrix and invert it to get the steady state pdf, from which the steady state efficiency can be found using (5). This will result in a plot of one of the lines of constant ΔD in FIG. 9 from which one can determine the optimum $\Delta D_p$. FIG. 28 is a contour plot of FIG. 9.

Figure 29:
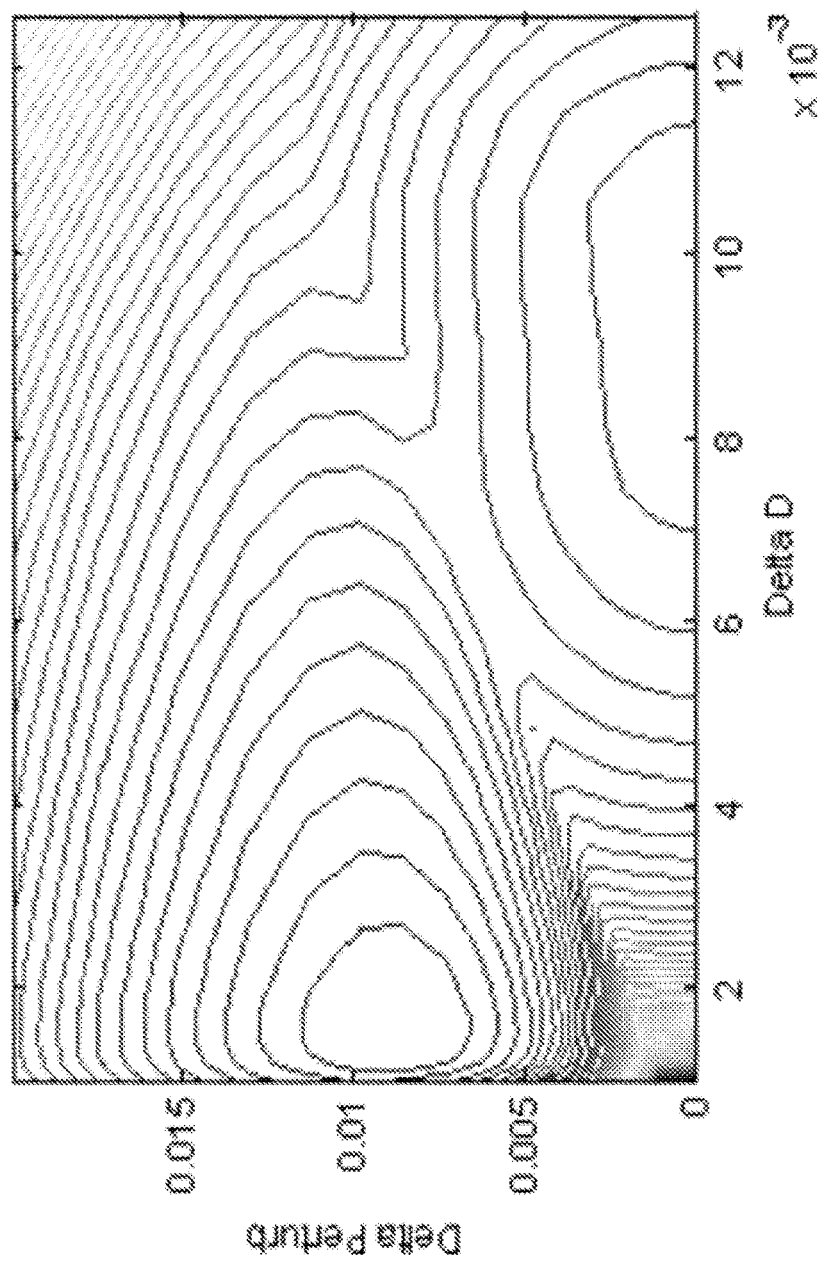
FIG. 29 shows a contour plot similar to FIG. 28, but also taking into account a blanking time of 0.8 ms.

Alternatively, it may be possible to incorporate the limits on frequency into the analysis to find the optimum ΔD and $\Delta D_p$. For example, depending on the passive components of the converter in the system, the output voltage will ring before settling after each change in D. So, one should wait until the system settles before starting to integrate the output voltage. Adding in this, essentially, blanking time, means that as one increases the frequency of tracking, the actual integration time, ΔT, will approach zero faster than the simplified case where ΔT=1/frequency. This results in a global maximum, which can be seen in FIG. 29.

Besides providing a method for determining optimum system parameters, there are many other conclusions that can be drawn from FIG. 9. For one, there is a minimum value of ΔD for which adding a forced oscillation can improve the efficiency; above that value, the added perturbations just cause more oscillations around the MPP without improving the accuracy of the tracking enough to make it worth it. Also, the optimum size of the added perturbation, $\Delta D_p$, is always larger than ΔD, if improvement is possible. In fact, any added perturbation less than or equal to ΔD will degrade the efficiency of a normal perturb and observe method, as one would expect. Finally, the improvement in efficiency one can expect from the perturb and observe method with forced oscillation over the simple perturb and observe can be seen by looking at the difference between the maximum along the line ΔD=min (ΔD) and the maximum along $\Delta D_p$=0. This difference will depend upon the noise and slew rate for the system. As is evident in FIG. 10, as the slew rate or noise increase (as both enter into equation (11) in the same place), the benefit from using the forced oscillation version of the perturb and observe method increases, as one would expect.

5.6. Simulation Results for Steady State Efficiency

Simulations were done in order to validate the analytical results. While the MATLAB model presented earlier provides a fairly realistic simulation, it is very slow to run and thus not ideal for doing steady state analysis. However, as the dynamics of the modeled PV system are fast enough that they have little to no effect on the algorithms' performance, simulating the algorithms with update equations is much faster. For these simulations, the same PV cell model was used as in the full model; however, for each new value of D, the steady state output voltage of the system was calculated. Then, before using the given algorithm to determine the next D value, random noise with variance $\sigma_n^2 = k^2/\Delta T$ was added to the calculated voltage. After running the simulation sufficiently long, the average output power was compared to the maximum output power of the cell in order to determine the efficiency of the algorithm.

In order to make sure that this simplified model matched the full model closely enough, the same simulation was run for each model. The parameters for the simulation were a ΔD of 0.005, ΔT of 3.33 e−5 seconds, and a noise constant of 1.25 e−5. The simplified, state update model resulted in an efficiency of 99.6159 percent, and the full model, which took considerably longer to run, resulted in an efficiency of 99.6171 percent. These values were close enough to decide that the simplified model was a good enough approximation to the full model.

Figure 30:
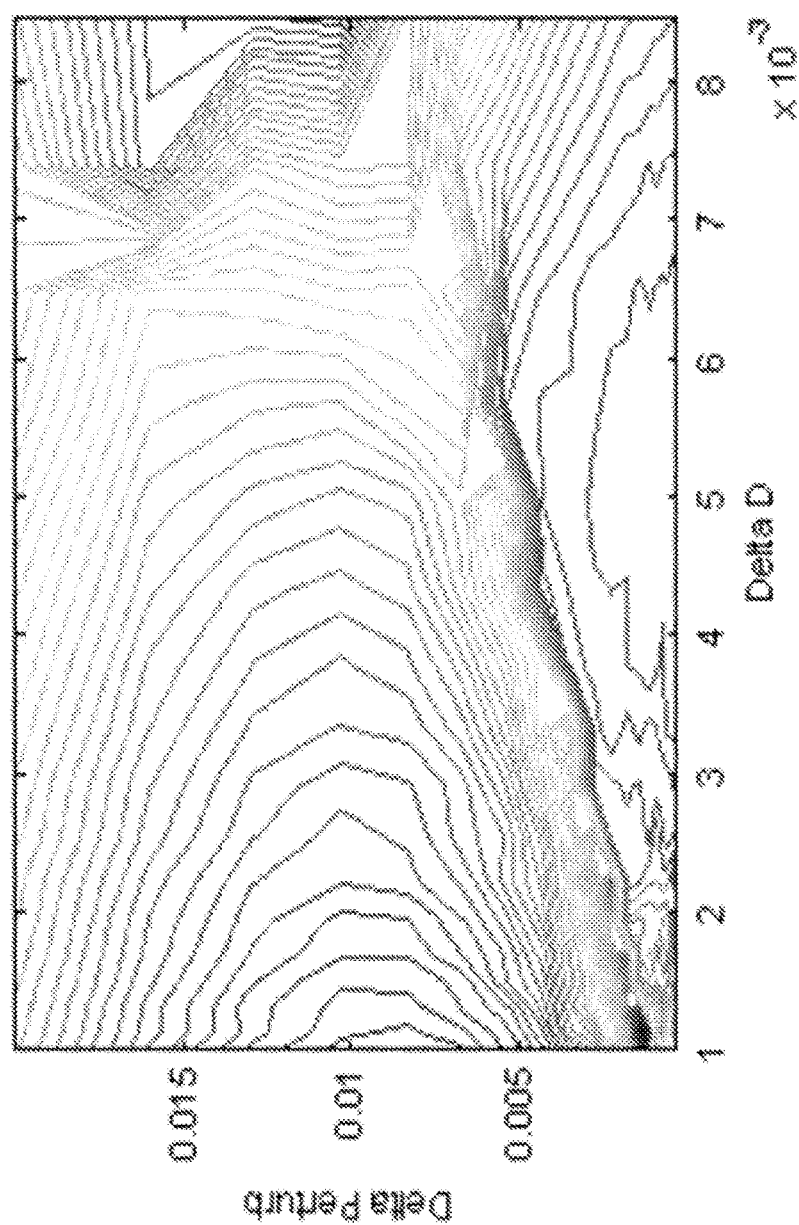
FIG. 30 shows a contour plot of simulated efficiency as function of various algorithm parameters.

The simplified model was then run for the same range of ΔD and $\Delta D_p$ in FIG. 9 in order to produce FIG. 30, which matches FIGS. 9 and 27 pretty well.

5.7. Conclusion

While it is well known that noise hurts the overall performance of MPPT systems, its impact is rarely quantified. The analysis in this section quantifies the effect of noise in slowing down tracking, as well as in degrading overall efficiency. Dynamic simulation results have verified the analytical predictions. The analysis is useful for making informed decisions about algorithm and parameter choices and can aid development of improved algorithms. The end result is more efficient designs and better performance 6. Implementation 6.1 Implementation Options There are many different options for implementing the system described above, but there are a few basic ideas upon which various implementations may be based. What is meant by implementation here is where each component of the system is placed and how they are connected together. Reference is made to the exemplary circuit diagram of an examplary system shown in FIG. 7b. As shown in FIG. 7b, each solar cell may have a dedicated buck converter, and the outputs of these converters may be connected in series.

The area with the most flexibility in the implementation strategy is in how one creates and places the output inductors of the converters. There are two main approaches which will be discussed. One is to use the wiring from one converter to the next to create the output inductor, and the other is to have the output inductor locally at the converter.

First, consider creating the output inductor using the wiring from one cell to the next. A schematic for one way of doing this is shown in FIG. 31a. Local to each cell would be an IC with the converter switches along with the input capacitor for that converter and the output capacitor for the previous cell. The capacitance could be on-die or external. This group of components is in the dashed boxes in FIG. 31a and may be placed near the end of the cell on the back side (positive terminal). This would provide easy access to both of the terminals of the solar cell, as the tabbing on the negative terminal can wrap around to the back of the cell. There are some cells which have both terminals on the back of the cell, which would mean one could place the converter anywhere; however, this does not fundamentally change the two options for implementing the output inductor. Then, as is shown in FIG. 31a, two wires can extend from one converter to the next, forming the output inductor and connecting to the output capacitor, which is located at the next converter.

This wiring can take many forms. Most simply, it could be two wires or a twisted pair, and the positive output wire could be larger than the negative wire, as the negative wire only carries AC current. The two wires could also be implemented as a pair of flat copper traces separated by a dielectric. This implementation could easily be placed on a spool and rolled out onto the cells. Here too, the positive and negative traces could be sized differently. One other option, though there are a somewhat limitless number of possibilities, is to use a coaxial cable, carrying the DC current (positive wire) in the center and the AC current (negative wire) on the exterior. Here, the exterior of the coaxial cable could be made thin because it only carries AC current. This implementation also has the advantage of containing the magnetic field within the dielectric of the cable, which will help with electromagnetic interference (EMI). No matter what one chooses, the main design considerations may be the inductance per unit length, cost, conduction losses, EMI, and return path inductance. The last item on that list, return path inductance, should be considered, as it is likely that the inductance of the return path will be near or, possibly, greater than the inductance of the forward path, and they will be coupled.

Next, consider the second option, which is to create the output inductor locally to the converter. A diagram of this implementation is shown in FIG. 31b. If this is done, one could then send a wire from the output of one converter to the local ground (negative cell terminal) of the next converter. However, this wire would be in parallel with the connection running along the negative side of the next solar cell, so it is much more practical to use the tabbing on the cell to make the connection, connecting to the near side of that terminal, as is shown in FIG. 31b. It also turns out that this reduces conduction (DC) losses, as the positive output current gets partially canceled by the cell current of the next cell. There are a few key points about this implementation. For one, the input and output capacitors are local to each converter. Also, if the converters are located near the edge of the cells, only a very short connection is needed to the next cell, which is almost equivalent to the current tabbing connection that is often made between cells. The output inductor could be created in a number of ways.

Many implementation strategies would fall under one of these options or could be a combination of the two. For example, one could use the negative connection of the next cell as one of the two wires running from one converter to the next, as was done in FIG. 31a. Also, one could implement the same circuit as in FIG. 31a but have the output inductor and capacitor structure connect to the negative terminal of the next cell somewhere along the cell. However, the implementation shown in FIG. 32b may be more promising due to its simplicity, lack of extra wires, which add unnecessary cost and loss, and flexibility in how one creates and places the passive components.

Figure 32A:
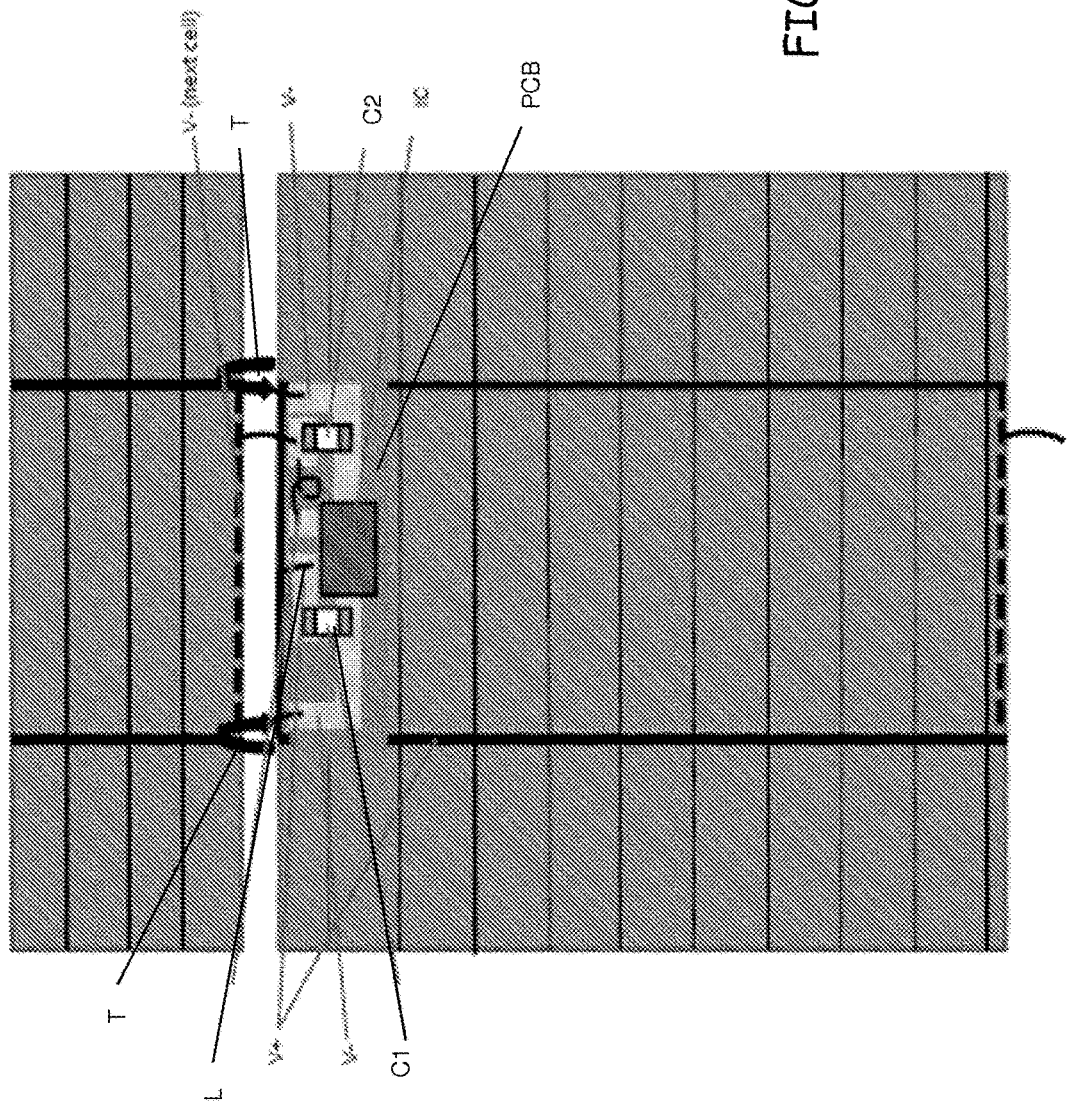
FIGS. 32a and 32b show exemplary implementations of controlled PV cells

The physical implementation of the distributed converter system may depend to a significant degree on the passive components being used, as well as how one may want to automate manufacture. A few exemplary physical implementations are shown here for the design given in FIG. 31b by way of example, but other implementations are possible. One possible implementation is shown in FIG. 32a. In this example, a single-sided PCB is used to hold all of the components for each converter, including the IC, input capacitor C1, output capacitor C2, and output inductor L. Some of the passive elements may be on-die, simplifying the PCB. One aspect of the implementation strategy can be how one makes the connections from the cells to the converters. One option, which is shown in FIG. 32a, is to have preformed tabbing T for the cells, which have extra length or pieces that hang off and can be connected to the PCB. How exactly this is done could depend on what will be easiest to manufacture. The connection that needs to be made between the two traces on each side of the cell could be done with tabbing (with a small extra piece to connect to the PCB), or that connection could be made on the PCB. In FIG. 32a, a combination of these approaches is shown. The most cost effective approach may be to use traces on the PCB for both of these connections.

Figure 32B:
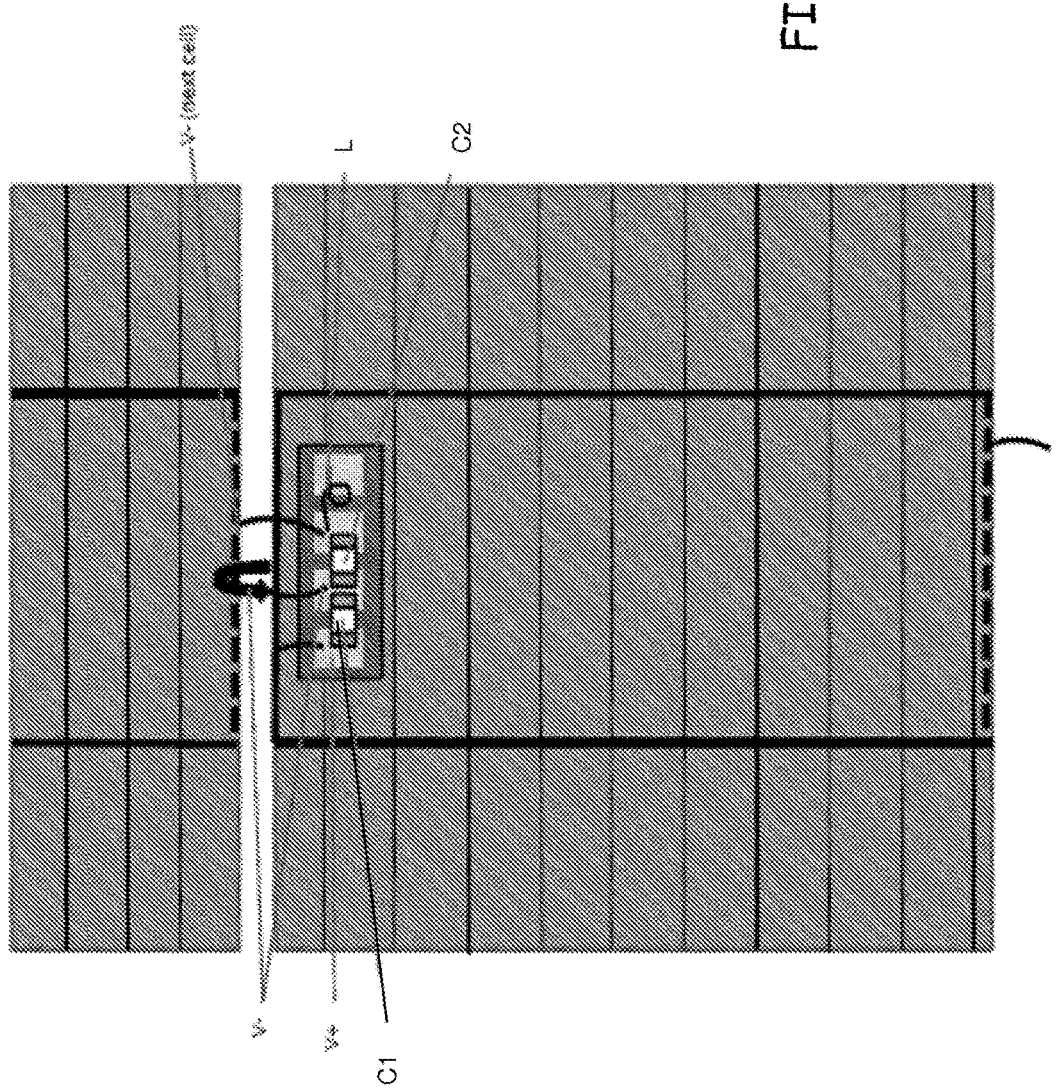

Another possible implementation option is to only use an IC with no PCB. An example of such a design is shown in FIG. 32b. Here, an IC with connection pads on the bottom could be placed upside-down on the cell. Then, one can connect the tabbing directly to the pads. While this implementation would most likely work best with all the passives on-die or all in one package, one could still solder capacitors and external inductors across the pads of the IC, though those pads will likely have to be larger than they normally would be to accommodate this. The main advantage of this design would be to eliminate both the cost and added thickness of the PCB. Here, all of the connections between the two tabs that run the length of each cell (two on each side) may be made with preformed tabbing that has extra tabbing hanging off to connect to the IC. Though, one could also add pads to the IC and make the connection between parallel tabs inside the IC. However, again, this design could be simplified by only having a single tab on each side of the cell. A caveat with that is that one may wish to stagger the tabbing from the front and back, so that in connecting them to the IC there is no chance of shorting them.

Ultimately, there are many different ways to implement the converters, a few of which are discussed above. However, it is likely that what makes the most sense for a given implementation will depend on what manufacturing equipment one has access to, as well as the cost of various steps in the manufacturing process.

7. Comparison to Cost of Bypass Diode Solution

To compare the present solution with prior techniques, the same average watt per dollar efficacy metric was determined for the present techniques and for a hypothetical solar panel with bypass diodes. This was done by applying the same lighting and shading conditions as were used in the optimization and calculating the average output power and cost of the system, dividing to get average watt per dollar. A panel of 240 cells in series was considered, being divided up into 10 groups of 24 cells, with each group having a single bypass diode across it. The shaded cells were randomly selected, with the total number of shaded cells equaling 20% of the array, as this is the shading condition used in the optimization.

Then, for each irradiation level the maximum output power of the array was determined, and the average of these gives the average output power:

$$\text{Avg. Output Power} = \frac{1}{N}\sum_{n=1}^{N} Pn,$$

where n is the irradiation level index, N is the number of irradiation levels, and P(n) is the maximum output power at irradiation level n with the shading applied. The cost of system was simply the sum of the cost of the cells (including everything to create the panel, as before) plus the cost of the diodes ($0.05 per diode was assumed). So, the average output power divided by the cost gives the average watt per dollar efficacy of the system. Table 1 gives efficacies of the bypass diode system for different base cell technology costs, and one can see that the converter per cell system outperforms the bypass diode system in all considered cases.

TABLE 1

| Base Cell Tech. Cost($/w) | Average watt per dollar for bypass diode system | Average watt per dollar (180 nm system) |
|---|---|---|
| 1.00 | 0.4535 | 0.5917 |
| 2.00 | 0.2269 | 0.3008 |
| 2.20 | 0.2063 | 0.2740 |

One thing to remember when looking at the values in Table 1 is that this is for a randomized shading pattern. While a somewhat random shading pattern could occur due to objects such as tree branches for example, there will be many cases where shading on solar panels will occur in a more uniform manner, resulting in rows or columns of cells being shaded. Though, diagonal lines across the panel are also likely. These types of shading patterns should be considered as well in the comparison. Table 2 shows the efficacy of the diode system for different shading patterns (the amount of shading and irradiance levels are unchanged).

TABLE 2

Efficacy over Shading Patterns

| Shading Pattern | Average watt per dollar |
|---|---|
| Random Shading | 0.2269 |
| Row Shading | 0.2269 |
| Column Shading | 0.3000 |
| Diagonal Shading | 0.2269 |
| One colum shaded, two Columns half shaded | 0.2604 |

One can see that the best case scenario is to have column shading, so that many of the groups of 24 cells do not have any shaded cells. Also evident is that row shading and diagonal shading both result in the same efficacy as the random shading. This is due to the shading being spread out across the bypass diode groups enough to warrant operating at a lower current where none of the cells are bypassed. Then, if one ends up having shading in-between the ideal case of column shading and the worst case of row shading, the efficacy can end up being a value somewhere between the two extremes, as expected. For different amounts and degrees of shading there may be differences between random, column, and diagonal shading, and one may want to consider what pattern of shading will be prevalent in their system. However, ultimately, this shows that using the random-shading is a reasonable assumption for comparison of the bypass diode system to the converter per cell system.

There is no one optimal design. The best design for a given implementation can depend on the structure and control of the system, implementation of the components, cost of the photovoltaic technology, shading pattern, CMOS process, etc.

A few different CMOS technologies were considered as well. A good choice of CMOS technology is the smallest one one can go down to while not degrading the blocking voltage below that of the open circuit voltage of a cell; however, the availability and cost of smaller processes may create a limit. For this optimization, three different CMOS processes were considered, 180 nm, 90 nm, and 65 nm; however, the cost of each die in dollar per die area was considered to be constant, which may not be true in practice but is a reasonable approximation.

Table 3 shows the optimization results for the three different CMOS processes considered. Here, the base cost for the cell technology was $2 per watt, and each cell is rated to be 1.8 watts. For each process two optimizations were performed: one where there was no added input inductance and one where an input inductor was added, created by a loop of wire. The main advantage of adding more input inductance is that this reduces the amount of input capacitance one needs, as the input inductance and capacitance form the input filter to the converter. This reduction can be seen in the tabulated results; however, the effect of this added input inductance on the optimization is more easily understood by looking at the losses and costs of the converter.

TABLE 3

Optimizations for Different CMOS Processes

| Process | 180 nm | 180 nm | 90 nm | 90 nm | 65 nm | 65 nm |
|---|---|---|---|---|---|---|
| Frequency (MHz) | 8.65 | 5.42 | 13.05 | 8.99 | 15.88 | 10.97 |
| Output Inductance (nH) | 12.7 | 17.60 | 8.99 | 12.94 | 7.69 | 10.14 |
| Radius of Loop (output inductance) | 5.29 | 6.49 | 4.20 | 5.18 | 3.80 | 4.53 |
| Diameter of Wire (output inductance) | 1.69 | 1.62 | 1.66 | 1.53 | 1.64 | 1.65 |
| Input Capacitance (uF) | 0.750 | 0.450 | 0.406 | 0.285 | 0.309 | 0.234 |
| Output Capacitance (uF) | 0.0726 | 0.109 | 0.0536 | 0.0586 | 0.0465 | 0.0639 |
| FET upper width (mm) | 605.1 | 715.1 | 632.4 | 708.2 | 485.8 | 559.8 |
| FET lower width (mm) | 124.8 | 141.1 | 141.8 | 176.5 | 135.6 | 153.6 |
| Added Input Inductance (nH) | 0 | 2.571 | 0 | 1.99 | 0 | 1.80 |
| Radius of Loop (input inductance) | 0 | 2.65 | 0 | 2.05 | 0 | 1.86 |
| Diameter of Wire (input inductance) | 0 | 2.65 | 0 | 2.05 | 0 | 1.85 |
| Avg. watt/dollar | 0.2973 | 0.3007 | 0.3072 | 0.3084 | 0.3109 | 0.3115 |
| Effective $/w | 1.526 | 1.509 | 1.477 | 1.472 | 1.460 | 1.457 |
| Efficiency | 88.42% | 89.31% | 90.81% | 91.13% | 91.66% | 91.89% |

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

For example, embodiments of controllers performing maximum power point tracking may be implemented using hardware, software or a combination thereof. When implemented in software, the software code can be executed on any suitable hardware processor or collection of hardware processors, whether provided in a single computer or distributed among multiple computers. It should be appreciated that any component or collection of components that perform the functions described above can be generically considered as one or more controllers that control the above-discussed functions. The one or more controllers can be implemented in numerous ways, such as with dedicated hardware, or with general purpose hardware (e.g., one or more processors) that is programmed to perform the functions recited above.

Also, a computer may have one or more input and output devices. Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the invention discussed above. The computer readable medium or media can be transportable, such that the program or programs stored thereon can be loaded onto one or more different computers or other processors to implement various aspects of the present invention as discussed above.

The terms "program" or "software" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present invention need not reside on a single computer or processor, but may be distributed in a modular fashion amongst a number of different computers or processors to implement various aspects of the present invention.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. A system for controlling a plurality of photovoltaic cells, the system comprising:
   a first power converter coupled to a first photovoltaic cell, the first power converter being formed on a first semiconductor substrate;
   a first controller to control the first power converter, wherein the first controller is formed on the first semiconductor substrate;
   a second power converter coupled to a second photovoltaic cell, the second power converter being formed on a second semiconductor substrate;
   a second controller to control the second power converter, wherein the second controller is formed on the second semiconductor substrate; and
   a third controller that controls a current through the first and second power converters based on signals from the first and second controllers.

2. The system of claim 1, wherein the first and second power converters comprise CMOS devices.

3. The system of claim 1, wherein the first and second power converters are configured to operate at a switching frequency of at least 1 MHz.

4. The system of claim 1, wherein the first power converter comprises a first plurality of passive components formed on the first semiconductor substrate and the second power converter comprises a second plurality of passive components formed on the second semiconductor substrate.

5. The system of claim 4, wherein the first plurality of passive components comprises a capacitor and an inductor formed on the first semiconductor substrate.

6. The circuit of claim 1, wherein the first and second controllers are configured to control the first and second power converters, respectively such that that the first and second photovoltaic cells operate at their maximum power points.

7. The system of claim 1, further comprising:
   an inverter controlled by the third controller to set the current through the first and second power converters based on the signals from the first and second controllers.

8. The system of claim 1, wherein the first photovoltaic cell is a single photovoltaic cell and the second photovoltaic cell is a single photovoltaic cell.

9. The system of claim 1, wherein the first power converter comprises a first DC/DC converter and the second power converter comprises a second DC/DC converter.

10. The system of claim 1, wherein the signals communicate cell current and/or duty ratio.

11. The system of claim 1, wherein the signals are communicated through a series-string interconnect that extends between the first, second and third controllers.

12. A system for controlling a plurality of photovoltaic cells, the system comprising:
    a first power converter coupled to a first photovoltaic cell;
    a first controller to control the first power converter;
    a second power converter in series with the first power converter and coupled to a second photovoltaic cell;
    a second controller to control the second power converter; and
    a third controller that controls a current through the first and second power converters based on signals from the first and second controllers.

13. The system of claim 12, wherein the signals are control signals, and the third controller controls the current based on the control signals.

14. The system of claim 12, wherein the signals are power signals, and the third controller controls the current based on the power signals.

15. The system of claim 12, wherein the third controller controls the current based on a change in switching frequency of the first or second power converters.

16. The system of claim 12, wherein the third controller controls the current to be constant.

17. The system of claim 12, further comprising:
    an inverter controlled by the third controller to set the current through the first and second power converters based on the signals from the first and second controllers.

18. The system of claim 12, wherein the first photovoltaic cell is a single photovoltaic cell and the second photovoltaic cell is a single photovoltaic cell.

19. The system of claim 12, wherein the first power converter comprises a first DC/DC converter and the second power converter comprises a second DC/DC converter.

20. The system of claim 12, wherein the signals communicate cell current and/or duty ratio.

21. The system of claim 12, wherein the signals are communicated through a series-string interconnect that extends between the first, second and third controllers.

* * * * *